US006483735B1

(12) United States Patent
Rentzepis

(10) Patent No.: US 6,483,735 B1
(45) Date of Patent: Nov. 19, 2002

(54) TWO-PHOTON, THREE-OR FOUR-DIMENSIONAL, COLOR RADIATION MEMORY

(75) Inventor: Peter M. Rentzepis, Irvine, CA (US)

(73) Assignee: The Regents of the University of California, Oakland, CA (US)

( * ) Notice: Subject to any disclaimer, the term of this patent is extended or adjusted under 35 U.S.C. 154(b) by 0 days.

(21) Appl. No.: 08/484,323

(22) Filed: Jun. 7, 1995

Related U.S. Application Data

(63) Continuation-in-part of application No. 08/453,320, filed on May 30, 1995, which is a continuation of application No. 08/163,907, filed on Dec. 6, 1993, each is a continuation-in-part of application No. 07/586,456, filed on Sep. 21, 1990, now Pat. No. 5,325,324, which is a continuation-in-part of application No. 07/342,978, filed on Apr. 25, 1989, now Pat. No. 5,268,862.

(51) Int. Cl.[7] .......................... G11C 11/32; G11C 14/04
(52) U.S. Cl. ........................................ 365/119; 365/127
(58) Field of Search ................................ 365/119, 106, 365/127

(56) References Cited

U.S. PATENT DOCUMENTS

| | | | | |
|---|---|---|---|---|
| 3,466,616 A | * | 9/1969 | Bron | 365/119 |
| 3,940,748 A | * | 2/1976 | Carson | 365/119 |
| 4,041,476 A | * | 8/1977 | Swainson | 365/119 |
| 4,333,165 A | * | 6/1982 | Swainson | 365/119 |
| 5,325,324 A | * | 6/1994 | Rentzepis et al. | 365/119 |

* cited by examiner

Primary Examiner—Terrell W. Fears
(74) Attorney, Agent, or Firm—Fuess & Davidenas

(57) ABSTRACT

Three-, and four-dimensional ("3-D" and "4-D") volume radiation memories store multiple binary bits of information—typically about five to ten and more typically eight such bits—in the same physical volumes on several different photochromic chemicals co-located in the volume. Each of the multiple photochromic chemicals is individually selectively written with an individually associated pair of radiation beams of an appropriate combined frequency—i.e., a "color"—and energy by a process of two-photon ("2-P") absorption. All the multiple information bits that are stored within all the photochromic chemicals in each addressable domain are read in common, and induced to simultaneously fluoresce, again by process of 2-P absorption. The fluorescence of each of different photochromic chemical in each addressed domain—which fluorescence is selective in accordance with the written state of each such photochromic chemical—is separated from, and is separately detected from, the fluorescence of all other photochromic chemicals because it is of a unique color, and is spatially steered to an associated detector array, normally a Charge Coupled Device (CCD), by a monochromator, normally a prism. Exemplary fluorescent photochromic chemicals are spirobenzopyran, rhodamine, cumarin and anthracene. Suitable groups of photochromic chemicals are formed from individual photochromic chemicals exhibiting narrow, sharp, separate spectra of absorption and of emission suitably distinct from each other, and where no chemical's fluorescent emission energy overlaps the absorption energies of any other chemicals.

21 Claims, 23 Drawing Sheets

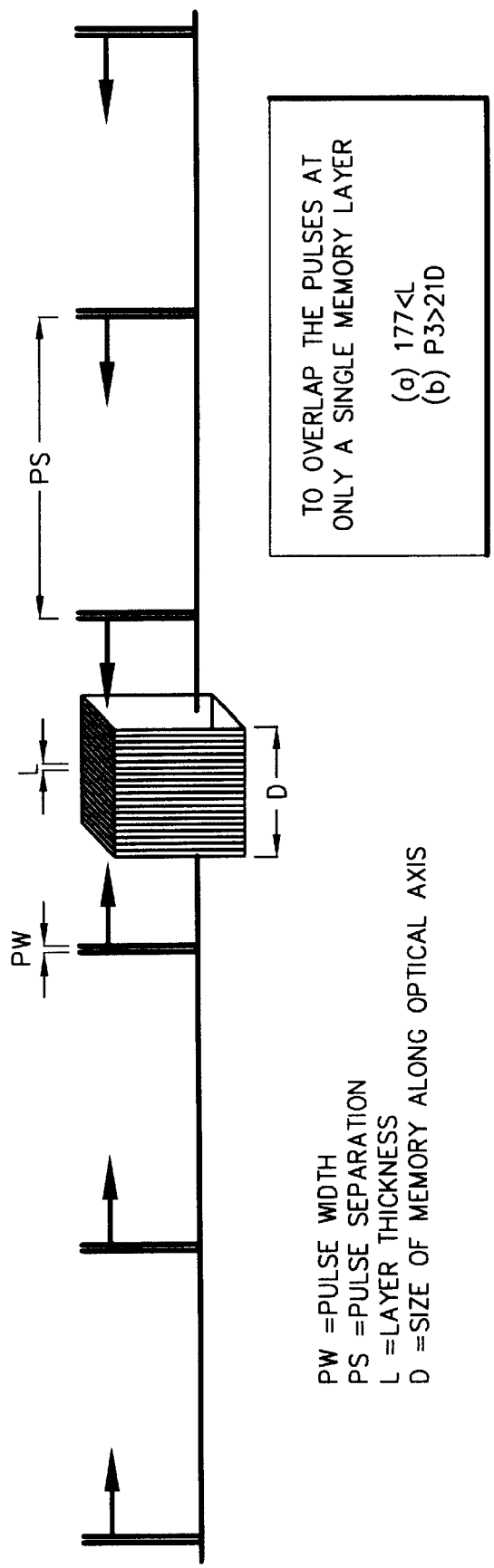
FIG.d

ORTHOGONAL BEAMS

ASSUMING: 1μm FOCAL SPOTS

MAXIMUM VOLUMETRIC DENSITY=

MVD=10 $10^{12}$ $\frac{1}{cm^3}$

COUNTER-PROPAGATING PULSES

ASSUMING: 1μm FOCAL SPOTS
100fscc PULSES

MAXIMUM VOLUMETRIC DENSITY=

MVD=5X10 $10^{10}$ $\frac{1}{cm^3}$

TABLE 2. PHOTOSTABILITY OF WRITTEN FORM OF ISP AT DIFFERENT TEMPERATURES

| POLYMER | °C | 20 | 0 | −20 | −30 | −40 | −60 | −70 | −80 |
|---|---|---|---|---|---|---|---|---|---|
| | | | | $K, S^{-1}(\tau,S)$ | | | | | |
| PMMA | | $1.3 \times 10^{-2}$ (76) | $5.2 \times 10^{-3}$ (190) | $2.7 \times 10^{-3}$ (370) | $1.2 \times 10^{-3}$ (850) | $2.4 \times 10^{-4}$ (4100) | | $1.2 \times 10^{-4}$ (8400) | |
| PS | | $4.9 \times 10^{-3}$ (200) | $6.1 \times 10^{-3}$ (160) | $7.2 \times 10^{-4}$ (1400) | | $3.3 \times 10^{-4}$ (3000) | $2.7 \times 10^{-4}$ (3700) | | |
| PVA | | $5.8 \times 10^{-2}$ (17) | $3.5 \times 10^{-2}$ (28) | $2.3 \times 10^{-3}$ (430) | | $1.4 \times 10^{-3}$ (715) | $2.9 \times 10^{-4}$ (3450) | | $2.5 \times 10^{-4}$ (40000) |

FIG. 17b

TABLE 3. THERMAL STABILITY OF SEVERAL PHOTOCHROMIC MOLECULES IN VARIOUS HOSTS

| SP | ABSORPTION MEROCYANINE FORM, nm | | FLUORESCENCE MEROCYANINE FORM, nm | | $K_1:K_2$ $(s^{-1})$ | |
|---|---|---|---|---|---|---|
| | PS | PMMA | PS | PMMA | PS | PMMA |
| 1 | 609 | 580 | 645 | 625 | $4 \times 10^{-4}$ : $3.2 \times 10^{-4}$ | $1 \times 10^{-2}$ : $2.3 \times 10^{-4}$ |
| 2 | 630 | 615 | 690 | 670 | $1 \times 10^{-2}$ : $2.6 \times 10^{-4}$ | $5 \times 10^{-3}$ : $3.2 \times 10^{-4}$ |
| 3 | | 580 | | 620 | | $3 \times 10^{-2}$ : $2.2 \times 10^{-3}$ |
| 4 | | 585 | | 605 | | |
| 5 | | 565 | | 610 | | |

FIG. 17c

TWO-PHOTON, THREE-OR FOUR-DIMENSIONAL, COLOR RADIATION MEMORY

RELATION TO THE RELATED PATENT APPLICATIONS

The present patent application is a continuation in part of a co-pending first U.S. patent application Ser. No. 08/453,320 filed on May 30, 1995, which first application is itself a continuation of a second U.S. patent application Ser. No. 08/163,907 filed on Dec. 6, 1993. These two applications for a TWO-PHOTON FOUR-DIMENSIONAL OPTICAL MEMORY are to inventors including the selfsame Peter M. Rentzepis who is the sole inventor in the present application.

Said co-pending first patent application and its predecessor second patent application are each a continuation-in-part of a third U.S. patent application Ser. No. 07/586,456 filed Sep. 21, 1990 for a THREE-DIMENSIONAL OPTICAL MEMORY. This related third patent application is again to joint inventors including the same inventor Peter M. Rentzepis who is the sole inventor in the present application. This related third patent application issued as U.S. Pat. No. 5,325,324 on Jun. 28, 1994.

Said related third patent application is itself a continuation-in-part of a related fourth U.S. patent application Ser. No. 07/342,978 filed Apr. 25, 1989 for a THREE-DIMENSIONAL OPTICAL MEMORY. This related fourth patent application is to the selfsame inventor Peter M. Rentzepis who is the sole inventor of the present application. This related fourth patent application issued as U.S. Pat. No. 5,268,862 on Dec. 7, 1993.

All the related applications and patents are assigned to a common assignee The Regents of the University of California. The contents of the related predecessor patent applications are incorporated herein by reference.

RIGHTS IN THE U.S. GOVERNMENT

The present invention was developed under contract No. DOD F30602-90-C-0014 between the United States Air Force (USAF), acting through its Rome Air Development Center (RADC), through Call/Recall Corporation, and through The Regents of the University of California. The U.S. Government has a paid-up license in this invention and the right in limited circumstances to require the patent owner to license others on reasonable terms as provided for by the terms of the above-stated contract awarded by USAF, RADC.

BACKGROUND OF THE INVENTION

1. Field of the Invention

The present invention generally concerns radiation, or optical, memory apparatus that use active, radiation-sensitive, memory media, and methods of using such apparatus and media.

The present invention particularly concerns (i) a three dimensional volume of that contains a number of separate, but interrelated, radiation-sensitive photochromic chemicals, (ii) the individually selective alteration, and the unique interrogation, of each of multiple photochromic chemicals that are located in the same addressable physical domains of the volume by use of intersecting beams of radiation having selected frequencies, and corresponding energies; (iii) the manner of using selected intersecting radiation beams at times upon each of several different photochromic chemicals held in a three-dimensional matrix, and the physical and/or chemical effects of such use; and (iv) the construction of binary-stated informational memory stores, three-dimensional patterns, and/or three-dimensional displays wherein a number of binary bits of information are stored in each of a great multiplicity of addressable physical spaces.

2. Description of the Prior Art

The present invention will be seen to concern the storage of multiple bits of information in the same physical spaces, preferably in the addressable domains of a three-dimensional (3-D) volume radiation memory, but permissively also in the addressable domains of a layers (of which there are typically one, but more than one such layer is possible) of a substantially planar radiation memory, typically an optical disc. In a 3-D volume radiation memory, the domains are addressed in order to be written and read by intersecting beams of radiation, typically by light and more typically by laser light.

In a four-dimensional (4-D) volume radiation memory, the domains are still addressed in order to be written and read by intersecting beams of radiation, but the beams are typically (i) quite short in time, or pulses, and are (ii) phased relative to one another. The "fourth" dimension that is referred to in the title of the present invention is thus time—as is taught in a related patent application to be a suitable basis, a "fourth dimension" so to speak, of in the addressing a three-dimensional, volume, radiation memory store. The storage of multiple bits of information in the same physical spaces in accordance with the present invention will also be seen to also be applicable to such a 4-D volume radiation memory.

The present invention will further be seen to radiatively store, and read, information that is stored in different molecules that are co-located in the same physically addressable spaces, called domains. The writing of the information into a particular type of molecule will be seen to transpire at an associated radiation frequency, or "color". The interrogation of the written information from the same molecules will likewise seen to transpire at an appropriate radiation Frequency, or "color". It will be seen that, commonly, but one radiation frequency is used to interrogate all the different molecules at the same time, and that each different type of molecule will produce radiation—fluorescence—of an associated frequency, or color, in response to its interrogation.

Not only are multiple bits of information is co-located as multiple colors within the same physical domains, but all the radiative writing and reading of this information will be seen to be accomplished without contamination of, or degradation to, or confusing parallel-readout of, the information that is stored (as multiple colors, and upon multiple types of molecules) in adjacent spaces. This selectivity will be seen to be realized by (i) use of the process of two-photon (2-P) absorption in judicious combination with (ii) groups of multiple selected photochromic chemicals each of which chemicals permits that it should be (i) individually uniquely radiatively selected relative to all other chemicals, while (ii) producing no radiation—particularly during fluorescence upon readout—that causes any change(s) in these other chemicals.

The present invention can therefore be considered to be a photochromic chemical system, or a radiation memory system using multiple photochromic chemicals, or as some combination of these aspects and attributes. The relevance of the prior art to the present invention is therefore best assessed not merely in snippets as may concern, for example, the storage of information as colors (e.g., photography), or the detection of information in multiple colors (e.g., spectroscopy), but as to how such prior art might contribute to any coherent scheme for the colored radiative reading and writing of information as colors within a unitary physical medium. With this consideration in mind, prior art concerning both (i) optical discs, and (ii) volume radiation (optical) memories, may usefully be regarded.

2.1 Previous Optical Discs, and Disc Systems

In optical disc storage, a focused laser beam writes bits on a spinning disc either (i) once and for all, or (ii) time and again. The tiny diameter of a diffraction-limited, focused infrared laser spot permits very high recording densities. Currently, re-writable optical disc drives use near-infrared lasers, with a 780-mm wavelength, to store up to 2 GB on each 5.25-inch disc.

Visible laser beams will do still better. With, say, a red beam emitting at 640 nm, capacities as high as 3 GB can fit on a single 5.25-inch disc, while a blue beam (415 nm) could pack about 5 GB into the same area.

An optical drive provides, in a sense, infinite storage. Extra room is easily acquired, and at modest extra cost, by simply adding media cartridges. Such abilities are welcome in modern computer applications.

In the basic optical drive configuration, the output of a semiconductor laser diode is first collimated by a lens, and is then given a cylindrical shape by a prism-like component called a circularizer. The collimated and shaped beam is then transmitted to a turning (45-degree) mirror, which reflects it onto a objective lens. The lens focuses the beam onto a diffraction-limited spot on the spinning optical disc—the equivalent of a phonograph stylus. The laser stylus is used at low power to read out recorded marks, and to ensure track-following and focusing-servo functions.

The objective lens that focuses the spot is mounted on a platform, called an actuator, which moves across the diameter of the disc. Thus the actuator gives the laser beam access to any data tack on the disc.

A prime distinction between drives is which components are mounted on the actuator. A single-head optics design has all its optics mounted on the platform. In a split optics design, however, most of the optical system is fixed to the drive chassis, with only the objective lens and turning mirror being mounted on the moving actuator. The main benefit of the latter design is that the actuator weighs less, and can thus move faster and give faster access to the data.

A more crucial distinction between systems is how they record marks. The technique which is used determines the drive's design and the type of media that can be used. In current 5.25 inch commercial systems, the marks are made in a heated medium with one of three processes: ablative (hole burning), thermo-magnetic, or phase-change. In all these techniques, the optical drivers laser is first pulsed at high power so as to heat the disc medium in preparation for recording.

In ablative recording, the focused high-power laser spot burns holes in the medium. The permanency of this way of recording data is reflected in its name: write-once, read-many (WORM) recording.

WORM recording provides the highest level of data security available in a removal device, suiting it to many applications in government, legal, and financial data archiving. In contrast, thermo-magnetic (better known as magneto-optical) and phase-change recording are re-writable processes.

In magneto-optical recording, the energy in the laser beam merely heats a spot on the disc past the disc material's Curie point (about 200° C.). Each magnetic domain in the hot spot—or rather, each domain's direction of polarization—becomes susceptible to the influence of an external magnetic field. When the material cools below its Curie point, the direction of polarization is frozen and thus data is recorded. Obviously, this type of recording is reversible, with over a million overwrite cycles possible.

Marks recorded in this way can be read out by laser because of the Polar Kerr effect—the fact that the optical polarization of a linearly polarized beam is rotated very slightly (0.5 degree) when reflected by a magnetic domain. The direction of rotation,depending as it does on the direction of polarization of the magnetic domain, represents the binary data recorded on the disc. With the use of error-correcting codes, the design of the read optics and electronics provides a sufficient signal-to-noise ratio to ensure an error rate of less than one in 1012.

In phase-change media, the recording material is an alloy having two phases with different optical properties, such as TeSeSn, a chalcogenide of tellurium, selenium, and tin, which has a crystalline phase and an amorphous phase.

To form a mark, a spot of crystalline recording material is momentarily melted by a laser pulse. Then the spot cools quickly into an amorphous-phase mark, whose reflectivity differs from the surrounding, crystalline-phase material.

Recorded marks can be erased through an annealing process,during which a continuous erase beam heats the material to just below its melting point, returning the allow to its crystalline state.

The simplicity of phase-change technology gives it an edge over the magneto-optical drives, which have more complicated optical paths and electronics. Another plus is that a phase-change drive, having no need for a bias magnet (or data recording, can be made thinner and consume less power. Relative disadvantages include the medium's fewer proven overwrite cycles (about 50000) and the rate at which the material can change phase, which constrains the data-writing rate.

Both magneto-optical and phase-change systems are available in 1995. But drives of one type do not work with media of the other type. The incompatibility has been a source of confusion to users and a present damper on market growth for both technologies.

CD's are 120-mm-diameter optical media that have recently caught on for computing. Of the three types—read only, erasable, and in between—the CD ROM is the most popular. It is a read-only disc into which pits are permanently stamped to record data, much as vinyl records (or audio compact discs), for that matter) are stamped out from a master recording. To read the data on the disc, a laser stylus is shone on its surface, and the intensity of the tight reflected reveals the presence or absence of a pit.

A CD ROM can store a good deal of data (650 MB is typical), but reading and writing data is generally quite slow. Even the latest and fastest drives (6x-speed) have a data transfer rate of only 900 Kb/s, and their seek time is measured in the hundreds of milliseconds.

CD ROM drives are read-only devices and are without question the most successful of the optical drives, with unit sales doubling every year. At present, traditional optical drives do not read CD-ROM format discs, though no insurmountable technical issues prevent this.

In fact, a CD-recordable (CD-R) drive may be described as a WORM drive for CDs. An organic polymer on which marks are recorded by means of a phase-change process, the CD-R media can be played in normal CD-ROM drives. Conversely, CD-R drives can read CDs, but in addition read and write on CD-R media. Though fairly new, CD-R drives are winning a following as their prices plunge (their street price has dropped from about $5000 in 1993 to $3500 as of March, 1994).

The CD-R drive is useful for making masters for CD-ROM manufacturing, and the discs can be used for distributing a lot of information to a small audience. But because the drives record in CD format, their performance characteristics are unattractive for data storage. The Kodak® Photo CD is a type of CD-R in which photographic images are digitized and stored on the CD disc. (Kodak® is a registered trademark of the Eastman Kodak Company, Rochester, N.Y.).

On the horizon circa 1995 are CD-erasable (CD-E) systems, which one-up the recordable CD by being re-writable. There are no CD-E drives on the market at present (1995), but some are expected soon that, like CD-R, will use phase-change media.

Multi-layer storage is another idea whose time may have come. In May of 1994, IBM demonstrated an optical disc containing multiple writable layers. Because of the depth of focus of the objective lens is very small, layers can be read separately without crows talk. Moving from one layer to another requires only a slight shift of the objective lens. IBM's disc has four (4) layers, but in theory ten (10) are possible. Multi-layer technology could expand bit capacity with the least technical risk of any approach. Before products with multi-layer capability are introduced, however, industry wide interchange standards need to be in place.

The relevance of previous optical disk technology to the present invention will be seen to be that the present invention permits recording to be done within the volume, and not merely on the surface, of a new-composition optical Compact Disc (CD). Moreover, although the recording within the volume, or thickness, of the CD is likely done in layers (which layers may, however, be on the slant as well as parallel to the plane of the disk), the "layers" are not physically differentiated, the volume of the disc presenting a continuum of recordable medium.

Further in assessing the relevance of previous optical disk technology to the present invention, remember that the present invention will show that multiple bits of information may be stored in the same physical spaces—including in the volume of a CD—in multiple photochromic chemicals. Recall also that, although the multiple photochromic chemicals are separately radiatively written, they are read in common so as to produce multiple frequency (i.e., different color) radiations (i.e., fluorescent lights). The present invention will show that different-color readout fluorescent light beams are separable by a monochromator as simple as a prism, and, once separated, the information within each beam is separately detectable in parallel. Accordingly, at least the laser light readout of a present-day optical CD is already similar, and somewhat compatible, with the volume CDs and volume optical memory readout systems of the present invention, requiring only slight changes in the optical readout paths, and the replication of detectors.

2.2 Three- and Four-Dimensional Radiation Memories

A three-dimensional (3-D) radiation memory store has long been recognized to be potentially useful for providing desirable characteristics not present in today's magnetic and electro-optic memory devices. However, such a 3-D radiation memory store is, as of 1995, an immature technology. The major advantages of a 3-D radiation memory potentially include (i) random access, (ii) parallel access to considerable information per read or write cycle, typically $>10^6$ bits, (iii) high density and immense storage capacity, typically $>>10^{13}$ bits/cm$^3$, (iv) very fast reading and writing speeds, typically $<10^{-9}$ seconds, (v) small size, typically $\approx 1$ cm$^3$, (vi) low cost, projected to be $<\$10^3$/terabyte, (vii) the absence of mechanical or moving parts, and (viii) high reliability with low maintenance and long life.

To realize these advantages, a 3-D radiation memory would desirably use (i) a long-lived and stable (photochromic chemical) storage medium, having (ii) a high writing sensitivity, (iii) a high reading sensitivity and reading efficiency (i.e., light output), and (iv) only minimal (radiative) interaction—crosstalk—between adjacent bits. Notably, the previous sentence—absent the words in parenthesis—may be considered to be equally accurate in enumerating the challenges that have previously historically beset other computer memory media and computer memory systems—most notably square loop ferrite core magnetic memories—as the sentience is presently accurate in enumerating the present challenges to realizing practical 3-D radiation memories. It may thus be contemplated that each new generation of recording media of any type or any nature faces challenges of somewhat the same order; capacity, density, sensitivity, selectivity, permanence and cost.

The problems that beset different read-write-erasable optical memory media circa 1995 are several. These problems are of relatively greater and lessor severity, and impact, to the realization of various particular 3-D radiation memories, and to the practical realization of such memories. However, requirement (iv)—minimal radiative interaction, or crosstalk, between adjacent bits during operation and non-operation of the memory—is an important requirement for 3-D memories. This requirement is particularly useful of being considered when the scheme of the present invention is evaluated. The present invention will later be seen to employ a large number of differing frequency (i.e., different color) radiations (i.e., lights) to interact with (i.e, to probe with laser light) multiple photochromic chemicals, including for purposes of causing the multiple photochromic chemicals to produce multiple frequency (i.e., different color) radiations (i.e., fluorescent lights) during reading. These many, and these differing, radiation fluxes (lights) would initially seem to be a recipe for disaster. However, the present invention will be seen to "sort everything out" so that changes are radiatively induced only when and where wanted. Moreover, during normal operation of a memory system in accordance with the present invention, and during normal use of the photochromic chemicals of the memory store of such a memory system, no "graying" nor "washing out" of the photochromic chemicals, nor "any crosstalk" between the information that the photochromic chemicals contain, will occur.

At the onset, this is an important area to be regarded in the prior art as hereinafter discussed. Some of this art actually teaches such chemical interaction within a volume memory store as would be anathema to the present invention.

Moreover, a color memory store where everything is stable, reversible, and non-interfering is useful as a three-dimensional display, and for three-dimensional video and television. If the action of the several photochromic chemicals are to be visually observed as—for example as three-dimensional television—then the contents of one portion of the volume "screen" must not vary (i.e., fade, pulsate, etc.) as other portions of the "screen" volume change, or come to contain differing information (i.e., different images, and image colors), during usage and over protracted time and. Like the phosphors of a quality television cathode ray tube, the photochromic chemicals of a memory or display in accordance with the present invention will be seen not to contaminate each other either chemically or radiatively or by any other mechanism, and to remain "crisp" and "clean" indefinitely.

Previous attempts to realize long-lived high-figure-of-merit read-write-reversible volume radiation/optical memories are reviewed in the following sections 2.2.1 through 2.2.4. The sections include (i) a general discussion optical recording media, (ii) a most ancient class of three-dimensional memory stores wherein photochemical changes—as contrasted to photo-isomerization, or molecular excitation—changes occur within the memory (iii) three-dimensional (3-D) and four-dimensional (4-D) two-photon (2-P) radiation (optical) memories in accordance with the related patent applications, and (iv) a proposed figure of merit for radiation (optical) memories.

2.2.1 Optical Recording Media for, and the Use Thereof in, Two-Dimensional Optical Memories At the present two general types of optical recording media exist, namely phase recording media and amplitude recording media. Recording on the media of the first type is based on light-induced changes of the index of refraction (i.e., phase holograms). Recording on the media of the second type is based on photo-induced changes in the absorption coefficient (i.e., hole burning).

Volume information storage is a particularly attractive concept. In a two dimensional memory the theoretical storage density (proportional to 1/wavelength $\lambda^2$) is $1 \times 10^{11}$ bits/cm$^2$ for $\lambda$=266 nm. However in a 3-D memory the theoretical storage density is $5 \times 10^{16}$ bits/cm$^3$. Thus the advantages of 3-D data storage versus previous two dimensional information storage media become apparent.

Volume information storage has previously been implemented by holographic recording in phase recording media. Reference F. S. Chen, J. T. LaMacchia and D. B. Fraser, *Appl. Phys. Lett.*, 13, 223 (1968); T. K. Gaylord, *Optical Spectra*, 6, 25 (1972); and L. d'Auria, J. P. Huignard, C. Slezak and E. Spitz, *Appl. Opt.*, 13, 808 (1974).

The present invention will be seen to implement volume writable-readable-erasable optical storage in each of multiple phase recording medium each of which is also, coincidentally, an amplitude recording medium.

One early patent dealing with three-dimensional amplitude-recording optical storage is U.S. Ser. No. 3,508,208 for an OPTICAL ORGANIC MEMORY DEVICE to Duguay and Rentzepis, said Rentzepis being the selfsame inventor of the present invention. Duguay and Rentzepis disclose an optical memory device including a two-photon fluorescent medium which has been solidified (e.g., frozen or dispersed in a stable matrix, normally a polymer). Information is written into a selected region of the medium when a pair of picosecond pulses are made to be both (i) temporally coincident and (ii) spatially overlapping within the selected region. The temporally-coincident spatially-overlapping pulses create, by process of two-photon absorption, organic free radicals which store the information at an energy level intermediate between a fluorescent energy level and a ground state energy level. The free radicals store the desired information for but a short time, and until they recombine. The information may be read out by interrogating the medium with a second pair of coincident and overlapping picosecond pulses. In the case where the medium is frozen solid, interrogation may also be accomplished by directing a collimated infrared light beam into the selected region, thereby causing that region to liquefy and permitting its contained free radicals to undergo recombination. In each of the aforementioned cases, the interrogation beam causes the interrogated region to selectively fluoresce in accordance with the presence, or absence, or free radicals. The emitted radiation is sensed by an appropriate light detector as an indication of the informational contents of the interrogated region.

This early optical memory of Duguay and Rentzepis recognizes only that two-photon absorption should be used to produce excited states (e.g., singlet, doublet or triplet states) of an radiation-sensitive medium over the ground state of such medium. These excited states are metastable. For example, one preferred fluorescent medium is excitable from ground to a singlet state by process of two-photon absorption occurring in about $10^{-15}$ second. The excited medium will remain in the singlet state for about $10^{-8}$ second before fluorescing and assuming a metastable triplet state. This metastable state represents information storage. Alas, this metastable state will spontaneously decay to the ground state by fluorescence after about 1 second (depending on temperature). The memory is thus unstable to hold information for periods longer than about 1 second. It should be understood that the fluorescent medium of the Duguay and Rentzepis memory is at all times the identical molecular material, and simply assumes various excited energy states in response to irradiation.

Another previous optical system for accomplishing the volume storage of information, and for other purposes, is described in the related series of U.S. Pat. Nos. 4,078,229; 4,288,861; 4,333,165; 4,466,080; and 4,471,470 to Swainson, et al. and assigned to Formigraphic Engine Corporation. The Swainson, et al. patents are variously concerned with three-dimensional systems and media for optically producing three-dimensional inhomogeneity patterns. The optically-produced 3-D inhomogeneity patterns may exhibit (i) controlled refractive index distributions, (ii) complex patterns and shapes, or (iii) physio-chemical inhomogeneities for storing data. The Swainson, et al. patents generally show that some sort of chemical reaction between two or more reactive components may be radiatively induced at selected cell sites of a 3-D medium in order to produce a somewhat stable, changed, state at these selected sites.

U.S. Pat. Ser. No. 4,471,470, in particular, describes a METHOD AND MEDIA FOR ACCESSING DATA IN THREE-DIMENSIONS. Two intersecting beams of radiation are each matched to a selected optical property or properties of the active media. In one embodiment of the method and media, called by Swainson, et al. "Class I systems," two radiation beams generate an active region in the medium by simultaneous illumination. In order to do so, two different light-reactive chemical components are typically incorporated within the medium. Both components are radiation sensitive, but to different spectral regions. The two radiation beams intersecting in a selected region each produce, in parallel, an associated chemical product. When two products are simultaneously present in a selected intersection region then these products chemically react to form a desired sensible object. The sensible object may represent a binary bit of information. One or both of the radiation-induced chemical products desirably undergoes a rapid reverse reaction upon appropriate irradiation in order to avoid interference effects, and in order to permit the three-dimensional media to be repetitively stored.

In other embodiment of the Swainson et al. method and media, called "Class II systems," one of the radiation beams must act on a component of the medium before the medium will thereafter be responsive to the other radiation beam. The class I and class II systems thus differ by being respectively responsive to the effects of simultaneously, and sequentially, induced photoreactions.

The Swainson, et al. patents—including those patents that are riot directed to information storage and that are alternatively directed to making optical elements exhibiting inhomogeneity in their refractive index, or to making physical shapes and patterns—are directed to inducing changes in a bulk media by impinging directed beams of electromagnetic radiation, typically laser light, in order that selected sites within the bulk media may undergo a chemical reaction. There are a large number of photosensitive substances that are known to undergo changes in the presence of light radiation. The changed states of these substances are, in many cases, chemically reactive. The patents of Swainson, et al. describe a great number of these photosensitive and photo-reactive substances. Such substances may generally be identified from a search of the literature.

Swainson, et al. also recognize that molecular excitation from a ground state to an excited state may occur following a stepwise absorption of two photons. Swainson, et al. call this "two-photon absorption." Swainson, et al. describe that a solution of 8' allyl-6' nitro-1, 3, 3-trimethylspiro(2' N-1-benzopyran-2'-2-induline) in benzene may be exposed to intersecting synchronized pulsed ruby laser beams transmitted through an UV elimination filter to form, at the region of intersection, a spot of color. The process of stepwise absorption of two photons in this solution, and in others, is recognized by Swainson, et al., only as regards its use to produce an excited state that may form (as in the example) colored products, or that may serve as an energy transfer agent.

In making all manner of excited states—including singlet, doublet, triplet, and quartet states—the patents of Swainson, et al. describe known photochemistry. Generally chemistry, and photochemistry, that is known to work in one dimension is equally applicable in three dimensions. For example, it is known that an electron may be knocked off an active substance so that it becomes an ion. For example, it is known that radiation may cause a substance to dissociate a proton, again becoming an ion. For example, it is even known how to induce spin changes and changes in parity by electromagnetic radiation. Once these changes, or others, are induced in an radiation-sensitive medium then Swainson, et al. describe a reliance on the transport capabilities of the liquid or gaseous support media in order to permit a chemical reaction to transpire.

The present and related inventions reject the Swainson, et al. approach of inducing chemical reactions in a 3-D medium by creating one or more reagents by use of radiation. One reason why the present and related inventions do so is because the same support medium, or matrix, that offers those transport capabilities that are absolutely necessary to permit the chemical reactions to occur will also permit, at least over time, undesired migration of reagents or reaction products in three dimensions, destroying the integrity of the inhomogeneity pattern (i.e., the information stored).

2.2.2 A First Two Related Predecessor Patent Applications—Each for a Three-Dimensional Two-Photon (3-D 2-P) Optical Memory The inventions of two chronologically-earliest related patent applications contemplate (i) addressing, and (ii) writing data to or reading data from, selected domains within a three-dimensional volume of radiation-sensitive medium by and with two selectively chosen, coincident, radiation beams. The radiation beams are selectively guided to spatial and temporal coincidence so as to cause certain selected domains, and only those certain selected domains, to selectively undergo selected changes by process of two-photon absorption.

The first related patent application—Ser. No. 342,978 filed Apr. 25, 1989 issued Dec. 7, 1993 as U.S. Pat. No. 5,268,862 for a THREE-DIMENSIONAL OPTICAL MEMORY—particularly teaches selectively inducing isomeric changes in the molecular isomeric form of selected regions within a three-dimensional radiation-sensitive medium by the process of two-photon absorption.

The method of the related invention produces a three-dimensional inhomogeneity pattern in a volume of active media in response to directed electromagnetic radiation. In order to do so, an radiation-sensitive medium having at least two isomeric molecular forms is contained within a volume. The radiation-sensitive medium is responsive to energy level changes stimulated by electromagnetic energy to change from one of its isomeric molecular forms to another of its isomeric molecular forms. A selected portion of the radiation-sensitive medium is selectively radiated with plural directed beams of electromagnetic radiation to change the selected portion from the one isomeric molecular form to the other isomeric molecular form by process of plural-photon absorption. The induced isomeric changes possess useful optical, chemical, and/or physical characteristics.

In the preferred embodiment of the first predecessor application an radiation-sensitive medium typically a photochromic material and more typically spirobenzopyran, was maintained in a three-dimensional matrix, typically of polymer, and illuminated in selected regions by two UV laser light beams, typically of 532 nm. and 1064 nm. wavelength. The illumination causes the radiation-sensitive, photochromic, spirobenzopyran medium to change from a first, spiropyran, to a second, merocyanine, stable molecular isomeric form by process of two-photon absorption. Regions not temporally and spatially simultaneously illuminated were unchanged. Later illumination of the selected regions by two green-red laser light beams, typically of 1064 nm wavelength each, caused only the second, merocyanine, isomeric form to fluoresce. This fluorescence was detectable by photodetectors as stored binary data. The three-dimensional memory can be erased by heat, or by infrared radiation, typically 2.12 microns wavelength. Use of other medium permit the three-dimensional patterning of three-dimensional forms, such as polystyrene polymer solids patterned from liquid styrene monomer. Three-dimensional displays, or other inhomogeneity patterns, can also be created.

The present application will be seen to use, as just one suitable radiation-sensitive, photochromic, medium the exact same medium as did the volume optical memory of the earliest predecessor invention: spirobenzopyran. Moreover, the present invention will be seen to make use of the variation of fluorescence between the two stable isomeric molecular forms of the spirobenzopyran molecule—just as did the earliest (but not all the intermediary) related patent applications.

Meanwhile, the second related patent application—Ser. No. 586,456 filed Sep. 21, 1990 for a THREE-DIMENSIONAL OPTICAL MEMORY, now issued as U.S. Pat. No 5,325,324 on Jun. 28, 1994—particularly deals with a system and method for addressing a three-dimensional radiation memory with two radiation beams so as to, at separate times, write binary data to, and to read binary, data from, such memory by process of two-photon absorption. The radiation beams are typically, but not necessarily, light, and are more typically laser light. Accordingly, the complete device, or system, incorporating such a volume memory was called a two-photon three-dimensional optical memory, or a 2-P 3-D OM.

The addressing of the volume memory within the 2-P 3-D OM preferably (but not necessarily) used, as a part of one component (a holographic dynamic focusing lens, or HDFL), a hologram. Thus the 2-P 3-D OM was preferably holographically addressed.

The optical memory of the present invention will be seen to dispense with the requirement for a HDFL, or for holographic addressing.

In the 2-P 3-D OM of the second predecessor application one directed beam of electromagnetic radiation was spatially encoded as an n×n wavefront array of binary bits by use of a two-dimensional spatial light modulator (2-D SLM). This spatially-encoded beam, and an additional, orthogonal, beam of electromagnetic radiation, were then selectively guided into spatial and temporal coincidence at a selected n×n planar array of domains within a three-dimensional matrix of such domains within a three-dimensional volume of radiation-sensitive medium.

This function of the spatial light modulator of the second predecessor application to spatially encode information upon a planar wavefront, or pulse, of radiation will be seen to be continued in certain color optical memories of the present invention.

In the second predecessor invention, the spatially-encoded selectively-guided coincident radiation beams served, dependent upon their combined energies, to either write (change) or read (interrogate) the condition, and particularly the isomeric molecular form, of the selected domains by a process of two-photon absorption. Remaining, un-selected, domains received insufficient (i) intensity from either beam, or (ii) combined energy from both beams, so as to be substantially affected.

This function, and property, of two-photon (2-P) absorption will also be seen to be preserved in the optical memories of the present invention.

In its preferred embodiment, the optical memory of the second predecessor application served to temporally and spatially simultaneously illuminate by two radiation beams—normally laser light beams in various combinations of wavelengths 532 nm and 1024 nm—certain selected domains—normally $10^3 \times 10^3$ such domains arrayed in a plane—within a three-dimensional (3-D) volume of radiation-sensitive medium—typically 1 cm$^3$ of spirobenzopyran containing $10^2$ such planes. This selective illumination served, dependent upon the particular combination of illuminating light, to either write binary data to, or read binary data from, the selected domains by process of two-photon (2-P) absorption. Cne laser light beam was preferably directed to illuminate all domains of the selected plane in and by a one-dimensional spatial light modular, 1D SLM). The other laser light beam was first spatially encoded with binary information by 2-D SLM, and was then also directed to illuminate the domains of the selected plane. Direction of the binary-amplitude-encoded spatially-encoded light beam was preferably by focusing, preferably in and by a holographic dynamic focusing lens (HDFL). During writing, the selected, simultaneously illuminated, domains changed in their isomeric molecular form by process of 2-P absorption. During reading the selected domains fluoresced dependent upon their individually pre-established, written, states. The domains' fluorescence was focused by the HDFL, and by other optical elements including a polarizer and polarizing beam splitter, to a $10^3 \times 10^3$ detector array. The I/O bandwidth to each cm$^3$ of radiation-sensitive medium was on the order of 1 Gbit/sec to 1 Tbit/sec.

The present invention is usable with 2-P 3-D optical memories of the forms taught within both the first and the second related applications—namely 2-P 3-D optical memories that are respectively addressed without, and with, focusing of incident radiation, particularly by focusing in a holographic dynamic focusing lens.

2.2.3 A Third Related Predecessor Patent application for a Four-Dimensional Two-Photon (4-D 2-P) Optical Memory A third related patent application—U.S. Ser. No. AAA, AAA filed on May 30, 1995—is itself a continuation of a U.S. patent application Ser. No. 163,907 filed on Dec. 6, 1993. Both these two applications for a TWO-PHOTON FOUR-DIMENSIONAL OPTICAL MEMORY to inventors including the selfsame Peter M. Rentzepis who is the inventor in the present application.

A 2-P 4-D radiation memory in accordance with the third related application stores binary information in a three-dimensional (3-D) volume of a medium that is sensitive to radiation in its absorption band so as to undergo an anomalous, stable, change in its index of refraction. For simplicity, this medium is called a "radiation-sensitive medium". The 3-D volume may be, for example, in the shape of a cube of typical size 1 cm$^3$. The cube may typically contain as a radiation-sensitive medium the photochromic chemical spirobenzopyran stably held in position in and by a matrix of, for example, polymer plastic.

The cubical 3-D volume of radiation sensitive medium is, accordance with the present invention, simultaneously momentarily radiatively illuminated along each of two axis that are mutually intersecting at a predetermined angle. The illumination axis are typically intersecting either at 90>—perpendicularly—or at 180>—in which case the two axis are really but one axis along which the two radiation illuminations are counter-propagating.

The illuminating radiation along at least one, and preferably both, of the intersecting axis is in the form of momentary pulse. The pulse can be in the form of a plane wave, alternatively called a planar wave front. At least one illuminating radiation pulse is commonly in this form, and both pulses are preferably in this form. Both pulses must be in this form particularly in the counter-propagating intersection geometry.

The momentary, pulse, illumination serves to define and to address and to select, in a manner to be explained, a unique multiplicity of domains—for example $4 \times 10^6$ such domains—out of a very great multiplicity of such domains—for example out of $8 \times 10^9$ such domains that are three-dimensionally (3-D) arrayed within the volume. Each selected multiplicity of domains is substantially two-dimensional, meaning that it is but one domain "thick" in the direction of each, and of both, illuminations. The selected multiplicity of domains can be, but need not be, in a plane (irrespective of whether either or both illuminating radiation pulses in a planar wavefront). Note that the domains are defined by the illumination, and do not represent initially, or permanently, physically or otherwise-differentiated regions within the volume of radiation-sensitive medium, which is substantially homogeneous.

Each domain stores binary information as one of two stable states, each of which states has a different associated index of refraction.

Domains within the 3-D volume of radiation-sensitive medium are written (changed from a first to a second state and associated index of refraction) by process of two-photon absorption. Domains are so written upon such times as two time-resolved radiation beams, or radiation pulses, together having a joint energy that aggregates a predetermined first energy level both (i) temporally and (ii) spatially intersect within the domain. (Remember always that the energy of a radiation beam, or radiation pulse, is a function of its frequency (E=hv), and not of either its intensity or its duration.) The radiation-sensitive medium within each intersection domain is responsive to radiation of this first energy level to change from a first one of its two stable states to its other, second, state.

The responsiveness of the radiation-medium to so change is a function of the well-known quantum-mechanical equations of two-photon interaction, particularly (in the case of writing the medium) two-photon absorption. The necessity, in accordance with the law of physics, of having a temporal, as well as a spatial overlap between the two intersecting radiation pulses will prove important to the present invention. Namely, in accordance with the present invention the (i) durations and (ii) time sequence (relative phase) of the illuminating pulses, as well as their spatial directions, will be positively controlled. The size and locations of the domains, as well as the nature of changes in the state and the percentage completeness of such changes within the volume of the domain, is a function of the time (i) duration and (ii) sequence of the illuminating radiation pulses, as well as the direction of such pulses. Indeed, the directions, or axis, of both illuminating radiation pulses are normally maintained constant, for example at 90° or 180°, for a particular embodiment of the invention. Moreover, there is no selective focusing, nor any other attempt to manipulate the spatial direction or density distribution of the illuminating radiation pulses. Each pulse typically impinges as a plane wave parallel to a face of a cubical volume straight against a face of the cube, and passes straight through the entire volume. Pulse timing is the all-important determinate of where changes (in the event of writing or erasing), or detections (in the event of reading), transpire within the volume of radiation-sensitive medium.

This scheme is considerably different than most, if not all, previous optical volume memory addressing schemes where radiation beams were simply directionally concentrated upon the volume portions where changes were to be made (possibly even by process of two-photon absorption), but where the illuminating beams were not positively temporally (as well as spatially) controlled. In accordance with the related invention, the (directionally) intersecting beams are further positively controlled both (i) duration, and (ii) time relationship (alternatively called time sequence, or phase). When the radiation illumination of the volume of radiation-sensitive medium is controlled so as to be in the form of time-sequenced radiation pulses—as it is in the 2-P 4-D memory of the related invention—undesired changes outside the addressed domains of the volume will, for all practical purposes, become physically impossible. Accordingly, the 2-P 4-D memory has a high figure of merit for selectivity, and considerable resistance to cumulative contamination during repetitive use.

Continuing with the write operation, if the radiation-sensitive medium at the addressed domains is already in its second state then it is unchanged by radiation of this first energy level. The radiation-sensitive medium is insensitive to the energy of either write radiation pulse taken alone, and nowhere within the entire 3-D volume is the radiation-sensitive medium changed in the slightest by either write radiation pulse taken individually.

Each domain within the 3-D volume of radiation-sensitive medium is also read by process of two-photon interaction. A domain is so read upon such times as two radiation pulses—one of which radiation pulses may also be a pulse otherwise used for writing and which two pulses taken together have a joint energy that aggregates a predetermined second energy level less than the first energy level—again temporally and spatially intersect in the domain, interacting therewith. The radiation-sensitive medium is totally insensitive to radiation of this aggregate second energy level, as well as to the energy of either beam taken individually, to change in the slightest, let alone to change state. Accordingly, reading is non-destructive.

Considering the previous paragraph, one way of describing the response of the 2-P 4-D radiation memory during reading is to say that it is selectively transparent. Neither radiation pulse can "see" anything within the volume of radiation-sensitive medium save that it temporally and spatially intersects the other pulse, and then only to the time extent and over the spatial interval where such intersection satisfies the quantum-mechanical equations of two-photon interaction. Both pulses "see" the same thing (if the molecules of the radiation-sensitive medium are randomly aligned, as is normal) at their locations of intersection, and each is modified in the same way.

Note that in the two-photon interaction each and both radiation pulses are not modified in accordance with their individual characteristics (such as frequency, and energy), but are modified identically accordance with the two-photon interaction. Both read radiation pulses accordingly "see" the same thing, and both are commonly detected so as to permit real-time redundant checking of the correct operation of the 2-P 4-D radiation memory.

Remarkably for a radiation memory that already has two (2) separate and redundant read radiation outputs (each of which is independently detectable in an associated array of photodetectors or the like), there is yet further radiation output from the memory during reading. The two stable indices of refraction selectively assumable by the radiation-sensitive medium represent, in the preferred spirobenzopyran radiation-sensitive medium, two different isomeric molecular forms of this spirobenzopyran medium. During reading each intersection domain will selectively fluoresce dependent upon its pre-existing isomeric molecular form.

This incoherent fluorescence occurs at a separate wavelength and frequency from each of the selectively transmitted read light pulses. It is also detectable by photodetectors or the like. Although detectable at any angle to the volume, the intersection domains will be unambiguously resolved only along an axis of illumination. The fluorescent light emissions may be split out from the coherent, illuminating, read radiation pulses also transmitted along these illumination axis by beamsplitters and like devices. Note that, because the fluorescent light emissions travel in all directions (unlike the directional read radiation pulses), such beamsplitters can be located in the path(s) of either of both read radiation pulses in locations before the volume of radiation-sensitive medium. Because there is little problem with laser production of read radiation pulses sufficiently intense so as to overcome any losses in a beamsplitter, there is little, or no, problem to redundantly detecting the fluorescence along one or both illumination axis, providing yet another redundant detection of the data stored in the intersection domains.

Although unnecessary for operation as a memory, and although projected to be uncommon during normal usage of the 2-P 4-D radiation memory, each domain within the 3-D volume of radiation-sensitive medium can still further be erased (changed from its second to its first state). Erasure is again by process of two-photon interaction, particularly two-photon absorption. A domain is erased upon such times as two radiation pulses—one of which radiation pulses may also be a pulse otherwise used for writing and/or reading and which two radiation pulses taken together have a joint energy that aggregates a predetermined third energy level that is greater than the first (and second) energy level—temporally and spatially intersect within the domain, interacting therewith by two-photon absorption.

The radiation-sensitive medium within each intersection domain is responsive to radiation of this third energy level to change from its second to its first state. If the radiation-sensitive medium is already in its second state then it is unchanged by radiation of the third energy level. The radiation-sensitive medium is insensitive to the energy of either illuminating erase radiation pulse taken alone, and is nowhere within the entire 3-D volume is the radiation-sensitive medium changed in the slightest by either erase radiation pulse taken individually.

According to this operation, and these properties, the radiation memory of the present invention is deservingly called four-dimensional, or "4-D" for at least two reasons.

First, and as previously explained, fluorescence from the intersection domains can be detected, preferably along one or both illumination axis, to provide yet another redundant detection of the data that is stored within the intersection domains. The fluorescent light output is at a different frequency and wavelength from either of the read radiation pulses (that are both selectively refracted in their transmission through the volume of radiation-sensitive medium by the pre-existing indices of refraction stored in the intersection domains). Because each frequency of light output is a separate dimension, the radiation memory of the third related application is "4-D".

Second, the (i) three-dimensional (3-D) volume of a medium that is sensitive to radiation in its absorption band to undergo an anomalous change in index of refraction, and (ii) the manner of radiatively defining, changing and detecting selected domains within the 3-D volume of radiation-sensitive medium by process of two-photon (2-P) absorption, together also constitute a fourth dimension (4-D) to a standard 2-P 3-D radiation memory. Together they serve to make a radiation memory four dimensional (4-D) in a way that the inducement of selective changes in isomeric molecular form by process of two-photon absorption that is taught within the first two related predecessor patent applications do not.

To understand why this is so, and the second reason why the radiation memory of the third related patent application is deservedly called four-dimensional (4-D) rather than three dimensional (3-D), consider the following. First—and although any radiation pulse or beam will be somewhat affected by passage through a great length of radiation sensitive medium—a single radiation pulse is substantially unaffected by any and all domains of varying refractive index through which it passes so long as it does not undergo interaction with any domain or domains by process of two-photon absorption. Indeed, the single radiation pulse is likely totally unaffected within measurement limits during its passage through short, fractional meter, lengths of a radiation sensitive medium.

Accordingly, if the dimension of a three-dimensional (3-D) volume of radiation-sensitive medium having domains that exhibit varying indices of refraction is kept quite small—say on the order of one centimeter (1 cm.)—then a single radiation pulse (or beam) of less than threshold energy will pass through the medium substantially totally unaffected in any way, and will incur refraction if, when and where—and only if, when and where—it both spatially and temporally intersects a second radiation beam of appropriate energy. One way of regarding this phenomena is to consider that the radiation-sensitive medium is transparent to the single radiation pulse or beam save only where, and when, it is selectively rendered non-transparent by a temporally and spatially intersecting pulse or beam (of appropriate energy-.

Consider also the involvement of time. A radiation pulse—whether used for writing or for reading or for erasing—interacts with the radiation-sensitive medium only at the particular location(s) where it is both spatially and also temporally coincidence with an intersecting pulse. The two pulses affect, and are most substantially affected by, the radiation-sensitive medium not only at the location(s) of their spatial, but also of their temporal, intersection. This means that both radiation pulses both modify, and are themselves modified, in a temporal (time), or fourth, dimension—as well as in the three spatial dimensions.

The 2-P 4-D radiation memory of the third related application makes use of its temporal, or time, dimension—which is another reason why it is so named "4-D"—in the addressing of domains within the 3-D volume of radiation-sensitive medium.

Consider reading. Each of two mutually intersecting radiation pulses exiting the volume of radiation-sensitive medium will bear the record of the refractive index of only the domains in which each pulse has intersected the other during its passage. Each pulse passes through the volume of radiation-sensitive media at near light speed, typically some substantial fraction of $3 \times 10^8$ meters per second. During the course of its passage each pulse intersects the other in sharply defined and located regions called domains. The volume (size) of the domains is set by (i) the speed of the pulses in the radiation-sensitive medium, and (ii) and the quantum mechanical requirement that the two pulses must be spatially and temporally coincident for a sufficient time and space so as to interact with the radiation-sensitive medium.

Curiously, and beneficially, the duration of a pulse need not be so short as the time it takes to traverse a domain that the pulse (and its companion pulse) serve to define. Consider that if each radiation pulse is traveling at some substantial portion of $3 \times 10^8$ meters/second, and if the volume of radiation-sensitive medium is on the order of 1 cm$^3$, and if this volume is divided into $2 \times 10^3$ by $2 \times 10^3$ by $2 \times 10^3$ (i.e., $8 \times 10^9$) domains, then, if half the distance in each of three co-ordinate directions is devoted to domains (i.e., one-eighth the volume), then the dimension of each domain will be about $2.5 \times 10^{-7}$ meters and each beam will traverse this distance in about 8 femtoseconds ($8 \times 10^{-15}$ seconds). Laser pulses this short can be generated, but only with difficulty. Luckily, however, the quantum-mechanical equations of two-photon absorption require that each of two pulse should be considerably longer than 8 femtoseconds if it is to react by process of two-photon absorption over a distance of $2.5 \times 10^{-7}$ meters. In fact, each radiation pulse has a quite manageable length of about 1.0 picoseconds ($10 \times 10^{-12}$ seconds). Each intersection domain has a dimension of about ($2.5 \times 10^{-5}$ meters)$^3$, and $2 \times 10^3$ by $2 \times 10^3$ by $2 \times 10^3$ such domains (i.e., $8 \times 10^9$ total domains) fit within a three-dimensional volume of one cubic centimeter (1 cm$^3$) with as much spacing in any co-ordinate direction between adjacent domains as the domains extend in that direction. (A "safety" margin this great, or 100% margins, is not required, but the radiation-sensitive photochromic medium in its polymer matrix is exceedingly inexpensive, and there is little need to tightly pack the domains.)

As a final step to selecting one multiplicity of domains to be read, written, or erased during any one cycle, out of the very great number of domains that are within the entire volume, one of the pulses is variably delayed relative to the other pulse. If the radiation pulses intersect at other than 180° (i.e., counter-propagating), and, for example, if the radiation pulses intersect at. 90° (i.e., perpendicular) then one pulse must be so variably delayed in each of various regions of its planar wavefront to a different degree.

The present invention is usable with the 2-P 4-D optical memories of the third related patent application. Namely, it is usable in an volume radiation memory that is addressed by intersecting—particularly including counter-propagating—pulses that are of (i) a particular time duration, and (ii) phase. In such a memory domain definition and addressing is no longer by light steering—which is relatively difficult and often accomplished by relatively slow electro-optic devices that may even have mechanical movement—but rather by such laser light timing and phasing as can be done very well and quickly circa 1995 (witness fiber optic communication). Namely, the present invention is usable in—and indeed, preserves—a volume radiation memory where radiation is passing through unaddressed regions without altering or interacting with these regions in any substantial way, and where even the fluorescence as may be produced by addressed domains upon read interrogation is harmless to corrupt other domains of the volume memory.

2.2.4 Spatial Light Modulators

The three- and four-dimensional optical memories of the present invention do not depend upon spatial light modulators (SLMS) as their preferred arrayed light-encoding elements nor, for that matter, on Charge Coupled Devices (CCDs) as their preferred arrayed light-detecting elements. However, some preferred 3-D and 4-D embodiments of the present invention will be seen to employ spatial light modulators (as did the optical memories of the related predecessor inventions) and, because these advanced devices are still somewhat uncommon (unlike CCDs), their operation is explained in this BACKGROUND OF THE INVENTION section of this application.

A recent survey, circa 1990, of spatial light modulators is contained in the article *Two-Dimensional Spatial Light Modulators: A Tutorial* by John A. Neff, Ravindra A. Athale, and Sing H. Lee, appearing in Proceedings of the IEEE Vol. 78, No. May 5, 1990 at page 826. The following summary is substantially derived from that article.

Two-dimensional Spatial Light Modulators (SLMs) are devices that can modulate the properties of an optical wavefront—such as the properties of amplitude, phase, or polarization—as a function of (i) two spatial dimensions and (ii) time in response to information-bearing control signals that are either optical or electrical. SLMs usefully form a critical part of optical information processing systems by serving as input transducers as well as performing several basic processing operations on optical wave fronts.

SLMs, although once considered simply as transducers that permitted the input of information to an optical processor, have a broad range of applications, and are capable of performing a number of useful operations on signals in the optical domain. Some of the more important functions that have been demonstrated with SLMs are: analog multiplication and addition, signal conversion (power amplification, wavelength, serial-to-parallel, incoherent-to-incoherent, electrical-to-optical), nonlinear operations, and short-term storage.

The functional capabilities of SLMs can be exploited in a wide variety of optical computer architectures. Applications of 1-D and 2-D SLMs encompass just about ever} optical signal processing/computing architecture conceived.

SLMs may be classified as to type. The major classification categories result from (i) the optical modulation mechanism, (ii) the variable of the optical beam that is modulated, (iii) the addressing mode (electrical or optical), (iv) the detection mechanism (for optically-addressed SLMs), and (v) the addressing mechanism (for electrically-addressed SLMs).

The modulation of at least one property of a readout light beam is inherent in the definition of an SLM. Hence the first major category of SLMs is based on modulation mechanisms. The modulation mechanism employs an intermediate representation of information within a modulating material. An information-bearing signal, either optical or electrical, is converted into this intermediate form. The major forms of conversion mechanisms that are employed in 2-D SLMs are (a) Mechanical
(b) Magnetic
(c) Electrical
(d) Thermal.

Of these conversion mechanisms, the electrical mechanism will be seen to be preferred for use in the three-dimensional optical memory of the present invention. In the electrical conversion mechanism, the electric field interacts with the modulating material at several levels, giving rise to different effects. The interaction can take the form of distorting the crystal lattice, changing the molecular orientations, or modulating the electron density functions.

A conversion mechanism and the modulating material so converted have a characteristic response time, activation energy, and spatial scale. These parameters, in turn, have a major impact on the respective speed sensitivity and spatial resolution of the optical modulation performed by the SLM. A modulation mechanism, however, becomes physically more specific only when combined with a choice of appropriate modulation variables, to be discussed next.

An optical wavefront has several associated variables that can be modulated as a function of the spatial coordinates and time in order to carry information. These variables include (a) Intensity (amplitude)
(b) Phase
(c) Polarization
(d) Spatial frequency spectrum (texture).

Intensity (amplitude) and phase are the most commonly used representations in an optical computing system. Polarization and spatial frequency spectrum are often used as intermediate representations, and are converted into intensity or phase modulation before the information is used in the next stage of the optical computing system. Intensity (amplitude), phase, and polarization modulation will each be seen to be employed in the three-dimensional optical memory of the present invention.

Intensity, or amplitude, modulation commonly results when the absorption characteristics of a modulating material are changed. Because the intensity of a light beam is proportional to the square of its amplitude, the difference between these two modes depends on the variable that is employed in subsequent processing of a SLM output. The present invention will be seen to be more concerned with selectively controllably spatially modulating to zero intensity, and amplitude, then with any requirement that modulation at and to an opposite binary state should produce sufficient intensity, and amplitude, so as to permit a desired operation within an optical memory. This is because any presence of light intensity, or amplitude, in those spatial locations of an optical wavefront (i.e., at a particular time) where, and when, there is desirably no light intensity, nor any amplitude, constitutes optical noise.

The three-dimensional optical memory in accordance with the present invention will be seen to be innately highly insensitive to optical noise, being roughly sensitive to $(noise/signal)^2$, as opposed to the lesser figure of merit noise/signal, in certain operations. Nonetheless to this innate insensitivity, optical noise may be cumulative in degrading the integrity of informational stores within the optical memory over billions and trillions of read and write cycles. Accordingly, intensity, or amplitude, modulation in accordance with the present invention is desirably very "clean," with minimal, essentially zero, optical intensity or amplitude in those wavefront regions which are spatially modulated to one ("0") binary state. Spatial light modulation, and SLMs, will be seen to so operate in the present invention: veritably no light will be in regions where it is not wanted.

Polarization modulation is commonly achieved by modulating the bi-refringence associated with the modulating material of the SLM. Bi-refringence is a property of some materials in which the refractive index depends on the state of polarization and direction of light propagation. Depending upon the effect utilized, the state of polarization changes (e.g., from linear to elliptical), or the angle of the linear polarization changes without changing the state of polarization. The memory system of the present invention will be seen to use phase-modulating SLMs that produce each such effect.

Polarization modulation can be changed into intensity (amplitude) modulation by employing polarized readout light and an analyzer in the output. The memory system of the present invention will later be seen to be so change polarization modulation into intensity modulation. Indeed, this will be seen to be a primary approach by which the net effective intensity, or amplitude, modulation will be rendered exceptionally "clean," and of satisfactory quality to support reliable operation of volume optical memories over great periods of time and astronomical numbers of read and write cycles.

2.2.5 A Figure of Merit for a Readable and Writable and Erasable Optical Memory

Most new memory technologies are typically immediately gauged by the figures of merit that have attended past technologies. These previous figures of merit, while generally representing criteria that must be met by any operational computer memory, are often substantially irrelevant to the truly critical performance aspects, and to new figures of merit, that are appropriate to a new technology.

For example, the Intellectual Property Owners, Inc. gives annual awards in the name of its educational subsidiary the IPO Foundation to distinguished inventors. In the 1989 awards, Robert P. Freese, Richard N. Gardner, Leslie H. Johnson and Thomas A. Rinehart were honored for their improvements in erasable, re-writable optical discs introduced by the 3M Company during 1988. The optical discs can store 1,000 times as much information as conventional flexible diskettes used with personal computers. The inventors were the first to achieve a signal to noise ratio for an erasable optical disc in excess of 50 decibels.

Although the inventor of the present invention would be the first to recognize this contribution, and to acknowledge the necessity of an adequate optical (and electrical) signal-to-noise ratio for optical memories, a focus on signal-to-noise as a figure of merit may be rooted in the importance of this measurement in certain previous electrotechnology. For example, certain magnetic memories, such as stripe domain garnet film and Block line magnetic memories, have undesirably small signal-to-noise ratios.

It is uncertain what constitutes the ultimate, or even the most appropriate, figure of merit (or figures of merit) for a readable and writable and erasable optical memory. However, it is suggested that, in the case of a three-dimensional optical memory, it is important to consider whether or not, and how fast, the memory might become "dirty" from use and suffer degradation in the integrity of its data stores.

The concept of a "dirty" three-dimensional optical memory arises because every read and write operation on the memory by use of radiation has the potential to perturb other storage domains than just those domains that are intended to be dealt with. The most analogous prior memory technology may be the original square loop ferrite magnetic core memories. In these early core memories many millions of interrogations of one memory location had the potential of causing a single magnetized core having a weak hysteresis to fail to provide a sense signal adequate for detection of its magnetic condition, meaning the binary data bit stored. The affected bit was "dropped", or "lost". Even more relevantly, unaddressed and/or unwritten cores, commonly in physically proximate positions, may sometimes inadvertently and erroneously change hysteresis states causing attendant loss of data. The affected bit "changed".

A three-dimensional optical memory is analogous. The radiation that is used to read and write selective domains of the memory can, if great care is not employed, end up, after millions or billions of cumulative cycles, changing domains other than those domains that are desired to be changed. Such an undesired change of domains degrades the integrity of the data stored within the memory. The sensitivity of optical memories to degradation may be appreciated when it is understood that a single information may at present be stored within only a few hundred molecules (which photochromic molecules are likely within an inert matrix of many thousands more molecules per bit). Ultimately, a single bit of information would desirably be stored on a single molecule, although such a single molecule must, due to a diffraction limited spot size, be selectively addressed by some other means than the directed focusing of radiation—or at least radiation of the wavelength of light.

Accordingly, the present invention concerns not only addressed reading and writing and erasing a volume optical memories, and so doing at impressive levels of performance, but doing so by design, at a high figure of merit. A "high figure of merit" means that an optical memory constructed in accordance with the present invention is practically and reliably useful in the real world, reliably storing and reading any and all data patterns with absolute integrity during indefinitely long periods of any pattern of use, or non-use, whatsoever. Consider that three-dimensional optical memories, storing information in a volume that is little more than a cube of plastic, are intrinsically physically amorphous and homogenous. It is prudent to use some care, and forethought, in the manner of radiative reading and writing of such a volume so that those changes that are selectively induced within selected domains of the volume should be absolutely stable and independent. Nothing should be done, or repetitively done, on any selected domains that adversely affects the integrity of non-selected domains.

An color optical memory of any dimension in accordance with the present invention will so function.

Moreover, the present invention will be seen to transcend, in a broad and substantial way, the previous barrier that a molecule or a group of molecules must be radiatively addressed—as an addressable domain—by bringing appropriate radiation beam or beams, pulse or pulses, to bear—both spatially and temporally—on only a selectively addressed molecule or group of molecules. The present invention will be seen, in fact, to temporally produce the exact same radiation conditions at the spatial locations of many individual photochromic molecules, or groups of photochromic molecules—containing many correspondingly discrete bits of information—at one and the same time. The addressable domains are this "extended" for containing more information than may be, by only spatial and temporal selection, addressed or isolated. However, in accordance with the present invention, (i) multiple individual photochromic molecules, or groups of photochromic molecules, that are different one to the next and that are co-located in the same spatially and temporally addressable domains, (ii) will nonetheless be seen to be selectively individually addressable. In other words, the addressing of different photochromic molecules, or groups of molecules, well next be seen to transcend diffraction limits, and yes, for the first time, it will be theoretically possible to manipulate a single molecule that is densely packed in a three-dimensional with trillions of its siblings and cousins, and even to detect a single photon that is representative of a binary state of this molecule. Accessible information storage at the molecular level is at present performed only by biological systems.

SUMMARY OF THE INVENTION

The present invention contemplates either a three- or four-dimensional radiation memory that serves to store multiple binary bits of information—typically about five to ten and more typically eight such bits—in the same physical volumes of each of a great multiplicity of addressable domains—typically about $10^6$ such domains per $cm^2$ in each of potentially multiple layers within the entire volume of a planar disc, or, more importantly, from $10^{12}$ to $10^{15}$ such domains per $cm^6$ in a random-access volume radiation memory. The storage of multiple information bits within the same addressable domains is enabled by the co-location of several different photochromic chemicals in the volume of each such domain.

(For an explanation of what precisely is meant by a "four-dimensional, or "4-D", volume memory, see the aforementioned co-pending U.S. Patent Application, and/or section 2.2.3 of the BACKGROUND OF THE INVENTION SECTION of this specification. Basically, a 4-D memory is a 3-D memory that is addressed by the use of time, as well as space, as a managed dimension of the addressing process.)

Each of the multiple information bits within each domain is capable of being selectively written (and may optionally be selectively erased) in a process of two-photon ("2-P") absorption induced by a pair of radiation beams, or pulses. Each pair of these write radiation beams, or pulses, is uniquely associated, a particular photochromic chemical of the several such that are within each addressable domain. Each pair of write radiation beams, or pulses, possesses an appropriate combined frequency and energy (i.e., a "color") suitable to cause only one particular photochromic chemical to change. Accordingly, a single type of photochromic chemical, and a bit, of only one "color" is written at one time. (In certain particular combinations of photochromic chemicals, and of writing radiation beam pairs, it is theoretically possible to write a limited small number of different bits—typically only two or so such different bits—at the same time. However, it is not preferred that the "color" radiation memories of the present invention should be so used.)

All the multiple information bits stored within each domain are typically read (and are normally erased) in common and at the same time by the simple expedient of radiatively inducing all the different photochromic chemicals that are in an addressed domain to simultaneously fluoresce. This inducing of fluorescence is again by process of two-photon ("2-P") absorption, as is now resultant from a single pair of read radiation beams, or pulses, having an appropriate frequency, and corresponding combined energy, that are suitable to read all the bits that are stored in and by all the several different photochromic chemicals that are co-located within the volume of the addressed domain.

The fluorescence of each of the different photochromic chemicals upon reading—which fluorescence is selective in accordance with the written state of each such photochromic chemical—is separated from, and is separately detected from, the fluorescence of all other photochromic chemicals. This is possible because the fluorescent light emission of each photochromic chemical is of a different color, and is spatially steered to an associated detector array by a color-sensitive beamsplitting mechanism as elementary as a simple prism.

(Again, it is theoretically possible to radiatively read some one or ones of the multiple photochromic chemicals, and the information bits stored thereby, more pronouncedly, and even in isolation, from the radiative reading of other photochromic chemicals storing other bits. In certain configurations of a color memory apparatus of the present invention such as, for example, an optical disc sweeping under multiple read stations each of which uses an appropriately "colored" read beam, a selective reading of individual "colors" is indeed contemplated. However, it is generally not preferred that a "color" radiation memory in accordance with the present invention should be so read piecemeal, and only some few "colors" at a time, but rather that all the "colors" of the memory should be read simultaneously.)

The read radiation beams of each color fluorescent light are preferably steered to a dedicated detector, normally an inexpensive Charge Coupled Device (CCD) detector array. (At the cost of a slower reading speed, it is possible to move a single detector into successive positions such as permits each color to be successively read,. It is even possible to forego splitting the multi-colored fluorescent light beam at all, and to simply rotate filters transmitting various colors (with attenuation) in a beam line on the way to a single detector or detector array. Generally, however, both monochromators, particularly prisms, and CCDs being inexpensive circa 1995, it is preferred to detect, as well as to read out, all the several colors of the color radiation/optical memory in parallel.)

Exemplary fluorescent photochromic chemicals suitable for simultaneous use in a color radiation/optical memory in accordance with the present invention include spirobenzopyran, rhodamine, cumarin and anthracene. Suitable groups of photochromic chemicals are desirably selected from individual species of photochromic chemicals exhibiting (i) narrow, sharp, separate spectra of absorption and emission that are (ii) suitably distinct from each other, where (iii) no fluorescent emission energy of any species overlaps the absorption energy of any other species.

According that a radiation/optical memory of the present invention is written and read with radiation of different frequencies, or colors, by a process of two-photon absorption, and that it produces fluorescent radiation of different frequencies, or colors, it is called a "two-photon color radiation/optical memory". The color radiation/optical memory operates to permissively store several, typically five to ten, bits of information in each domain of its entire volume. It does so by virtue of containing several different, but interrelated, photochromic chemicals dispersed and co-located throughout its entire volume, normally as a continuum. The addressable domains within the volume are not differentiated physically, but are defined by the two-photon addressing process as explained in the related predecessor patent applications.

2. Advantages of a Color Radiation Memory

The 2-P color radiation/optical memories of the present invention are improved over previous 2-P radiation/optical memories (i) for storing more information in the same volume (i.e., for exhibiting increased storage density), and (ii) for radiatively reading more information per unit time (i.e., for exhibiting an increased data readout rate). The magnitude of the improvement is roughly in accordance with the number of different photochromic chemicals that are present, and the corresponding number of bits that are stored, per addressable domain. The improvement is typically on the order of times five to times ten (×5 to ×10).

Moreover, any or all of the multiple bits stored in each domain of a 2-P color radiation memory are susceptible of being written, or read, or erased along radiation paths that are—save for such two-dimensional (2-D) spatial encoders of the beam(s) wavefront(s) as are used in writing, and such 2-D detector arrays as are used in reading—substantially coincident from one path to the next. Accordingly, a good deal of the structure, and the cost, of 2-P color radiation/optical memory—which memory must function so as to direct radiation, typically laser light, beams to selected temporal and spatial coincidence at selectively addressed domains within its three-dimensional volume—is normally in common for at least the writing, and optionally also for the reading, of all the several binary bits that are stored in each domain. Accordingly, the complexity and cost of the memory does not increase in proportion to its increased density and readout performance.

3. Preferred Embodiments of a Color Radiation Memory

The present invention is useful of incorporation in substantially planar optical media, potentially optical tape but more typically optical discs. A mere factor of five or ten (×5 to ×10) in (i) information storage density, and also (ii) in information readout speed, is not anticipated to appreciably alter the competitive balance between state-of-the art optical and magnetic media circa 1995. However, it must be realized that the entire annulus of an optical disc may be read through a lens to a massively parallel detector array (a CCD, or multiple CCD arrays in the case of the present invention) as is taught in U.S. Pat. No. 5,285,3438 for a MOTIONLESS PARALLEL READOUT HEAD FOR AN OPTICAL DISC RECORDED WITH ARRAYED ONE-DIMENSIONAL HOLOGRAMS—producing gigabyte data transfer rates from hundred dollar level components.

Optical discs may well be "dragging a lot of baggage", and may be somewhat impacted in their deployment, circa 1995 because many persons who clearly understand the operating principles and well-established uses of the Edison gramophone phonorecord, the magnetic disc, and the CD-ROM have mentally consigned all discs—including optical discs—to the class of single-head serial-access devices having an irreducible latency in data access. Resultant to such mental classification, certain persons have virtually ceased all creative thinking about optical discs not directed to making them reliably re-writable. It is suggested that any implementation of a radiation memory in the form of an optical disc should be considered as a method of bringing the (rotating) radiation-sensitive medium spatially into position relative to a laser light, and spatially into position for its light output(s) to be detected, as opposed to the complimentary method—mandated for a stationary 3-D optical memory medium—of bringing the laser light (by light steering, which is difficult) into spatial position onto the medium. Once this mode of thinking is adopted, it becomes increasingly clear that an optical disc can assume some of the advantages of a full 3-D or 4-D volume radiation/optical memory.

In general, however, the present invention comes into its full glory in 3-D and 4-D volume radiation memories as are taught in the related patent applications. The ultimate preferred implementation of the color radiation memory of the present invention is as a 2-P 4-D color radiation memory, meaning a memory as taught in the third related patent application where the addressing of the domains within a 3-D volume of photoactive media is by control of the relative timing, meaning the phase relationship, of two spatially-intersecting radiation pulses, and does not transpire solely by any steering of these intersecting pulses. The radiation pulses are typically laser light pulses.

In accordance with the fact that (i) laser light may be readily turned on and off quickly so as to be impressed with binary information, and (ii) the two pulses of laser light temporally and spatially intersect within a diffraction-spot-size-limited domain of minuscule size during but an very short time interval (that is properly a complex function of the overlapping waveforms of the two beams), very small domains, typically on the order of $5 \times 10^{10}$ such domains per $cm^3$ (see FIG. 8b and accompanying text) within the 2-P 4-D color radiation memory may be reliably and accurately addressed very quickly. (However, in accordance that the intersection "dwell" time of the intersecting laser light pulses at each domain is very short, and in accordance with the quantum mechanical equations of two-photon absorption, each laser beam must normally be quite bright for the photochromic chemicals of interest.) Nonetheless that each addressable domain is already quite small, it will, in accordance with the principles of present invention, contain a plurality of photochromic chemicals each of which stores an associated binary data bit. Among all the plural bits that are stored in each addressable domain, each bit is normally written at a separate time. This is accomplished by two radiation—normally laser light beams—that are of an energy suitable to change the state—normally the isomeric molecular form—of a selected one of the plural photochromic chemicals while not appreciably altering any of the other, un-selected, photochromic chemicals—even at the intersection domains.

However, reading functions oppositely. Any or all of the plural bits stored in each domain are susceptible of being read at the same time. Reading of information is by detection of (two-photon-induced) fluorescence, which is at a characteristic color for each of the different photochromic chemicals. Each read fluorescent radiation emission of a different color that exits the memory is steered, preferably by a simple diffraction grating, to a corresponding detector array.

The simultaneous readout of the 2-P 4-D color optical memory (and of a 2-P 3-D color optical memory) is particularly useful for three-dimensional (3-D) color television. If the information stored in the memory is of the three, or four, color separates of a color image, and if the color fluorescence of the readouts are related in frequency (i.e., in color) to the information stored, then all the read fluorescent radiation emissions of different colors may be viewed directly, or indirectly through color filters, by the eye as a color image. Reading of successive bit planes within the memory presents successive images to the eye in the manner of television. The presentation speed of the images easily exceeds the flicker fusion frequency (70 Hz) of the human eye. A 2-P 3-D, or 4-D, color radiation memory in accordance with the present invention therefore not only serves to store multiple bits of information in the same addressable physical domains, but is capable of supporting the temporally simultaneous, parallel, reading of all the information stored in these domains.

4. Salient Characteristics of the Color Radiation Memory

Accordingly, the present invention may be characterized by its embodiment as a radiation memory apparatus for storing binary information by radiation. This embodiment includes a matrix of a radiation-transparent stable material.

A number of different photoactive media, or photochromic chemicals, are contained and distributed all together inside, and as a continuum within, the matrix. Each individual medium transitions from a first to a second stable form in response to receipt of radiation falling within a transition energy spectrum. The transition energy spectrum of each medium unsubstantially overlaps the corresponding transition energy of any other ones of the media.

A first source of radiation first-radiates with a first beam of first-selected-energy radiation at least a selected portion of the matrix, and all the plurality of photoactive media contained within this portion. This first-radiating excites some one or ones, including at least a selected one, of the plurality of photoactive media that are contained within this portion. The excitation changes each susceptible medium from a first state to a new virtual state.

A second source of radiation second-radiates with at least one second beam of second-selected-energy radiation at least a selected part of the selected portion of the matrix, and of the plurality of photoactive media contained within this selected part. This second-radiating is simultaneous with the first-radiating in order to change the selected one, only, of all the plurality of photoactive media that are within this selected part of this selected portion from its virtual state to its second stable state by process of plural-photon absorption.

Notably, the combined energies of the first-selected-energy radiation and the second-selected-energy radiation jointly fall within the transition energy spectrum of the selected one of the plurality of photoactive media. Moreover, these combined energies of the first-selected-energy radiation and the second-selected-energy radiation jointly cause the selected part of the selected portion of the selected one of the plurality of photoactive media to change from its first to its second stable form by process of plural-photon absorption.

Notably however, the combined energies of the first-selected-energy radiation and of the second-selected-energy radiation—although sometimes jointly exceeding a transition energy of one or more of un-selected ones of the plurality of photoactive media—are substantially ineffectual to jointly cause any change in these un-selected ones. This is because there is an insubstantial overlap of the transition energy spectra of these un-selected ones of the plurality of photoactive media with the transition energy spectrum of the selected one of the plurality of photoactive media!

According to this operation but one single photoactive medium out of all the plurality of photoactive media that are all contained and distributed together in the matrix as a continuum will be written.

This preferred embodiment of a radiation memory apparatus for storing binary information may be a substantially planar volume (e.g., a tape, or a card, or a disc) or a three-dimensional volume (e.g, a cube).

The preferred apparatus is, for use as a memory, further capable of radiatively reading—as stored binary-stated information—the changed state of the selected part of the selected portion of the selected one of the plurality of photosensitive media.

The preferred apparatus for so doing includes a first read radiation source for third-radiating with a third beam of third-selected-energy radiation at least a selected portion of the matrix, and all the plurality of photoactive media contained within this portion. Similarly to the first-radiating (during a write operation), this third-radiating excites some one or ones, including at least a selected one, of the plurality of photoactive media that are contained within this portion, each from a first state to a new virtual state.

Simultaneously, a second read radiation source fourth-radiates with at least one fourth beam of fourth-selected-energy radiation at least a selected part of the selected portion of the matrix, and of the plurality of photoactive media that are contained within this selected part.

Notably, the simultaneous third- and fourth-radiating will cause all the plurality of photoactive media that are within this selected part of this selected portion to fluoresce by process of plural-photon absorption. Each will, however, do so only at an individually associated frequency, meaning in an individually associated colored light.

A monochromator in the form of a prism, a diffraction grating, or a like frequency-sensitive light steering device serves to spatially separate the color fluorescence as arises at all the plurality of photoactive media (that are within the selected part of the selected portion). This separating is in response to the colors of the colored-light readout beams.

A number of detectors, normally so many as there are colored-light readout: beams, detect as binary-stated information the changed states of the selected one, and all other ones, of the plurality of photosensitive media that are within the selected part of the selected portion.

Accordingly, all the binary-stated information that is stored within all the changed states of all the plurality of photosensitive media that are within the selected part of the selected portion is radiatively read at the same time. Nonetheless to being so collectively read, the binary-stated information as is uniquely associated with the changed state of any individual one of the plurality of photosensitive media is uniquely and unambiguously detected.

These and other aspects and attributes of the present invention will become increasingly clear upon reference to the following drawings and accompanying specification text.

BRIEF DESCRIPTION OF THE DRAWINGS

FIG. 1b is a timing diagram showing a single complete cycle in the time evolution of two counter-propagating pulsed waves with equal pulse widths (PW) and pulse separations (PS) in the embodiment of the 2-P 4-D color radiation/optical memory diagrammed in FIG. 1a.

FIG. 1d is a diagrammatic representation of design considerations in the addressing of a 2-P 4-D color radiation/optical memory using counter-propagating pulses of radiation/light (which counter-propagating pulses are a variant of the orthogonal pulses illustrated in FIG. 1a).

FIGS. 7a and 8b are diagrammatic representations of changes undergone by the molecule upon incidence of radiation respectively suitable to "write" and to "read" the molecule, FIGS. 7c and 7d are representations of the excitation energy levels of the molecule, and FIGS. 7e and 7f are diagrams of the isomeric forms variously assumed by the molecule.

FIG. 8, consisting of FIGS. 8a and 8b, are general diagrammatic representations of the writing and reading of two-photon three-dimensional (2-P 3-D) radiation memories where, respectively, two radiation beams are either (i) orthogonal, or (ii) collinear, in their spatial and temporal intersection so as to define and radiatively address a domain.

FIG. 17b is a table listing the photostability of the written form of 1SP at different temperatures.

FIG. 17c is a table listing the thermal stability of several photochromic molecules in various hosts.

DESCRIPTION OF THE PREFERRED EMBODIMENT

Figure 1A:
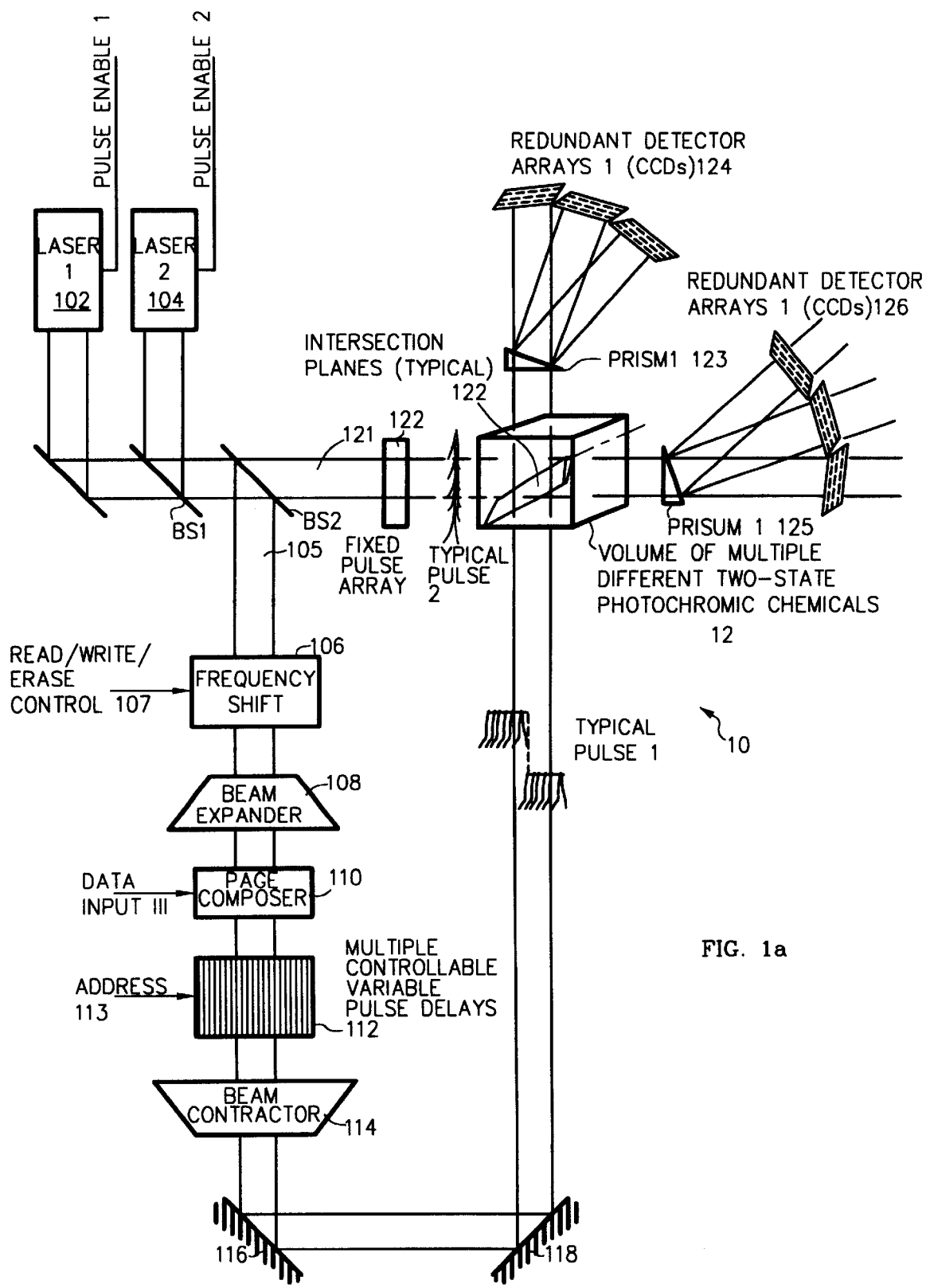
FIG. 1a is a diagrammatic representation of a first preferred embodiment of a four-dimensional (4-D) color radiation/optical memory in accordance with the present invention wherein plural photochromic chemicals within each of a great multiplicity of domains inside a volume are radiatively addressed by use of two radiation pulses, herein orthogonal to each other, having proper frequencies, and combined energy, and being synchronized in time so as to be simultaneously intersecting in selected regions of the medium, so as to interact thereat and therewith by process of two-photon interaction.

1. Theory of Operation of a Color Radiation/ Optical Memory

Certain radiative operations—normally for purposes of writing—that are performed on the dispersed photochromic chemicals of a color radiation/optical memory in accordance with the present invention are commonly selective, meaning that the coincident radiation serves to change only a single chemical at each addressed domain. Certain other radiative operations—normally for purposes of reading or erasing—commonly affect all the different photochromic chemicals at each addressed domain collectively, causing all these photochromic chemicals (i) to fluoresce each at an associated frequency, and/or (ii) to change (normally for the purpose of erasing contained information).

The several different photochromic chemicals that may be both individually selectively, and collectively, manipulated by radiation must be, and are, possessed of quite detailed properties. These properties are more particularly discussed in the following section 7. of this specification. However, and as an expansion on the photochromic chemicals of previous radiation memories, the several related photochromic chemicals must not only be intrinsically suitable for a two-photon radiation memory, but must be capable of being selectively used in concert with each other.

Among other criteria, the different but interrelated photochromic chemicals must have such differing transition energy gaps as permit individual ones thereof to be changed in state—preferably in isomeric molecular form—by two photon absorption while other, remaining, ones of the photochromic chemicals are substantially unaffected. Among other criteria, the different photochromic chemicals must produce fluorescent emissions (as are selectively induced by two photon radiation) that are (i) substantially incapable of altering the information stored in other photochromic chemicals, or even the emitting photochromic chemical itself, while remaining (ii) substantially insensitive to the fluorescent emissions as are produced by any other ones of the photochromic chemicals, or even by itself. Among other criteria, the different photochromic chemicals must have such differing frequencies of fluorescent emissions (as is selectively induced by two photon absorption) as permits the discrimination, and the detection, of the separate fluorescent emissions from each.

One group of fluorescent photochromic chemicals that collectively meet these criteria are: spirobenzopyran, rhodamine, cumarin and anthracene. Spirobenzopyran is the preferred photochromic chemical of Applicant's related predecessor applications. When explanation is hereinafter made as to the manipulation, properties, and response of spirobenzopyran in use within a radiation/optical memory, or a color radiation/optical memory, then the same discussion will apply, mutatis mutandis, to the other fluorescent photochromic chemicals.

The principles of the present invention are, in any case, explicable without undue proliferation of the numbers if different photochromic chemicals involved. See section 9 of this specification regarding another suitable group of photochromic chemicals where each individual photochromic chemical has a narrow, sharp, separate spectra of absorption and emission suitably distinct from all other photochromic chemicals of the group, and where no fluorescent emission energy of any of the photochromic chemicals overlaps the absorption energy of any of others of the photochromic chemicals.

2. A First Preferred Embodiment of the Color Radiation Memory as a Fast, Dense, High Capacity 2-P 4-D Random Access Optical Memory Optical storage materials are attractive for memory technology due to their high packing densities, thus making it possible to build memories with large density and capacity. However, the success in constructing such memories strongly depends on being able to efficiently utilize the available volume of the storage media.

In the related U.S. patent application Ser. No. AAA,AAA filed on May 31, 1995, which application is itself a continuation of a U.S. patent application Ser. No. 163,907 filed on Dec. 6, 1993, for a TWO-PHOTON FOUR-DIMENSIONAL OPTICAL MEMORY, a new data accessing method for 3-D volume optical memories is described. This approach is believed to be especially well suited to two-photon three-dimensional (2-P 3-D) optical memories as are described, inter alia, by S. Hunter, F. Kiamilev, S. Esener, D. A. Parthenopoulos, and P. M. Rentzepis in "Potentials of two-photon based 3-D optical memories for high performance computers," *Applied Optics* 29, 2058–2066 (1990). The new data accessing method may alternatively be applied to other 3-D memories. It may, for example, be applied to 3-D memories based on photo refractive crystals such as are described, inter alia, by J. E. Weaver and T. K. Gaylord, "Evaluation Experiments on Holographic Storage of Binary Data in Electro-Optic Crystals," *Opt. Eng.* 20, 404–411 (1981). It may, for example, be applied to 3-D memories based on photon echo. See L. d'Autria, J. P. Huignard, C. Slezak, and E. Spitz, "Experimental Holographic Read-Write Memory Using 3-D Storage," *Appl. Opt.* 13, 808–818 (1974).

The existing addressing scheme for two-photon 3-D memory requires that an addressing beam (e.g. from a CW laser) be focused into the volume of the memory material in such a way that only a single layer of the memory is illuminated. Simultaneously, a second beam, carrying the data, is directed in an orthogonal direction so that the intersection of these two beams is contained within a single memory layer. See S. Hunter, et al., op cit.

Although a scheme where two laser light beams propagate and selectively overlap seems elegant, several problems have been identified with this volume addressing method. First, the addressing beam tends to be inadequately confined to, and throughout, but a single layer. Second, the ability to control the intensities of the beams so that uniform two-photon absorption occurs across t:e entire addressed layer of the memory is limited.

In response to these limitations, the related invention and co-pending patent application introduced the use of two (or more) pulsed optical beams as a means to control the interaction region throughout the volume material. These pulses can share the same optical axis and will still only overlap (i.e. collide) at particular selected locations. This introduction of time as a dimension of radiatively addressing a 3-D volume optical memory store overcomes the problems associated with the former addressing scheme that was dependent purely upon spatial manipulations of the addressing radiation.

A radiation/optical memory so using time as a dimension of its operation is called a four-dimensional (4-D) radiation/optical memory. It is fully compatible with the color scheme of the present invention and is, indeed, the preferred, and most powerful, embodiment of a color radiation memory.

A schematic of first embodiment 10 of a 2-P 4-D color radiation memory in accordance with the present invention is shown in FIG. 1*a*. One or more lasers, herein a LASER 1 102 and a LASER 2 104 each produces radiation pulses of an appropriate energy. Each LASER 102, 104 may typically be a Nd:Yag diode pumped solid state laser. It is sometimes possible to use only one laser in combination with a frequency doubler. The LASERS 102, 104 are used, in conjunction with the FREQUENCY shift 196, produce, at separate times, the appropriate frequency radiation pulses as are used for both (i) reading and (ii) writing (iii) all the different species of photochromic chemicals that are within the VOLUME OF MULTIPLE DIFFERENT TWO-STATE PHOTOCHROMIC CHEMICALS 120. Accordingly, at various times and from time to time many different frequencies are produced.

Continuing in FIG. 1a, the light radiation pulses are directed by mirror M1, and are split in beamsplitters BS1 and BS2, for distribution along each of two paths. One of the two light pulses 105 optionally undergoes a frequency shift in FREQUENCY SHIFT 106 in response to READ/WRITE/ERASE CONTROL 107 in accordance (i) whether the current operation is reading, writing or erasing, and (ii) what particular species of photochromic chemical is being manipulated. The FREQUENCY SHIFT 106 may be typically either an electro-optic or acousto-optic device.

During reading, typically the same light pulse 105 that is shifted (although the other pulse may alternatively be encoded) is also spatially encoded in its two-dimensional wavefront in the PAGE COMPOSER 110. The PAGE COMPOSER 130 may be, as is taught within the related companion patent applications, an array of spatial light modulators. Such a spatial light modulator, or SLM, should desirably perform electronic-optical conversions at high speed so that the access times to the 2-P 4-D optical memory can be made as short as possible. (A high-speed optical-electronic conversion is typically carried out by use of a sensitive optical detector array, and is not as troublesome nor, typically, as time consuming, as is the input of optical data to be written to the 2-P 4-D radiation memory.) The electronic-optical conversion at the input is preferably implemented by a type of SLM called an electronically addressed spatial light modulator, or E-A SLM. The input array must be able to channel enough radiation energy to write (by two-photon absorption) each of the selected domains. For future optoelectronic computers, the input and output arrays will be optically-addressed SLMs. For the present, the 2-P 4-D radiation memory—which commonly interfaces to an electronic computer—uses a E-A SLM that is preferably a sensitivity-enhanced silicon-PLZT SLM ,Si/PLZT) as is taught by S. H. Lee, S. Esener, M. Title, and T. Drabik in the article "Two-Dimensional Si/PLZT Spatial Light Modulator Design Considerations and Technology" appearing in Optical Engineering 25, 250 (1986). Equivalent SLMs, such as those available from Hughes Aircraft Company, may alternatively be used.

Typically the same light pulse 105 that is spatially encoded in its two-dimensional wavefront in the PAGE COMPOSER 110 is also selectively temporally delayed in the regions of the same wavefront in the MULTIPLE CONTROLLABLE VARIABLE PULSE DELAYS 112. Each of the MULTIPLE CONTROLLABLE VARIABLE PULSE DELAYS 112 is typically either an electro-optic or acousto-optic device.

In accordance with the principles of optics, the light pulse 105 is normally expanded before so encoding with DATA INPUT, and before selectively delaying in accordance with ADDRESS 113, in a BEAM EXPANDER 108. After the light pulse 105 is (i) spatially encoded, and (ii) selectively delayed, in the regions of it's two-dimensional wavefront it is again typically scaled, again in accordance with the principles of optics, by a BEAM CONTRACTOR 114 so that it may be of appropriate size to the VOLUME OF MULTIPLE DIFFERENT TWO-STATE PHOTOCHROMIC CHEMICALS 120. The spatially-encoded and spatially-selectively-delayed light pulse 105 is steered by mirrors 116, 118 as prove necessary to impinge upon the VOLUME OF MULTIPLE DIFFERENT TWO-STATE PHOTOCHROMIC CHEMICALS 120. The selectively delayed condition of the wavefront of the light pulse 105 on its way to the VOLUME OF MULTIPLE DIFFERENT TWO-STATE PHOTOCHROMIC CHEMICALS 120 is illustrated as, for example, the TYPICAL PULSE 1.

Likewise, the other light pulse 121 normally delayed in a FIXED PULSE DELAY 122 in order that it may be properly coincident with the light pulse 105 within the VOLUME OF MULTIPLE DIFFERENT TWO-STATE PHOTOCHROMIC CHEMICALS 120. The delayed condition of the wavefront of the light pulse 105 on its way to the VOLUME OF MULTIPLE DIFFERENT TWO-STATE PHOTOCHROMIC CHEMICALS 120 is illustrated as, for example, the TYPICAL PULSE 2.

The TYPICAL PULSE 1 and the TYPICAL PULSE 2 are spatially and temporally coincident at intersection regions within the VOLUME OF MULTIPLE DIFFERENT TWO-STATE PHOTOCHROMIC CHEMICALS 120. These intersection regions may form, for example, the INTERSECTION PLANES (TYPICAL) 122. The interaction of each, and ov both, pulses with the photochromic medium at these intersection regions is by process of two-photon interaction, and is governed by quantum mechanics.

The TYPICAL PULSE 1 as interacted with the intersection regions is spread in accordance with its frequency in a monochromator 1, typically a PRISM 1 123. As spectrally spread it impinges, scaled if necessary by the use of lenses (not shown), upon the REDUNDANT DETECTOR ARRAYS 1 124, or Charge Coupled Device CCD 1. Likewise, the TYPICAL PULSE 2 interacted with the same regions is spread by PRISM 2 125 and impinges, again scaled if necessary by the use of lenses (not shown), upon the REDUNDANT DETECTOR ARRAYS 2 126, or Charge Coupled Device CCD 2. The data pattern that is impressed upon each pulse by and at the intersection domains will be read, and will be identical, at each of the detector arrays. The data developed at the detector arrays may be redundantly compared in order to detect any error, and is normally further transmitted to a computer or the like as DIGITAL DATA OUT 123.

One light pulse may intersect the light pulse at other than 180°. The light pulses may in particular be counter-propagating (not shown in detail, conceptually illustrated in FIG. 8b and taught in the companion patent application). In this case regions of the wavefront of one pulse are variably time delayed relative to each other, and relative to the other light pulse.

Figure 1B:
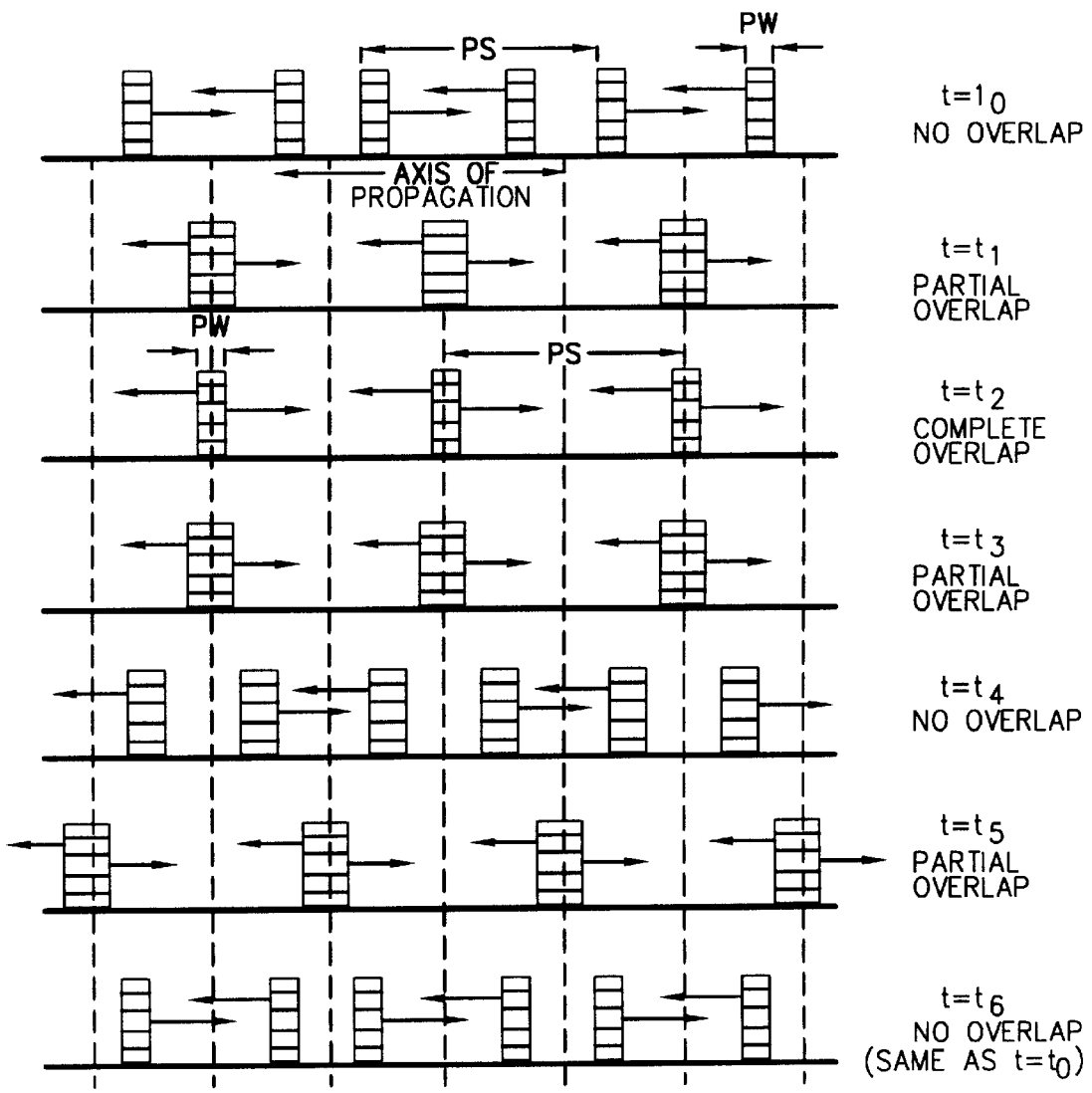
Figure 1C:
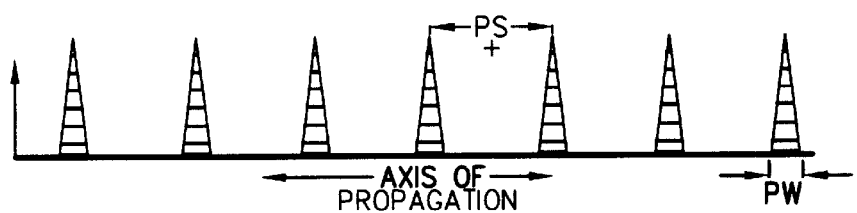
FIG. 1c is a timing diagram of the average of many cycles previously shown in FIG. 1b where the individual cycles are offset b} one half of the distance between pulses, the averaging showing that the pulses' energy :Ls concentrated at particular spatial locations along the propagation axis with a spacing of one half of the optical beam pulse separation (PS).

A complete cycle in the time evolution of two counter-propagating pulsed waves with equal pulse widths (PW) and pulse separations (PS) is shown in FIG. 1b. At the initial time ($t^0$), there is no overlap between the 2 sets of pulses. As the time is increased, the pulses move towards each other and begin to overlap. These collision regions increase in width until the beams are completely overlapped, then decrease in size as the pulses move apart. Due to the fact that the pulse trains are moving with respect to the fixed reference frame of the propagation axis, the pulses will overlap a second time before returning to the initial state. These second regions of overlap are identical to those previously described, except that they are offset by one half of the distance between pulses. The average of such overlap is shown in FIG. 1c. After time averaging over a large number of these pulse overlap cycles, it is seen that the energy is concentrated at particular spatial locations along the propagation axis with a spacing of one half of the optical beam pulse separation (PS).

In order to use this phenomenon of pulse collision, the pulse width and pulse separation must be designed such that only a single memory layer is; illuminated. The addressing system is shown schematically in FIG. 1d. In particular, the design considerations in the addressing of a 2-P 4-D color radiation/optical memory using counter-propagating pulses of radiation/light are shown. Such counter-propagating pulses are a variant of the orthogonal pulses illustrated in FIG. 1a.

The necessary conditions are: (1) the pulse (inside of the material) is less than the layer thickness, and (2) the pulse separation (inside of the material) is greater than twice the longitudinal dimension of the volume storage medium. The first condition makes it such that only the width of the single layer is illuminated. The second condition separates the overlapping regions so that only one will occur inside of the memory material. An example is computed for the case of a memory layer thickness=L=100 um, a longitudinal memory dimension=D=1 cm and en index of refraction=n=1.5. Such a system requires that the laser pulses have a pulse width≦150 um and pulse separation≧3 cm. This translates to a 0.5 picosecond pulse at a maximum repetition rate of 10 GHz. Thus this 4-D data accessing method applied to 3-D volume storage media enables a high speed selection of any one of the memory layers by introducing a variable optical delay into one of the beams. This makes it such that the pulses collide with the same pattern, yet are offset along the optical propagation axis.

Figure 2:
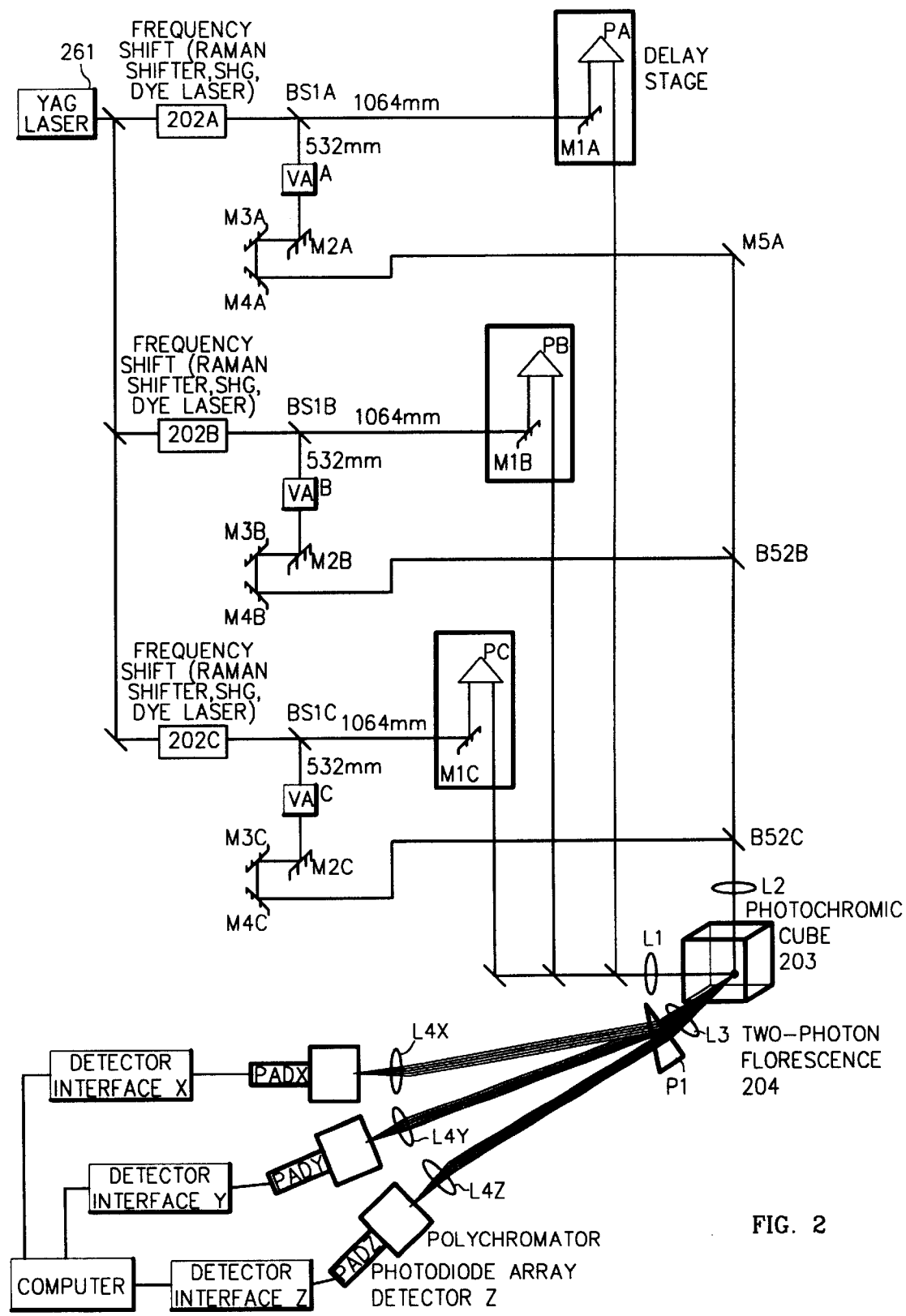
FIG. 2 is a diagrammatic representation particularly showing the (i) development of pairs of radiation beams, or pulses, of multiple different frequencies, or colors, as respectively correspond to multiple different photochromic chemicals located within a cubical volume, and (ii) the detection of multiple different colors of fluorescent light, in either a 2-P 3-D, or 4-D, color radiation/optical memory in accordance with the present invention.

3. Exemplary Development of the Radiation/Light Beams/Pulses In Any Embodiment of the Invention as a Two-Photon Three-Dimensional, or Four-Dimensional, Color Optical Memory A diagrammatic representation particularly of the (i) development of pairs of radiation beams, or pulses, of multiple different frequencies, or colors, as respectively correspond to multiple different photochromic chemicals located within a cubical volume, and (ii) the detection of multiple different colors of fluorescent light, in a color radiation/optical memory in accordance with the present invention, is generally illustrated in FIG. 2. The manner of addressing of the domains of the cubical volume for two-photon absorption is omitted the drawing for the sake of clarity.

Here the source of the radiation light beams, or pulses, of all necessary different frequencies is but a single YAG LASER 201. It's laser light output, as variously channeled by mirrors and beamsplitters is frequency shifted in FREQUENCY SHIFTERs 202a–202c, each of which is typically a Raman Shifter, a SHG, or a Dye Laser. The preferred frequencies for manipulation of the spirobenzopyran photochromic chemical (only) that is within the PHOTOCHROMIC CUBE 203 are illustrated, by way of example, as the wavelengths 1064 nm and 532 nm on the beam line proceeding from FREQUENCY SHIFTER 202a. The beams proceeding down all lines are gated as desired and required, and are appropriately delayed so that selected ones thereof—a best suits the particular photochromic chemical to be either written or read—will reach spatial and temporal coincidence in and at a selected region—an addressed domain—of the PHOTOCHROMIC CUBE 203.

Particularly during reading, the TWO-PHOTON FLUORESCENCE 204 of multiple colors is imaged by lens L3, PRISM P1, and lenses L4X, L4Y and L4Z onto PHOTODIODE ARRAY DETECTORs PAD X, PAD Y AND PAD Z. The suffixes "X", "Y" and "Z" are used in lieu of "A", "B" or "C" because it should be clear that neither the numbers, nor the relationships, of the separate read-out beam lines, and PHOTODIODE ARRAY DETECTORs, is in one-to-one correspondence with the writing and read interrogation beam lines. There are generally many more photochromic chemicals, and associated detectors, than are the numbers of different beam lines that can be variously shifter and/or combined for production of all appropriate frequencies.

The detections at each PHOTODIODE ARRAY DETECTORs PAD X, PAD Y AND PAD Z are transformed in an associated DETECTOR INTERFACE, and commonly transmitted to a COMPUTER.

4. An Alternative Embodiment of the 2-P 3-D or 4-D Color Radiation Memory as a Fast, Dense, High Capacity Sequential Access Optical Disc The simultaneous reading of multiple bits of information from the same domains is useful beyond its normal benefit of magnifying the amount of information readable from the memory per unit time. The speed at which the memory can be interrogated for reading—which is primarily a function of the fluorescence times of the preferred photochromic materials next discussed—is normally very fast—typically about 5 nanoseconds. However, the reading speed is, needless to say, not infinitely fast.

In order to realize a read rate—typically $10^9$ bits per second and higher—that is superior to the fastest semiconductor memories (circa 1995), a 2-P 3-D or 4-D color radiation memory of the preferred cubic geometric form must depend in part on the massive parallelism that is inherent in reading a "bit plane" of typically some $10^6$ bits each (5 nanosecond) read cycle, and not exclusively upon that parallelism that is provided between bits, and between bit planes, by the storage of information as different "colors"—which different colors typically increase the information retrieval rate (circa 1995) only from five fold to ten fold.

Notably, one presently realizable, simplified, and intermediary form of a 2-P 3-D or 4-D color radiation memory uses, instead of a cube, a 3-D, thick, optical disc containing multiple photochromic chemicals. Instead of exclusively adjusting the spatial phase relationship of the radiation (light) beams in order to bring the beams to selected intersections within the volume, one or both of the light beams, or pulses, may be held a constant spatial and temporal relationship. The volume, in the form of a thick rotating disc, is then moved into the presence of the intersecting light beams.

The light beams need only be modulated on and off as desired and required to write and read information from the rotating disc. Such a "3-D", or thick, disc memory does not avoid the latency, and the seek, times that distinguish any rotating, disc, memory from a true random addressable memory (of which true random addressable memory the present invention is certainly capable). Moreover, and equally troubling, the single dimension of the "plane" of bits that is written to or read from the thick disc—which is really but a "line" of bits—is undesirably considerably foreshortened in its content from the full 3-D volume radiation memory, typically dropping from a bit-width of some $10^3$ bits down to some $10^2$ bits. In simple terms, a radiation memory disc supports only that a "line" should be radiatively written and read across the annulus of a disc, as opposed to writing and reading an entire "plane" of a 3-D volume memory. (In a disc, the bit-width of the other dimension of the "plane" may remain the same or—because the width of the annulus of a disc is typically greater than the one centimeter nominal dimension of the cubic volume memory—actually increase.)

Commercial experience with optical tape suggests that any memory technology, whether sequential or random access, ought to be simultaneously (i) ten times faster and (ii) ten times denser and (iii) ten times cheaper than the technology that it portends to supplant in order to succeed commercially. In order to supplant each of dominant (i) random access semiconductor, and (ii) sequential access magnetic disc, technologies, new optical memory devices would optimally be 10×10×10, or a net of 1000×, better than not only what these competing technologies offer now, but what they will offer when competing optical technologies are first commercially offered.

Despite recent impressive gains in magnetic storage technologies for magnetic disc, a bulk optical medium storing data in diffraction-spot-size-limited optical domains will likely come to surpass being ten times denser and ten times cheaper per bit stored than magnetic disc. The present invention taken alone—at least in a simplistic implementation where 5–10 bits might be read in a single "spot" as opposed to only one bit—only modestly improves the cost effectiveness of optical disc. For these reasons, many investigators have been more than willing to dispense with optical discs and all their limitations altogether, and immediately push on to a full random-addressable volume radiation memory.

However, the application of 3-D and 4-D volume, and color, radiation/optical memory techniques to the medium of optical discs is likely worth investigation. People are used to handling optical disk media. Optical discs mount well and easily, and last a long time. Finally, it has been a great challenge has been to keep the system, or "drive", cost of an radiation/optical system close to, or less than, magnetic disc or CD-ROM while increasing at least the read transfer rate (if not also the less important write transfer rate) by a factor or ten or more. If some of the proven mechanisms and techniques of conventional optical disc, or CD-ROM, could be "hybridized" with 3-D and 4-D volume, and color, radiation/optical memory techniques, then a new, hybrid, system might have merit.

The parallel-simultaneous-readout, color, aspect of the present invention—requiring as it does in disc system no moving parts and only a replication of some relatively inexpensive Charge Coupled Device (CCD) detectors—permits an inexpensive disc to be inexpensively read at a rate typically more than ten times faster than a magnetic disc. Writing remains roughly only as fast as a "state-of-the-art" magnetic disc. This is because (i) the entire volume, and not just the surface of the disc, is used for information storage, and (ii) each addressable domain within such volume stores, in accordance with the present invention, plural bits of information. Finally, the amount of information recorded on the optical disc has the potential to exceed a magnetic disc, especially if the optical disc is thick and voluminous.

Figure 3A:
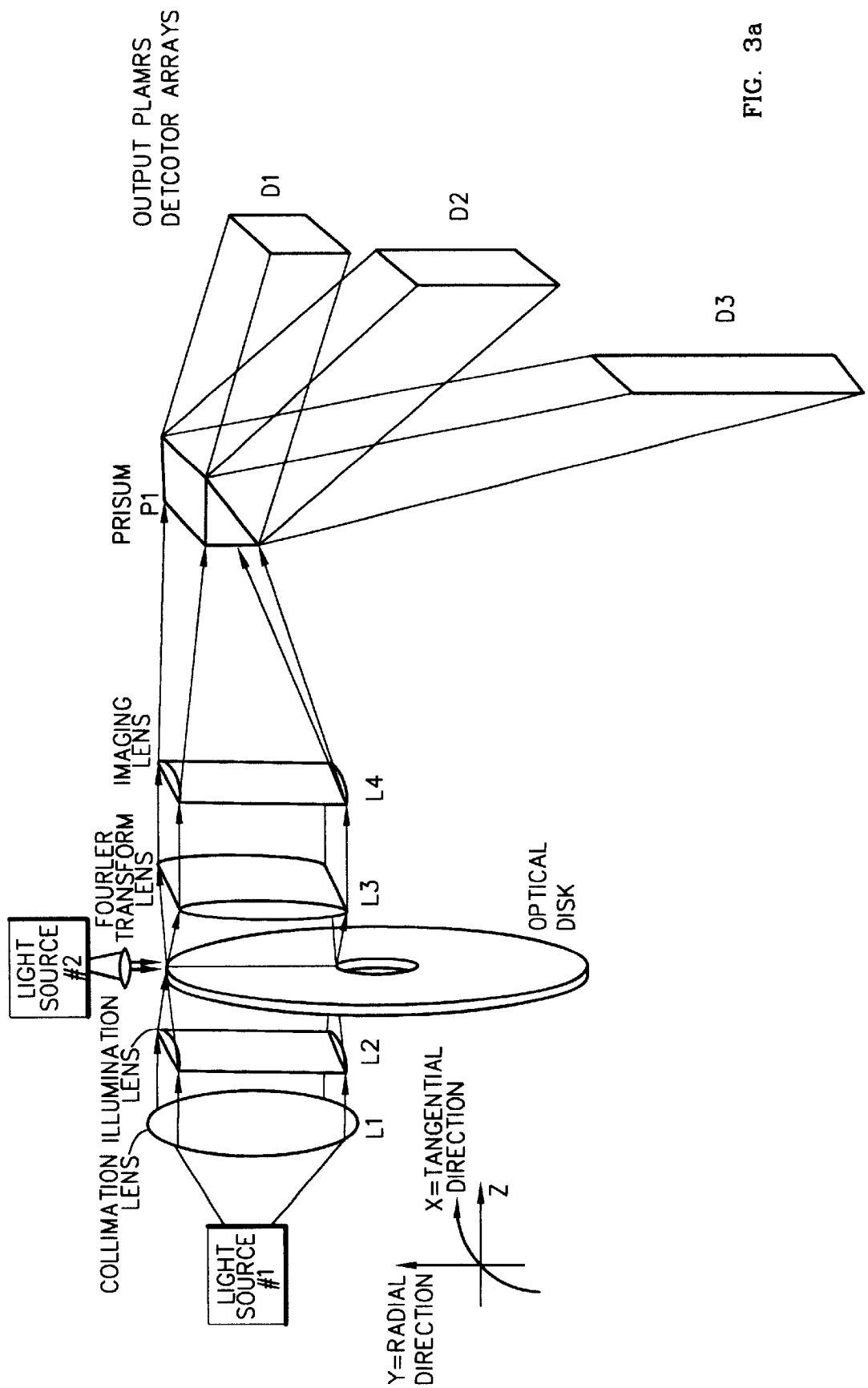
FIG. 3a is a diagrammatic representation of the readout (only) of a second preferred embodiment of a volume color radiation/optical memory in accordance with the present invention herein in the form of a disc recorded with multiple one-dimensional holograms arrayed across the annulus of third disc, and in with different such arrayed holograms in each of multiple colors, so that, upon proper optical Fourier de-convolution of the multi-colored readout beam, and splitting of this beam into separate colors in a prism, the data encoding of the entire annulus of the disc at each of the multiple colors is read in parallel.

4.1. Motionless Parallel Readout of an Optical Disc Color-Encoded With Arrayed One-Dimensional Holograms in Each of Multiple Colors A diagrammatic representation of the readout (only) of a second preferred embodiment of a volume color radiation/optical memory in accordance with the present invention—herein in the form of a disc recorded with multiple one-dimensional holograms arrayed across the annulus of the disc—is shown in FIG. 3a. Different such arrayed holograms are present in each of multiple colors. Upon proper optical Fourier de-convolution of the multi-colored readout beam, and the splitting of this beam into separate colors in a prism, the data encoding of the entire annulus of the disc at each of the multiple colors is read in parallel.

The embodiment of the present invention shown in diagrammatic form in FIG. 3a is an adaptation of the MOTIONLESS PARALLEL READOUT HEAD FOR AN OPTICAL DISC RECORDED WITH ARRAYED ONE-DIMENSIONAL HOLOGRAMS taught in U.S. Pat. No. 5,285,343. The embodiment depicted is limited for the sake of illustration: only the readout is shown; the manner of recording being similar to the embodiments of FIGS. 1 and 2. The entire thickness of the disc is used to support but a single "layer" of recording. This use of but a single layer will later be contrasted with the color optical disc memory of FIG. 3b, which records information in each of multiple layers each of which layers stores information in each of multiple colors.

The embodiment illustrated in FIG. 3a serves during readout to map multiple 1-D data distributions located on a single disk to multiple 2-D image planes at the output. The embodiment shown makes use of a refractive optical system, namely the two orthogonal cylindrical lenses L3 and L4, for parallel readout of the disk. Other optical systems, including a preferred system using a Hybrid refractive/diffractive Optical Lens (HOL), are also possible.

A monochromatic, spatially coherent (laser) light source is collimated by lens L1 and focussed to a nearly radial line on the disk by a slightly rotated cylindrical lens L2. The radial line illuminated by Lens L2 is normally equal in length to the entire radius of the annulus of the disk's active surface. Typically 128 data blocks, or 1-D holograms, are located along this line, and are simultaneously illuminated simultaneously (reference U.S. Pat. No. 5,285,343). Each single set of one-dimensional holograms that is illuminated at one time is sufficient to reconstruct one 2-D image. The several different sets—all overlapping and in the same volume of the disc—that are recorded in the several colors are sufficient to reconstruct multiple 2-D images.

Following the disk in the optical path from the Light source to the Output plane are two orthogonal cylindrical lenses L3, L4. The first lens Fourier transforms the holograms arrayed along the radial (vertical) direction. The second cylindrical lens L4, images, and typically also magnifies, the holograms in the tangential (horizontal) direction onto, ultimately, the output planes. Both the cylindrical lenses L3, L4 have as their focal planes the several output planes. The result of the imaging and transformation produced by both lenses L3, L4 is that the individual Fourier hologram reconstructions appear in the first diffraction order above the axis, imaged side by side. The colored composite image is passed through a monochromotor, normally the prism P1, in order to be split into multiple two-dimensionally encoded wavefronts of light that are received at each of multiple identical detector arrays. Each of the multiple identical 2-D detector arrays is normally identical, and is located in a output plane equidistant from lenses L3, L4 and prism P1—any appearance in FIG. 3a to the contrary being due to perspective of view.

In the preferred parameterization, a full multiple of, typically, 128 1-D holographic data blocks are read simultaneously, permitting reconstruction of binary images of 128×128 pixels on each of multiple output plane.

As the disk spins, successive radial lines of 1-D holograms are illuminated. The result is that the output image on the output plane changes corresponding to the recorded information. Thus, all information stored on the disk can be retrieved in one single rotation of the disk while the "head", or all lenses, remains motionless. Due to the shift-invariance and information redundancy properties of the Fourier transform, there is no need for tracking or focusing mechanisms.

The beam illuminating the disk and its arrayed holograms converges along the tangential direction, end is a plane wave along the radial direction. The preferred width of the area containing the data blocks of one image is 22 µm. A relatively large f-number lens (L1) is used to ensure a small illumination solid angle Therefore, the depth of focus is large (>±10 µm). This Lens L1 is placed out of focus, and at a distance calculated to allow the illuminating beam to be slightly smaller than 22 µm at the disk plane. A wobble of up to 20 µm due to flatness variations of the spinning surface can therefore be tolerated.

In addition, due to the hologram information redundancy, even partially illuminated holograms permit reconstruction of the entire data. For example, a severe loss of as much as 10% of the hologram information induces a reduction of only 3 dB in the reconstruction Signal to Noise Ratio (SNR). Reference K. Kubota, et al., "Holographic disk with high data transfer rate," Appl. Opt. 19, pp 944–951, March, 1980.

For these reasons, no focusing servo is required.

Moreover, no tracking servo is required either. The data on the disk is encoded as 1-D computer generated Fourier holograms. Because Fourier-transform holograms are shift-invariant, the eccentricity (radial motion) of the spinning disk does not affect the reconstruction of the data. Therefore no tracking servo is required.

Because no mechanical motion of the head is required to access any image stored on the disk, the entire contents of the disk can be retrieved in one rotation of the disk. A high data transfer bandwidth can accordingly be achieved. For a preferred nominal disk rotation speed of 2,400 rpm (40 rps), the data retrieval (transfer) rate, or bandwidth, is then 1.1 Gbytes/sec for each color. If eight or so different colors are encoded in a corresponding eight different photochromic chemicals, then the readout data transfer rate is nearly 9 Gbytes/second, which is extremely high.

Alas, the recording in multiple colors does nothing to improve the typical average image, or word, access time of 12.5 msec, nor the maximum retrieval time of 25 msec. Although the information carrying capacity of the disc is raised roughly eight times (×8), the colored recording and readout in accordance with the present invention also provides no panacea for the density versus speed tradeoff that attends recording arrayed 1-D holograms instead of straight binary information. The size/volume of the domains in which the disc will accept recording are still of the order of from $4 \times 10^{11}$ to $8 \times 10^{12}$ per $cm^3$ (see FIG. 8 and accompanying specification text, and multiply by eight times), or an inferior density on the order of $10^4$ bits per $cm^2$ if only a single layer—a monolayer—of the disc is used for recording and for reproducing.

These summary characteristics result in a somewhat awkward, and unbalanced, memory. The reading is astoundingly fast, but transpires during only but one revolution of the disk, or 40 msec., after which period the disc has been "stripped clean" of all its information. The information storage density ms not exceptional. Indeed, density may be considered to have been "traded off" for speed. Finally, the 1-D holograms with which the disk is recorded have to be calculated, normally in a computer performing a Fourier transform on each recorded data block. Although not oppressive, this calculation before recording (not shown in FIG. 3a) is unusual, and therefore of dubious widespread commercial acceptability. On the other hand, both the media and the readout system for a motionless-parallel-readout-head color optical disc color-encoded with arrayed color one-dimensional holograms are inexpensive, as well as remaining rugged and long-lived.

The clear solution to these limitations are to carry forward the concepts of the present invention into multiple layers spanning the full thickness of an optical disk (which disc may, to the diffraction limits of the light radiation that it conducts, be a relatively "thick disc", of, say, 1 cm. thickness). Such a disc system is next seen in FIG. 3b.

Figure 3B:
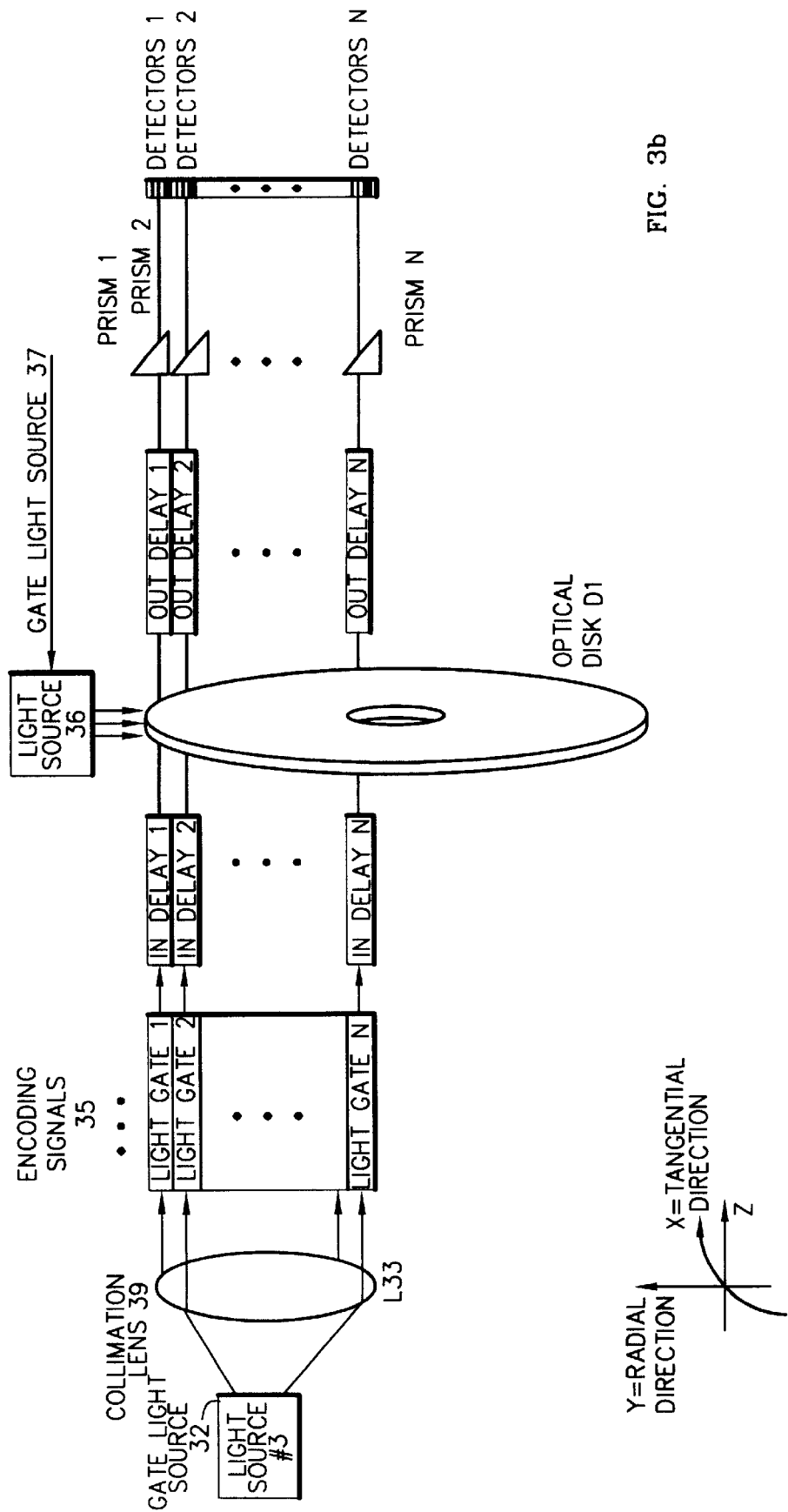
FIG. 3b is a diagrammatic representation showing another variant the second preferred embodiment of a volume color radiation/optical memory in accordance with the present invention in the form of a disc, the disc now being recorded with binary information in each of multiple colors at each of a plurality of layers all at the same time, and disc being susceptible to be read of all the binary-encoded information that is recorded in each of the plural layers in each of the multiple colors in each such layer all at the same time.

4.2. Readout of an Optical Disc Conventionally Binary Encoded in Each of Multiple Colors A diagrammatic representation showing another, second, variant of the second preferred embodiment of a volume color radiation/optical memory in accordance with the present invention in the form of a disc is shown in FIG. 3b. The disc is now recorded with binary information in each of multiple colors at each of a plurality of layers. The binary-encoded information in all the colors in a one of these layers (for each detector) is read all at the same time.

A monochromatic, spatially coherent (laser) light source 31 is gated to produce a pulse by control signal Gate Light Source 32. The emitted laser light is collimated into a line by hybrid lens L33 and directed onto nearby LIGHT GATEs 1 through N. The LIGHT GATEs 1–N may be any means of selectively transmitting light (which may nonetheless act via selective reflectivity, as in some types of SLM) under the control of respective ones of signals ENCODING SIGNALS 35. During a writing operation the ENCODING SIGNALS 35, and the LIGHT GATEs 1–N, spatially encode a line of light. During a reading operation the LIGHT GATEs 1–N ere normally all enabled, and laser light is transmitted everywhere along the line.

The next feature is particularly significant. The arrayed IN DELAY 1 through N respectively receive the gated laser light respectively from the LIGHT GATEs 1–N. These IN DELAYs 1–N are preferably passive elements, and are typically only various lengths of glass in the substantial form factor of a common microscope slide. All such are arranged as a stack of "slides", the stack having the shape of a staircase. By action of the IN DELAYs 1–N each (gated) laser light pulse is delayed from a next adjacent, previous, pulse by about 5–10 nanoseconds, and more commonly about 7 nanoseconds. These delays, and this gradient of successive delays, are, of course, merely the delay that each light pulse has incurred in going through a variable length of glass that has an index of refraction higher than that of air (and a correspondingly lower light propagation speed).

The OPTICAL DISC D1 is illuminated at its radial edge by LIGHT SOURCES 36. These LIGHT SOURCES 36 are commonly collectively enabled by control signal GATE LIGHT SOURCE 37. There are usually so many LIGHT SOURCES 36 as there are layers to be addressed in the OPTICAL DISK D1. Appropriate frequency shifting, or selection of appropriate frequency beams (neither shifting nor selection is explicitly illustrated in FIG. 3b, see FIG. 2) suitable to permit selective writing of multiple photochromic chemicals that are contained within the OPTICAL DISC D1 of the may be performed on the light (pulses) from LIGHT SOURCE 32, or from LIGHT SOURCES 36, or both. It is commonly performed on the light (pulses) from LIGHT SOURCES 36.

More importantly for the present explanation is the concept that each and all of the light pulses as are enabled to be transmitted from the LIGHT SOURCES 36 will, if properly phased relative to the light pulses entering the OPTICAL DISC D1 from the IN DELAYs 1–N—and even if all are identically phased by a single control signal GATE LIGHT SOURCES 37—spatially and temporally intersect within the body of DISC D1 but one single light pulse, maximum, of all the light pulses that are passing through the OPTICAL DISC D1 from the IN DELAYs 1–N. A "train", or "slanted line" of light pulses, each at a different Y axis displacement is passing through the OPTICAL DISC D1 from the IN DELAYs 1–N. Another "train", or "straight line" of light pulses, each at a different x-axis displacement, is passing through the OPTICAL DISC D1 from the LIGHT SOURCES 36. These two moving lines will intersect along a line or lines that is (are) drawn diagonally through the thickness, and across the annulus, of the OPTICAL DISK D1. (If this is hard to understand then the more complete explanation, and illustration, of this intersection appearing in the companion predecessor patent application U.S. Ser. No. 163,907 filed on Dec. 6, 1993, should be referenced.)

As the phasing between the optical pulses coming through the OPTICAL DISK D1 from the LIGHT SOURCE 31, and from the LIGHT SOURCE 36, is varied, the entire volume of the annulus of the OPTICAL DISC D1 is writable or interrogatable (i.e., readable), one domain in each layer at each time, and multiple domains in all layers at the same time. The "domains" and the "layers" are, of course, concepts that are supported and defined by the number of pulses of radiation laser light along each axis, and the mode and manner by which these radiation laser light pulses are directed to temporal and spatial intersection. This is the principle of a 4-D radiation memory, herein brought to bear upon a line of domains (each in a separate plane) as opposed to, in a full volume memory, a plane of domains each in a three-dimensional volume. Typically the OPTICAL DISK D1 will have but eight layers but many hundreds or thousands of tracks between the inner and outer rings of the annulus where recording is effected.

How many layers (in which exist domains) can be read while a single annulus of the disk is under the optical read-write head is a function of the rapidity of the DETECTORS 1–N and, if multiple colors are to be written, the successive shifts in radiation light frequency so permitting (one set of light pulse frequencies suffices to read all photochromic chemicals, but in only one, addressed, domain at one time). As might be expected, the domains are radiatively defined and successively written/read across the thickness of tile OPTICAL DISC D1 are not precisely exactly aligned across this thickness but are, as the OPTICAL DISC D1 rotates, slightly on the slant. The recording and reading of the entire volume of the OPTICAL DISC D1 will be understood to be a continuous, self-synchronizing, process using Manchester encoding or the like, and the OPTICAL DISK D1 must not be thought to be stopped, but is indeed rotating rapidly as it is written and read. The optics, the fluorescent emissions (during reading), and the electronics generally turn out, however, to be so much faster than the mechanics of the rotation of the OPTICAL DISC D1 that the entire thickness of the OPTICAL DISC Dl is written or read in a (slightly slanted) line drawn across the annulus of the OPTICAL DISC D1 as it rotates under the optical read-write head.

So far in the explanation of FIG. 3b, and because necessary production of multiple frequencies of writing radiation pulses plus an additional frequency pair of reading radiation pulses was not explicitly shown, there has been little discussion of the color radiative recording and reading that is the gravamen of the present invention. That the optical disc recording and reading system of FIG. 3b is truly a color radiation memory is clear in that each output pulse line, normally along a continuation of the axis of a pulses transmitted from a corresponding one of IN DELAYs 1–N, is split in a corresponding PRISM 1 through N, and directed onto a corresponding DETECTOR 1 though N. Each of the DETECTORs 1 though N has as many individual elements as there are colors, and separate photochromic chemicals, in the OPTICAL DISC 1, and typically has eight such elements. The DETECTORs 1 though N, which are clearly in a straight line, are typically photodiodes, but may optionally be one or more CCDs.

The OUT DELAYS 1 though N intermediary in the beam lines between the OPTICAL DISC D1 and the PRISMs 1–N are optional. The OUT DELAYS 1–N are again preferably simple lengths of optical glass arrayed in a stack of increasing lengths like a stack of glass microscope slides of decreasing length. The optional OUT DELAYs 1–N serve to re-normalize and re-synchronize the time sequence of the light pulses (or, more properly, the radiative results in the volume of the OPTICAL DISC D1) that were variably delayed in the IN DELAYs 1–N. This re-synchronization permits that all the one or more DETECTORs 1–N may be gated at the same time, simplifying the electronics.

A practitioner of the optical design arts will quickly realize that many other combinations of light beam or light pulse directing, timing, phasing and frequency-shifting are possible to address all sorts of volumes in all sorts of ways from all sorts of directions in all sorts of staged sequences. The present and related inventions should be understood to address, in 3-D and 4-D volume forms and otherwise, the construction of radiation memories using two-photon absorption.

5. Two-Photon Processes

The radiation/optical memories of the present and related applications depend on two-photon processes. The theoretical bases for two-photon processes were established in the early 1930's (Goeppert-Mayer 1931). It was shown that the probability for a two-photon transition may be expressed as a function of three parameters: line profile, transition probability fit for all possible two-photon processes and light intensity. See FIG. 4 for a schematic representation of four such processes. These factors are related to $P_{if}$ by:

$$P_{if} = \frac{\gamma_{if}}{[\omega_{if} - \omega_1 - \omega_2 - \overline{v}\cdot(\overline{k}_1 + \overline{k}_2)]^2 + (\gamma_{if}/2)^2} \cdot \left| \sum_k \frac{\overline{R}_{ik}\cdot\overline{e}_1 \cdot \overline{R}_{kf}\cdot\overline{e}_2}{(\omega_{ki} - \omega_1 - \overline{k}_1\cdot\overline{v})} + \frac{\overline{R}_{ik}\cdot\overline{e}_2 \cdot \overline{R}_{kf}\cdot\overline{e}_1}{\omega_{ki} - \omega_2 - \overline{k}_2\cdot\overline{v}} \right|^2 \cdot I_1 I_2$$

According to this postulate, two-photon transitions may also allow for the population of molecular levels that are parity-forbidden for one-photon processes, such as g→g and u→u, in contrast to the g→u and u→g transitions that are allowed for one-photon processes. In practice, however, when one is concerned with large molecules in condensed media, the density of the states is very large, the levels broadened by collisions, and the laser line bandwidth large enough to accommodate many levels. Therefore, there is little, if any, difference in the energy between the levels observed experimentally by one- or two photon transitions in the large molecular entities used under the experimental conditions presented here.

The equation for $P_{if}$ is composed of three factors: the first factor describes the spectral profile of a two-photon transition. It corresponds to a single-photon transition at a center frequency $$(\omega_{if} = \omega_1 + \omega_2 + \overline{v}\overline{k}_1 + \overline{k}_2)$$

with a homogeneous width $\gamma_{if}$. If both light waves are parallel the Doppler width which is proportional to $|\bar{k}_1+\bar{k}_2|$ becomes maximum. For $\bar{k}_1=\bar{k}_2$ the Doppler broadening vanishes and we obtain a pure Lorentzian line. The second factor describes the transition probability for the two-photon transition. This is the sum of products of matrix elements $R_{ik}$, $R_{kf}$ for transitions between the initial state i and intermediate molecular levels k and between these levels k and the final f. The sum extends over all molecular levels. Often a "virtual level" is introduced to describe the two-photon transition by a symbolic two-step transition $E_i \rightarrow E_v \rightarrow E_f$. Since the two possibilities, $E_i+\hbar\omega_1 \rightarrow E_v$, $E_v+\hbar\omega_2 \rightarrow E_f$ (first term)

or $E_i+\hbar\omega_2 \rightarrow E_v$, $E_v+\hbar\omega_1 \rightarrow E_f$ (second term)

lead to the same observable result, the excitation of the real level $E_f$, the total transition probability for $E_i \rightarrow E_f$ is equal to the square of the sum of both probability amplitudes. The frequencies of $\omega_1$ and $\omega_2$ can be selected in such a way that the virtual level is close to a real molecular state. This greatly enhances the transition probability. Therefore, it is generally advantageous to populate the final level $E_f$ by means of two different energy photons with $\omega_1+\omega_2=(E_f-E_i)/\hbar$ rather than by two equal photons. The third factor shows that the transition probability depends on the product of the intensities $I_1$ and $I_2$. In the case where the photons are of the same wavelength, then the transition probability depends on $I^2$. It will therefore be advantageous to utilize lasers emitting high-intensity light such as picosecond and sub-picosecond pulses.

Four possible processes that may operate by means of two-photon excitation are shown in FIG. 4. The process of FIG. 4a corresponds to a stepwise or sequential two-photon absorption process in which each photon absorption is allowed (i.e., two allowed one-photon sequential processes). Even though the final state reached by the two photons may be the same as by the simultaneous absorption of two photons via a virtual level as shown in FIG. 4b, the effect toward a volume memory is overwhelmingly different. In the case of the sequential two-photon process, the first photon absorption takes place on a real level—by definition—by a molecule, or atom, which has an allowed state at that energy. It will therefore be absorbed by the first such molecule or atom on its path, which is usually located on the surface. Subsequently, if sufficient photon intensity is available, several possibilities exist; (1) The photons from the same pulse may be absorbed by the same molecule, inducing a transition to higher electronic states; (2) populate an additional molecule further, inside the volume; or (3) after energy decay, populate a metastable level such as a triplet.

The second photon will encounter the same fate, namely, it will be absorbed preferentially by the molecules first encountered in its path, which are the molecules at or near the surface. Then with decreasing intensity, this beam will propagate and be absorbed by molecules further inside the volume. This second sequential beam may be delayed by a time interval equal to or slightly longer than the time required by the first excited state to decay to a low-lying metastable level. If the wavelength of this second beam is adjusted to be longer (i.e., smaller in energy) than is the energy gap between the ground state and the first allowed state, (wavelength of the first beam), then the second light beam will populate only the upper electronic states of the excited metastable level This is an interesting and important scientific aspect of nonlinear spectroscopy and photophysics; however, it does not result in true 3-D volume memory. This is because, as mentioned earlier, there is no means possible by which light can interact preferentially with molecules located inside a volume without interacting first with at least equal efficiency with molecules residing on the surface.

Figure 4A:
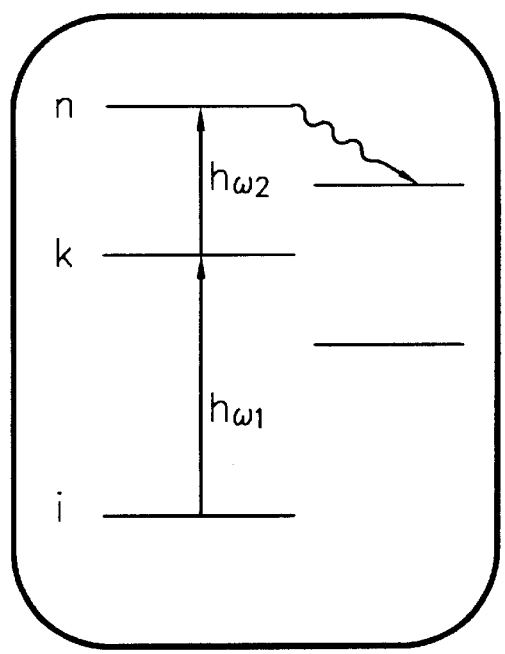
FIG. 4, consisting of FIGS. 4a through 4d, are schematic representations of various two-photon processes.
Figure 4B:
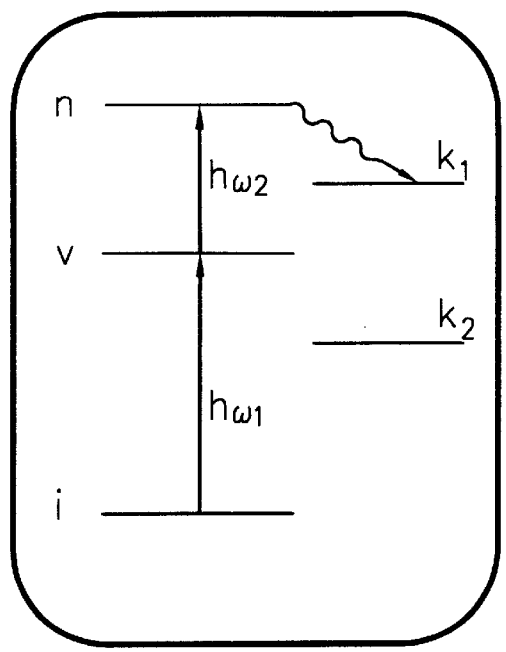

The second scheme for two-photon absorption as shown in FIG. 4b makes it possible to excite molecules inside a volume in preference to the surface. This may be achieved because the wavelength of each beam is longer and has less energy than the energy gap between the ground state and first allowed electronic level. However, if two beams are used, the energy sum of the two laser photons must be equal to or larger than the energy gap of the transition. It is also important to note that there is no real level at the wavelength of either beam, therefore, neither beam can be absorbed alone by a one-photon mechanism. When two such photons collide within the volume, absorption occurs only within the volume and size defined by the width of the pulses. This is in sharp contrast to the sequential two-photon process where the first step involves the absorption of a single photon by a real spectroscopic level and hence is not capable of preferential volume storage.

The principal difference in the two cases as far as their suitability for 3-D volume memory is concerned is that the virtual case shown in FIG. 4b avails itself to writing and reading in any place within the 3-D volume, while the sequential excitation is restricted in writing and reading first at the surface.

Figure 4C:
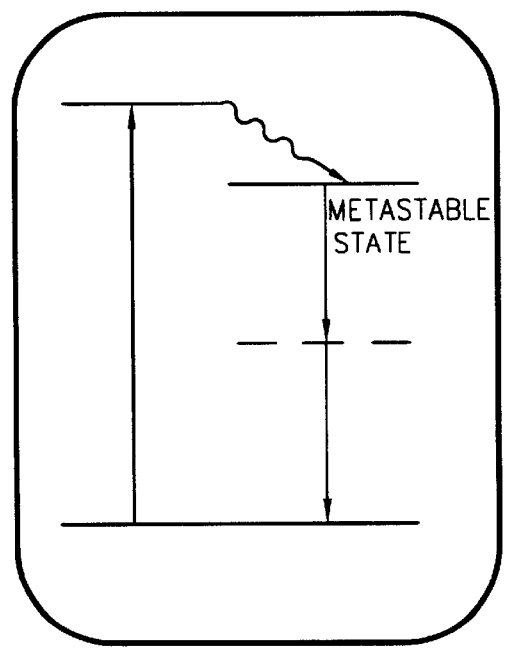
Figure 4D:
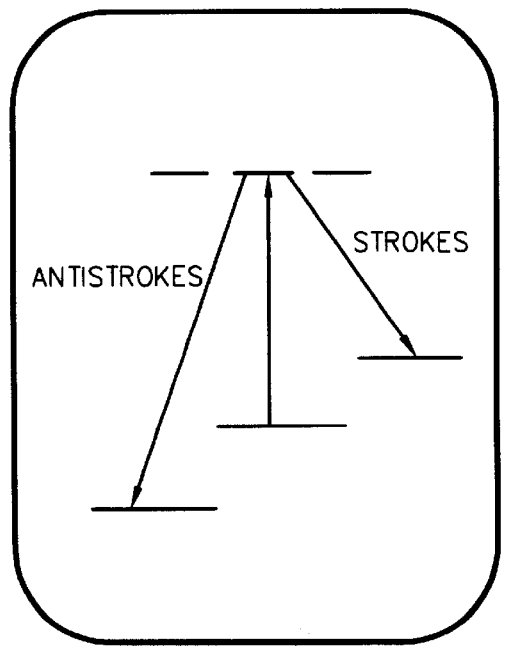
Figure 5D:
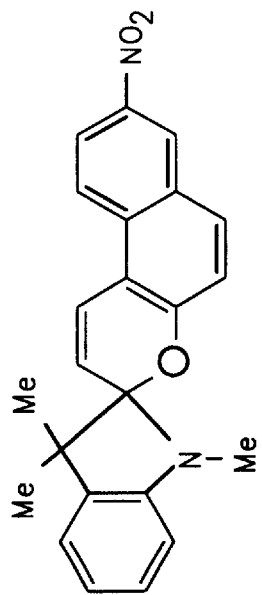
FIG. 5, consisting of FIGS. 5a through 5e, shows the structure of some spiropyran molecules usable in two-photon three-dimensional (2-P 3-D) radiation memories.
Figure 5E:
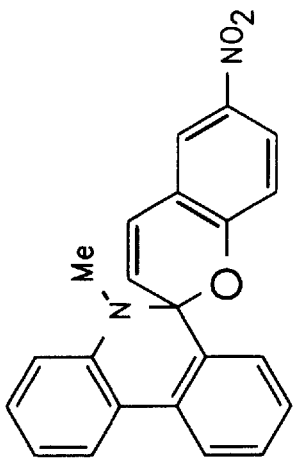
Figure 5A:
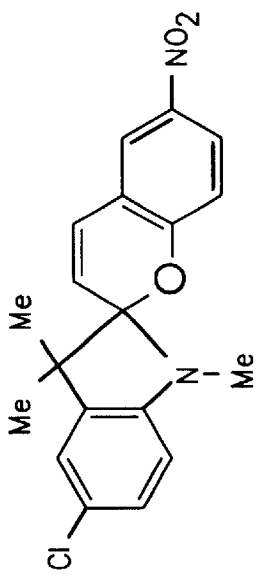
Figure 5B:
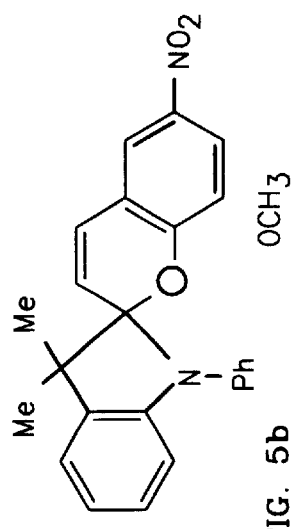
Figure 5C:
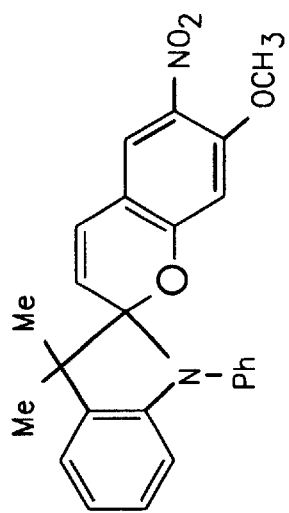

The other two processes shown in FIGS. 4c and 4d respectively show (i) the possibility of two-photon emission after single-photon excitation and (ii) the Raman effect. Neither of these last two cases is relevant to the present invention and is not discussed further. It is simply noted at this point that the same physics holds for all two-photon transitions regardless of the sequence by which they take place, whether via sequential steps between real levels or vie virtual state interaction.

In the present invention a two-photon process is used where the photon energy of each beam was smaller than the energy gap between the ground state $S_0$ and the first allowed electronic level $S_1$. Therefore, such a beam of light propagates though the medium without observable absorption. When two such beams are made to intersect at a point within the memory volume, their effective energy is equal to the sum of the two photon energies $E_1+E_2$. Therefore, absorption will occur if the $E_{S1}-E_{S0}$ energy gap is equal to or smaller than $E_1+E_2$. At the point where the two beams interact, the absorption induces a physical and/or a chemical change, which will distinguish this micro-volume from any other part of the memory volume that has not been excited. These two molecular structures, i.e., the original and the one created by the two-photon absorption, are subsequently utilized as the write and read forms of a 3-D optical storage memory. For successful completion of this type of writing and reading, the light beams that perform either function must also be capable of propagating through the medium and be absorbed only at preselected point within the memory volume where the two beams intersect in time and space without any noticeable effect on other areas of the memory volume in which information may or may not be written.

6. Reading and Writing Information in 3-D Space

Information is stored in a radiation/optical memory, including the color versions thereof, in the form of binary code. The two states of the binary code, 0 and 1, may be thought of as photochemical changes, which lead to two distinct structures of the particular molecular species used as the storage medium. such an example is provided by the changes in molecular structure occurring in photochromic materials such as spirobenzopyran after the simultaneous absorption of two photons. The structure of some spirobenzopyran (SP) molecules is shown in FIG. 5. Spirobenzopyran has two distinct forms: the original, stable spiropyran form, which is converted to the merocyanine form after excitation with UV light. These two forms, which possess distinctly different structures and completely different absorption and emission spectra, provide the two states necessary for 3-D storage information in a binary format. Specifically, the original form is designated as 0 and the merocyanine form as 1 in the binary code. The spiropyran form has a closed ring structure and is referred to as the closed form, while in contrast the merocyanine structure is an open ring type and is referred to as the open form.

The essential elements of the 3-D information storage device described here are the molecule, the host matrix, and the two laser beams of the same or different wavelengths, which will provide the means for writing and reading by two-photon processes. Depending on material and process, the wavelength requirements are likely to be different, in which case the advantage of utilizing a dye laser or other tunable laser source becomes apparent. Another approach for wavelength tuning may involve second or higher harmonic generation in nonlinear crystals as well as stimulated Raman generated in gases and liquids.

6.1 Writing 3-D Information

Figure 6:
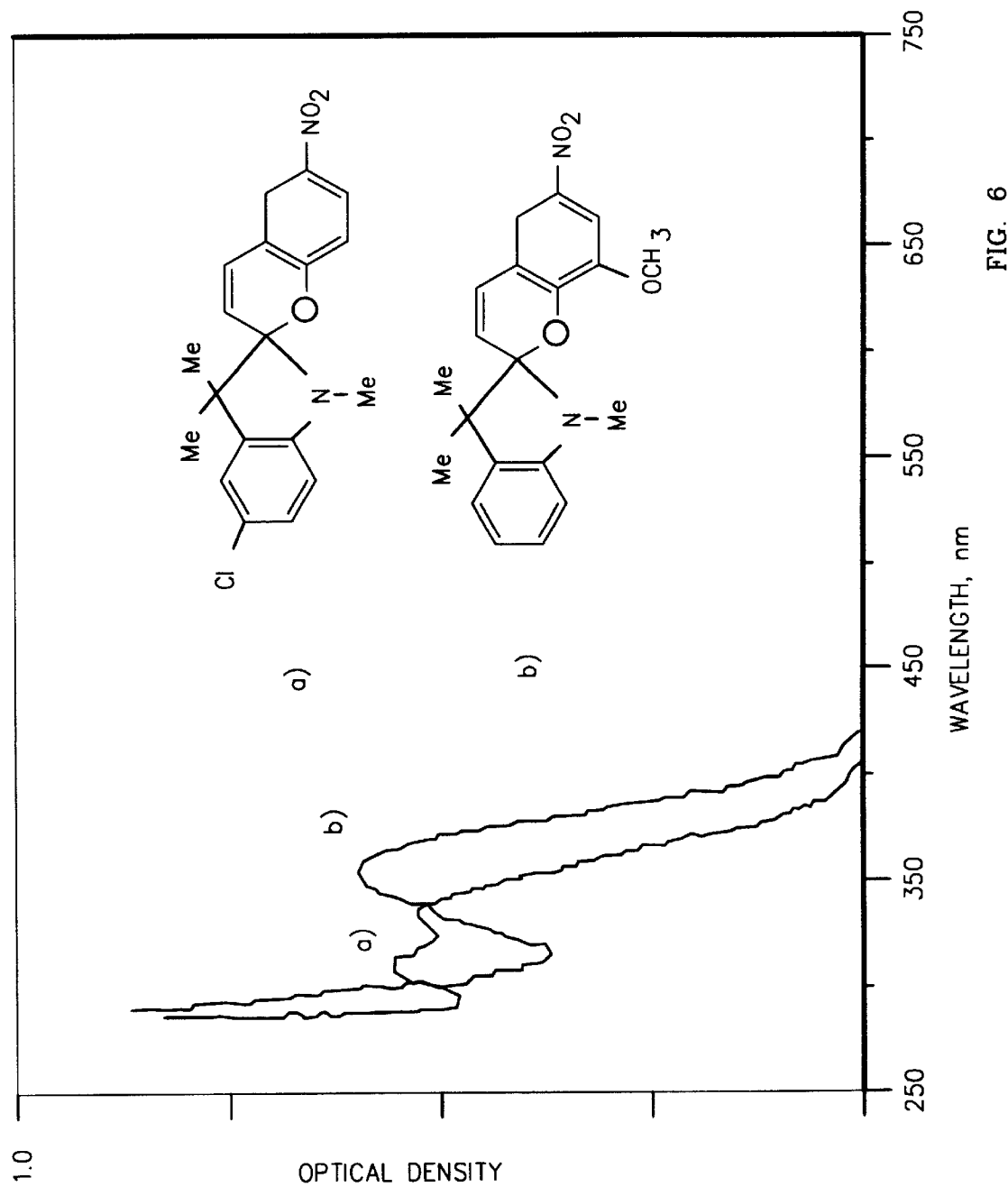
FIG. 6 shows the absorption spectra of 1SP and 2SP in polymethylmethacrylate (PMMA).

To write information in a 3-D storage memory device that contains SP molecules as the recording medium requires excitation in the UV region of the spectrum because SP absorbs at that region, i.e., –260 and 355 nm. This is shown in FIG. 6 where the absorption spectra of 1SP are reproduced. Excitation to this state is provided by the two-photon absorption of either a 1064-nm photon and a 532-nm photon, which is equivalent to a 355-nm photon, or two 532 photons, corresponding to a 266-nm photon energy, where 266 and 355 nm are the wavelengths of the two absorption maxima of the SP molecule. Note, however, that two-photon absorption induced by each beam separately may also occur. This will occur when the individual beams are sufficiently intense and will result in background noise. The background-to-signal ratio for two collinear beams propagating at opposite directions is 1:3. Since two-photon absorption is dependent on the square of the power, the effect of each beam will be approximately one-fourth that of the two beams combined, assuming two beams of equal power. This problem can be eliminated by utilizing two beams of different wavelengths such that one beam cannot induce any two-photon background noise, ie.e., its wavelength is longer than necessary to induce a two-photon transition. Such, for example, is the case with a 1064-nm beam and the spirobenzopyran molecule that absorbs at three and four times this energy but not at twice. However, when the 1064-nm beam is combined with a 532-nm beam, excitation of the spirobenzopyran molecule to the first excited state at 355 nm is possible. The background noise may be eliminated to a large extent by increasing the intensity of the 1064-nm beam and keeping the 532-nm pulses to as low an intensity as possible. In practice, the 532-nm beam intensity is reduced to such an extent that two-photon absorption of the individual 532-nm beam is not visible and the 1064-nm beam is increased proportionally so that the combined two photon process, which is the product of the intensity of the two laser pulses, is sufficient to excite the molecule and consequently induce the structural change that constitutes writing.

Figure 7:
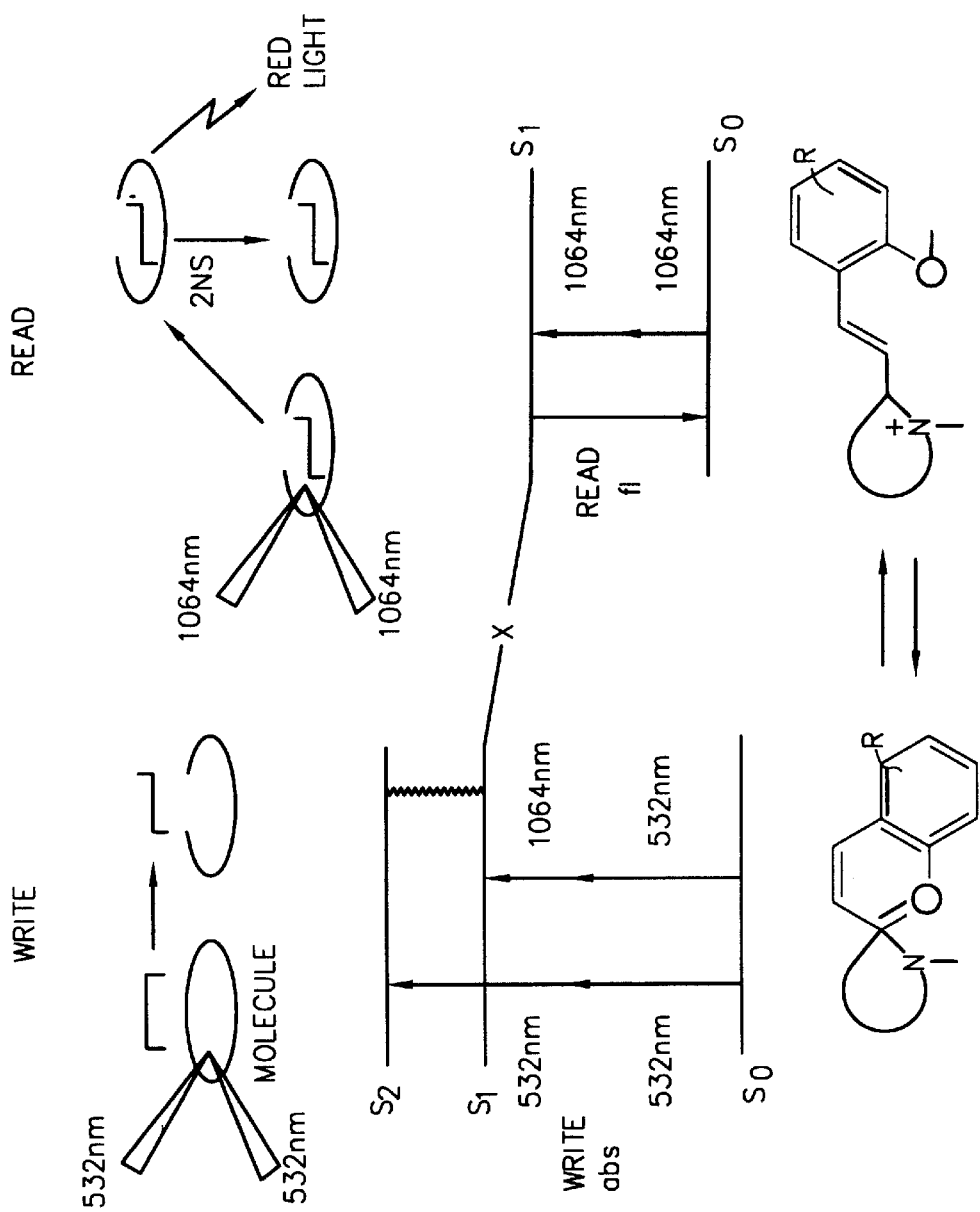
FIG. 7, consisting of FIGS. 7a through 7f, generally shows an energy level diagram of the 3-D reading and writing of photochromic spiropyran molecules by process of two-photon absorption where
Figure 8A:
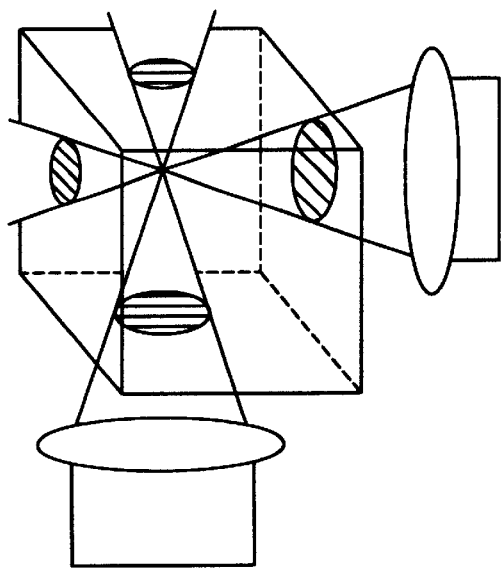

FIG. 7 displays an energy-level diagram of the two-photon process, a schematic representation of the write and read events and the molecular structures of the "write" and "read" forms of SP. By translating the beams along the axes of the sample volume, the required spatial pattern is achieved in the form of colored spots. See FIG. 8*a*. The written volume appears colored because the read form spectrum shows an absorption in the 500-nm region. In this discussion the memory is in the shape of a cube but may be molded in any other form. Similarly most of the discussion presented is with written beams propagating orthogonally to each other. However, similar results may be achieved by two counter-propagating beams or, in fact, by any other colliding arrangement. Each configuration has advantages over the others, however, the physics is essentially the same. FIG. 8*a* shows a scheme for orthogonal and opposite direction ORTHOGONAL BEAM interaction, while FIG. 8*b* displays a schematic representation of COUNTER-PROPAGATING PULSES used to write and read in 3-D space where the time and phase of the pulses is critical, ergo a four-dimensional (4-D space.

Figure 8B:
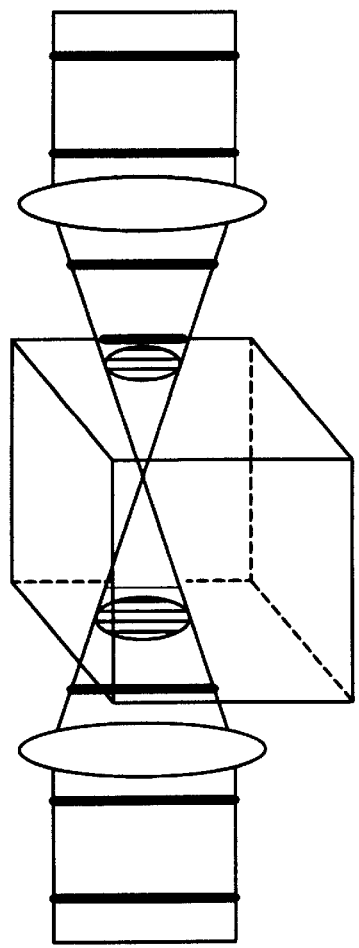
Figure 9:
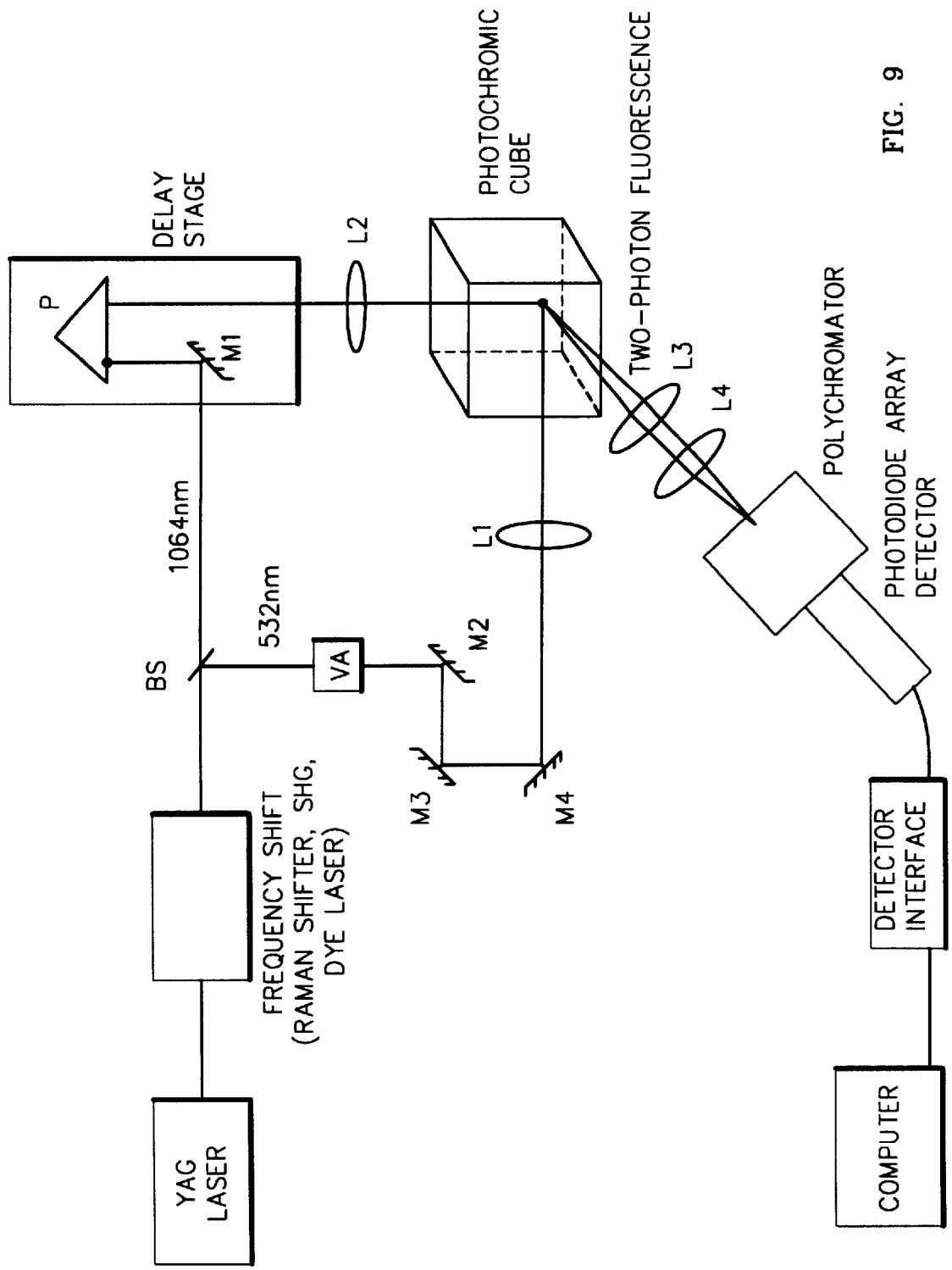
FIG. 9 is another, more detailed, diagrammatic representations of a system for reading and writing via two-photon absorption (2-P) in a three-dimensional (3-D) volume, where BS is the beamsplitter, P a prism, M a mirror, L a lens, and VA a variable attenuator.

In ether the 3-D radiation memory scheme of FIG. 8*a* or the 4-D radiation memory scheme of FIG. 8*b*, the information is normally stored not as one bit at a time, nor even as one line (consisting or many bits) at one time, but as one entire plane at a time in a page format. Each page typically consists of many megabits. Many pages are typically superimposed within a memory volume. A complication can arise from the fluorescence of the written form, which if absorbed by an adjacent SP molecule will induce false information to be written or crosstalk. To avoid such deleterious effects, the molecules chosen must not fluoresce in the "write" form. No fluorescence from the "write" form of the preferred spirobenzopyran molecules used in the preferred embodiments of the present invention has been observed even at liquid nitrogen temperatures (See Parthenopoulos and Rentzepis, op cit.).

6.2 Reading 3-D Information

The procedure used to "read" the information written within the volume of a radiation/optical memory is similar to the write cycle except that the "reading" form absorbs at longer wavelengths than the write form, hence one or both laser beam wavelengths must also be longer than the ones used for writing. After the written molecule is excited by two-photon absorption, the molecule emits fluorescence with a lifetime of 5 ns at longer wavelengths than the absorption of both the write and read forms. This fluorescence is detected by a photodiode or charge-couple device (CCD) and is normally processed as 1 in the binary code. The proper selection of materials that provide widely separated spectra are extremely important because they assure that only the molecules that have been written will absorb this radiation and consequently induce fluorescence to be emitted only from that part of the written memory that is being read.

Figure 10:
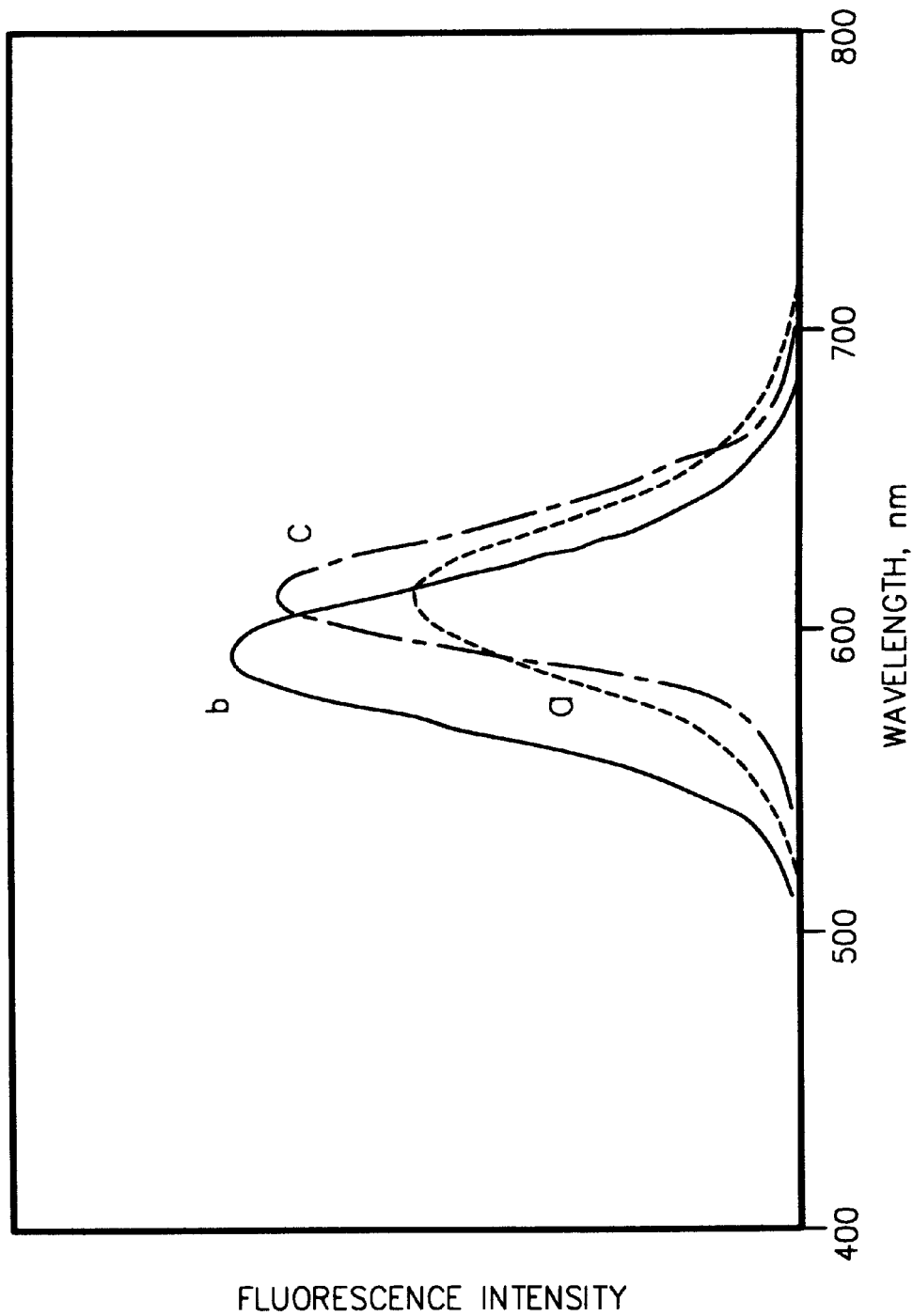
FIG. 10 is a graph showing the fluorescence spectra of 1SP in liquid monomers and solid polymer matrices (a) HEMA, (b) PHEMA, and (c) PMMA.
Figure 11:
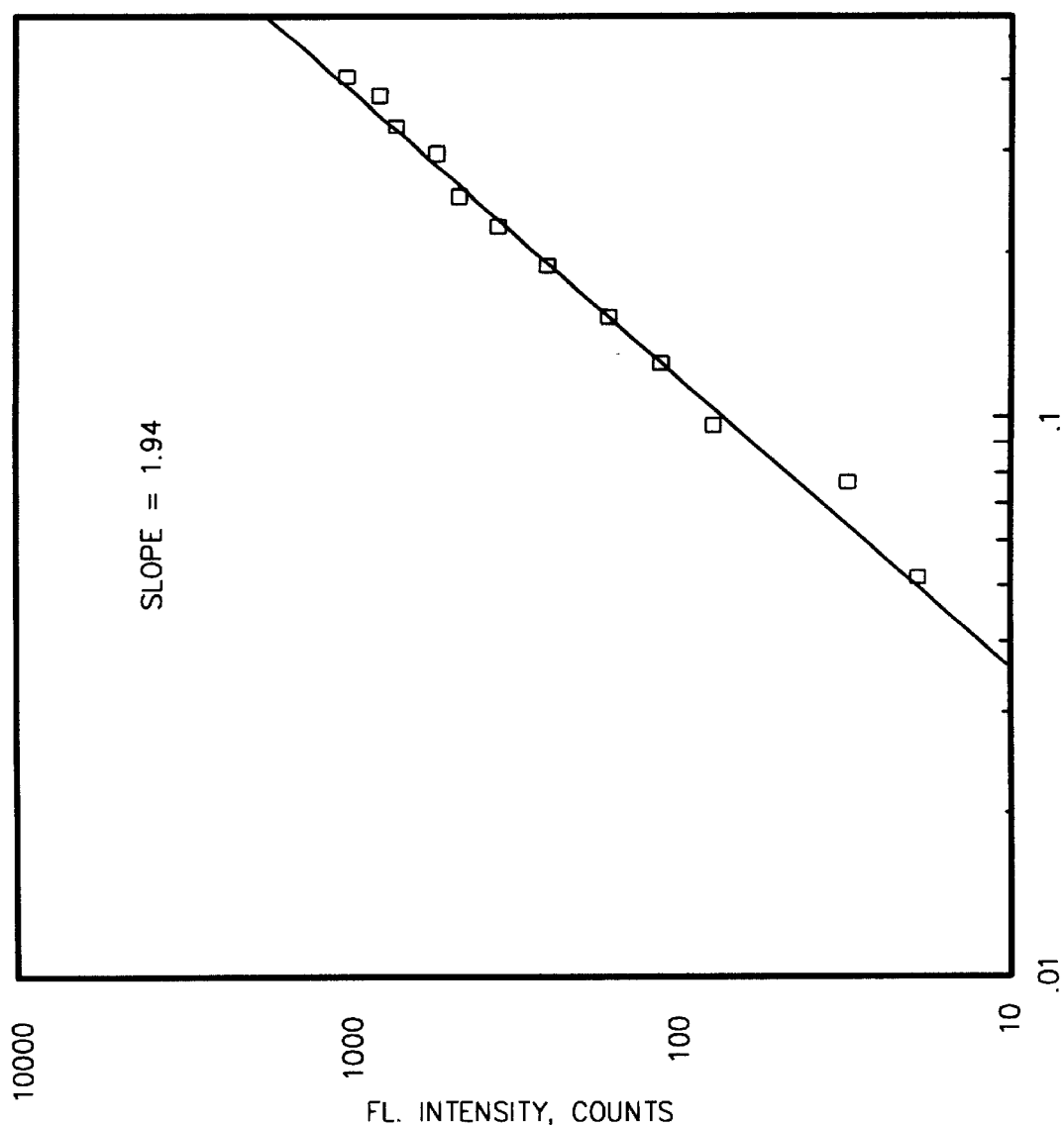
FIG. 11 is a log plot of laser energy versus fluorescence intensity illustrating that the process of FIG. 10 indeed proceeds by two-photon absorption because a slope of ≈2 is obtained in the plot.
Figure 12:
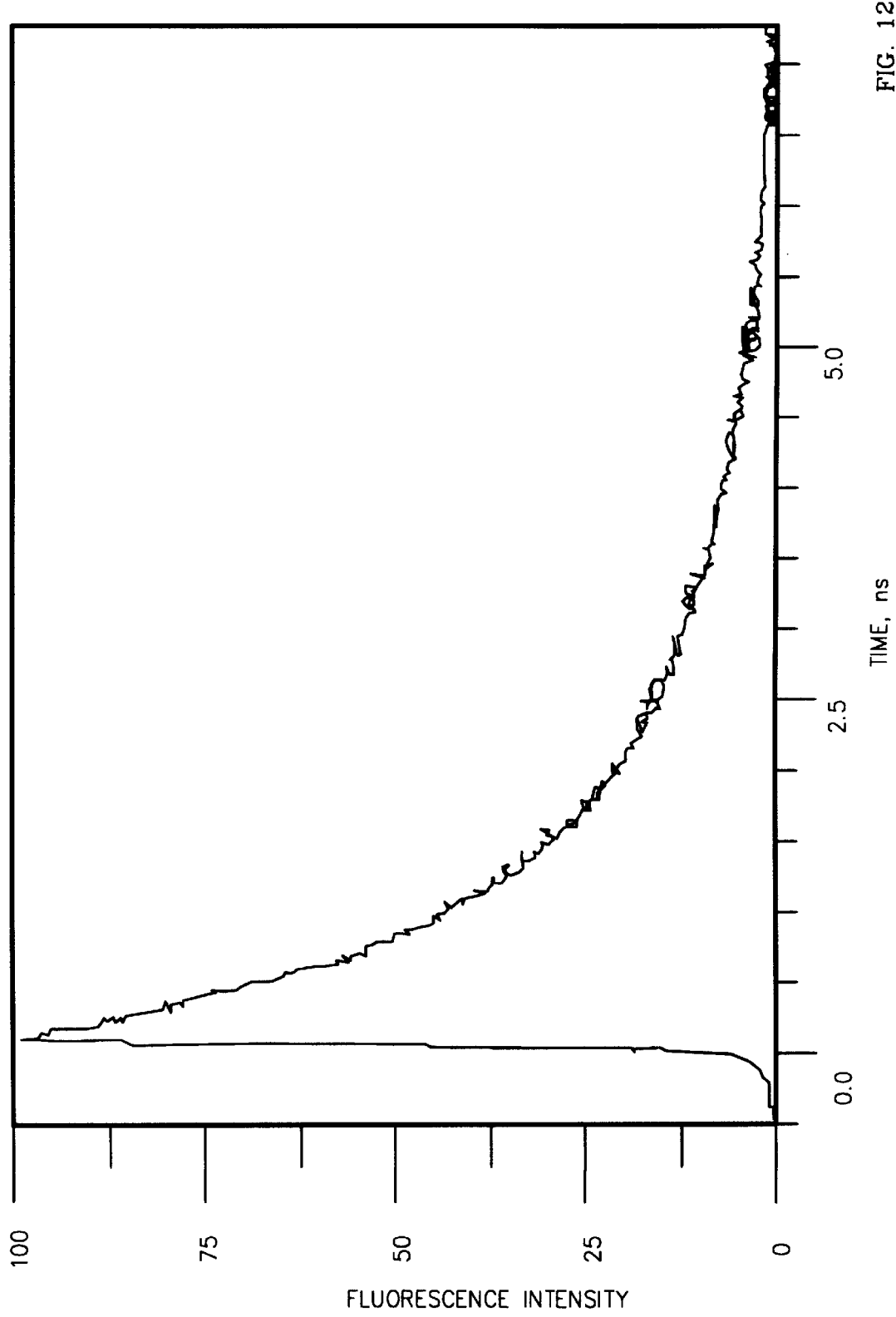
FIG. 12 is a graph of the decay of the fluorescence of spiropyran in the dark at 25° C.

The fluorescence emitted by the written form of SP is shown in FIG. 10. That the process indeed proceeds by two-photon absorption is verified in FIG. 11 where the slope of $\approx 2$ is obtained from a log plot of the laser energy versus fluorescence intensity. On the other hand, if the molecule has not been written, fluorescence will be not observed because the "read" two-photon energy is not sufficient to populate the closed form of the original, unwritten molecule, as shown in the energy level diagram of FIG. 7 and, in addition, because the closed form does not fluoresce. Self-absorption of the fluorescence by adjacent spirobenzopyran molecules that have been written does not affect the reading process because the largest segment of the fluorescent is emitted at longer wavelengths than the written form absorption band and consequently does not overlap considerably with the absorption of the written molecules. The small amount of fluorescence absorbed by adjacent written areas will yield signals that are either too weak in intensity to be detected or can be easily eliminated by means of electronic discriminators. Because the reading is based on fluorescence, a zero background process, this method has the advantage of a high "reading" sensitivity. Extremely low-level fluorescence measurements are possible by the use of photomultipliers or CCDs, which are capable of single photon detection. The fluorescence was found to decay with an ≈5 nanosecond lifetime, which in essence is the limiting speed of the reading process. FIG. 12 shows the fluorescence lifetime of the 1SP written form after excitation with two 1060-nm photons.

7. 3-D Radiation/Optical Memory Materials In General

A vast number of molecules may be used as materials for 3-D devices. These include photochromic materials, phosphors, photo-isomers, and semi-conductors. The above do not include materials for hole burning or holographic memory. Each of these materials has unique advantages. They also exhibit weaknesses that prevent or at least diminish their appeal for device utilization. Some materials such as phosphors are not yet available in clear, transparent form at thicknesses sufficiently large, i.e., 3 to 5 mm, to be of practical use as 3-D devices. Other materials must be maintained at very low temperatures in order to stabilize one of the forms; this is the case with some spyrans and photo-isomers and to a large extent with hole-burning materials. Other materials exhibit such a low quantum yield for either the reading or writing process that they are rendered impractical. It is rather important therefore to select the molecules that have the possibility of improvement in all areas of importance for practical use.

7.1 Spiropyrans

One of the rather promising classes of molecules used in basic experiments for 3-D storage is the spiropyrans. These are molecules of the general structure shown in FIG. 5. The photochromism of spiropyrans, namely their change in molecular structure and color after light absorption, is attributed to the photo-induced cleavage of the carbon-oxygen bond of the pyran ring and subsequent isomerization to the form referred to as merocyanine (Tyer and Becker 1970); Bertelson 1971). Spiropyran molecules are composed of two distinct molecular components linked by a sp³ hybridized carbon. These two components are positioned orthogonally to each other. In such an orthogonal configuration the π-electron moieties of the molecule do not interact with each other. Therefore, the result is a molecule whose spectrum shows a strong band in the UV region and complete absence of absorption in the visible region.

Figure 13:
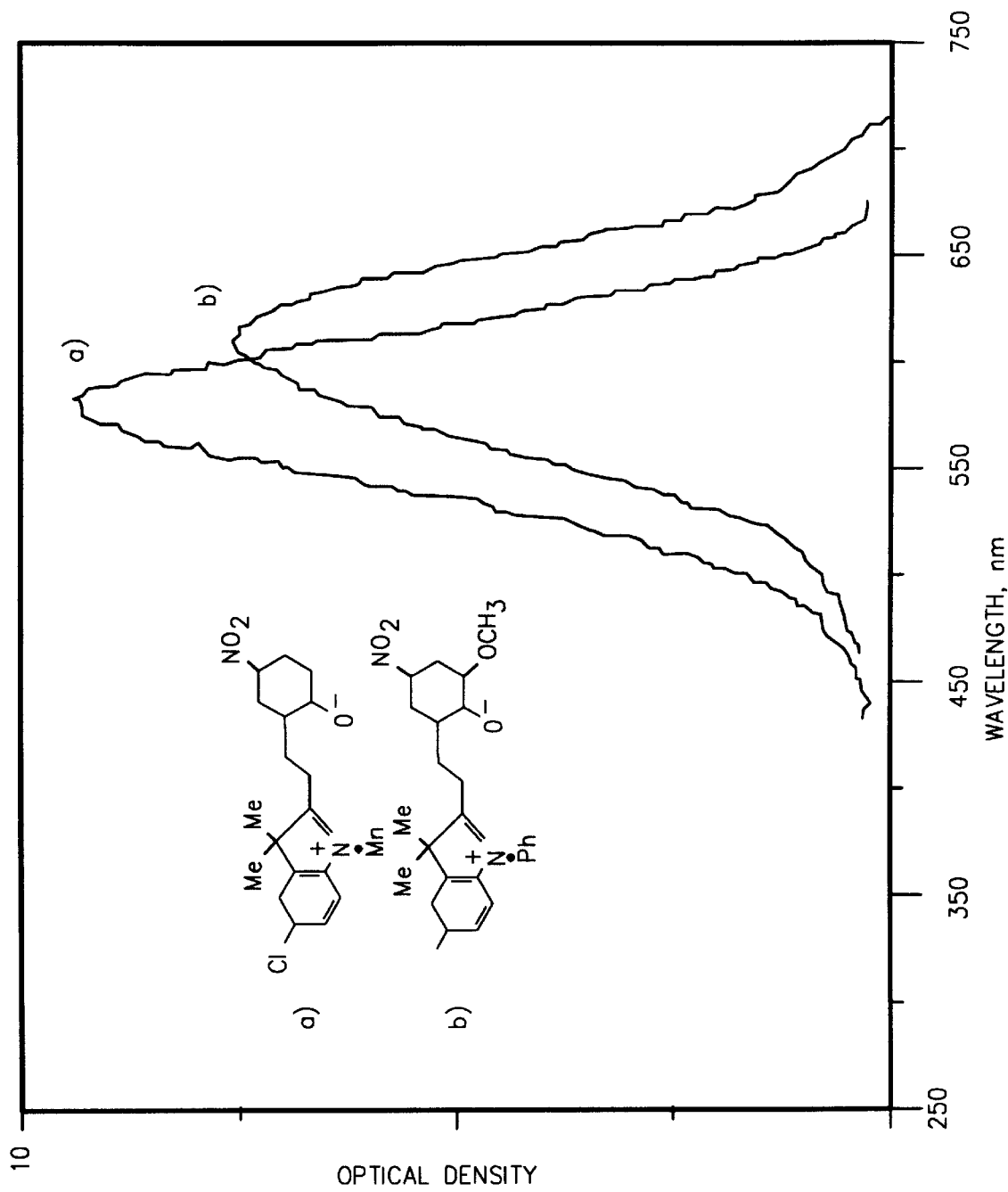
FIG. 13 is a graph showing the absorption spectra of the open writing form of 1SP and 2SP.
Figure 14A:
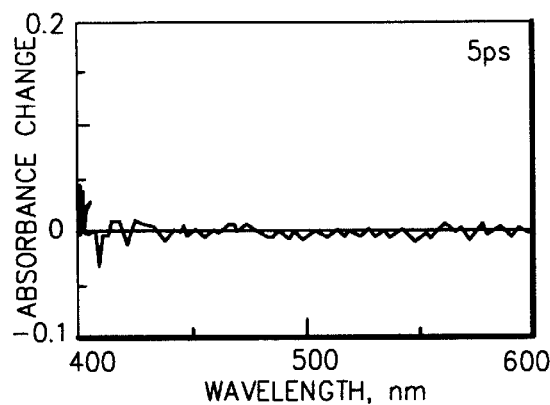
FIG. 14, consisting of FIGS. 14a through 14e, are graphs showing the transient absorption spectra of photochromic fulgides.
Figure 14B:
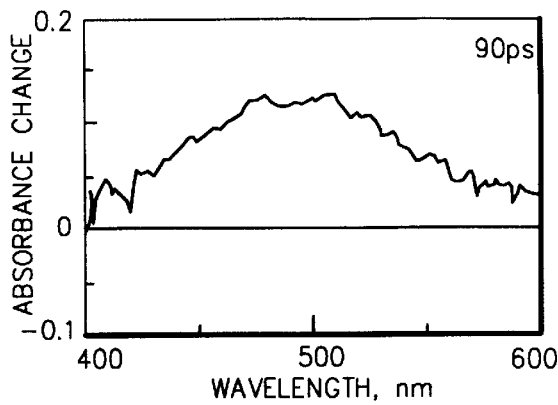
Figure 14C:
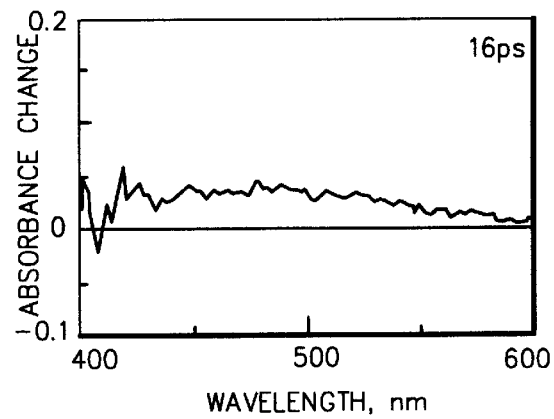
Figure 14D:
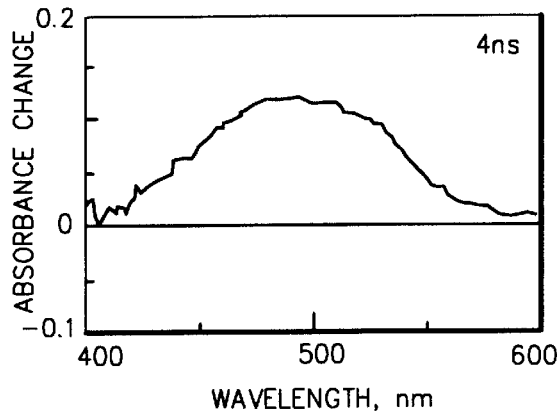
Figure 14E:
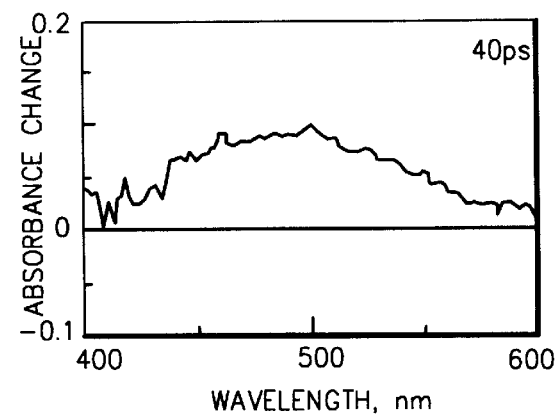
Figure 14F:
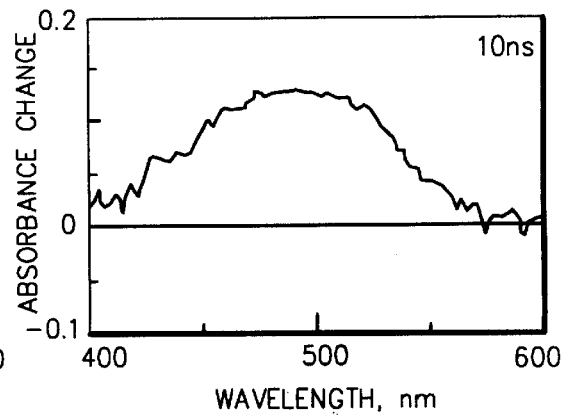

The spectrum of this molecule, which is of the utmost importance for the writing process, can be thought of as a superposition of the spectra of the two orthogonally situated members (Tyer and Becker 1970). Designating this initial orthogonal structure molecule as 0 in the binary code, an optical/radiation memory store will show 0 for any light beam(s) propagating through the memory with a wavelength or sum of two photon energies, which is equal to or shorter than the absorption band of this molecule, i.e., 350 nm. Light at 350 nm or less induces absorption, which initiates the photochemical opening of the pyran ring (see FIG. 7), forming an isomer, which in turn rearranges to a planar form as a result of thermal isomerization. This planar form is colored in appearance and absorbs intensely in the 550-nm region as shown in FIG. 13. The intermediate time, between the orthogonal and planar species, has been identified by means of resolved spectroscopy (Krysanov and Alfimov 1982; Dvornikov, Malkin, and Kuzmin 1982). The final, colored species of an SP molecule is formed with a quantum yield, which varies from approximately 10% to 98%. This variation depends in part on the structure of the original molecule.

The energy levels of the chromene and heterocycle components depend on the substituents and the nature of the environment, i.e., on the solvent or polymer matrix. For example, spiropyrans with indoline as the heterocycle components exhibit high quantum yields for photo-conversion to the colored forms because of the enhanced intramolecular energy transfer (Dvornikov, Malkin, and Kuzmin 1982) between the two constituent groups (Topchieu 1990). The choice of the molecule used may, therefore, have a profound effect on the operation, speed, and performance of the overall memory device because it dictates the laser power requirements for writing and reading and in addition determines the lifetime of the photo process, which is in essence the limiting factor of the speed for the input and output of the information to and from the 3-D memory device. The polymer matrix usually decreases the rate of molecular transformation and its quantum yield compared to liquids because of an increase in viscosity and other considerations such as polarity and the dielectric constant. The hardness of the polymer matrix, however, may contribute to the stability of the written form and obviously solid material devices are quite often preferable to liquid form devices.

The mechanism that drives the write and read process in these photochromic molecules may be presented as follows:

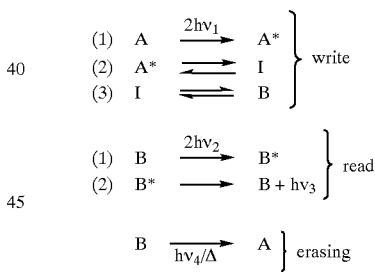

where A represents the original closed form, 0 in binary code; A* designates the electronic excited state of A; I is an intermediate species of very short lifetime; $hv_1$, $hv_2$, and $hv_4$ are photon energies; $hv_3$ is the fluorescence energy; $v_1=v_2=v_3$ and usually $v_1>v_2>v_3$; B is the colored merocyanine, open form binary code 1; B* designates the excited state of B; and Δ=heat.

7.2 Other 3-D Materials

Fulgides are other molecules that are highly photochromic and may be used as materials for 3-D devices. Fulgides also exhibit ring opening and closure. The quantum fields for the read and write forms have been measured (Heller and Oliver 1981); Horie et al. 1988) and the lifetime of the process including intermediate states and kinetics (Parthenopoulos and Rentzepis 1990b) are shown in FIG. 14 in the form of ΔA versus λ. Because of a relative lack of fluorescence emission in the solid state and its very fast τ<20 ps fluorescence lifetime (Horie et al. 1988) in solution after picosecond excitation, these materials may not be considered useful for applications where the reading process is based on the detection of rather strong fluorescence emitted by written molecules.

Another distinct area of materials, which have some very interesting inherent properties for optical memories, are the infrared phosphors. These materials emit in the visible region of the spectrum when irradiated with a near-infrared light. The phosphors we studied are semiconductor materials doped with particular electron trap atoms such as $Eu^{+2}$. The writing process is achieved by the promotion of an electron from the valence to the conduction band by means of UV irradiation. The electron is trapped by the $Eu^{+2}$ "hole" and remains there indefinitely because the energy gap of the trap is much larger than kT.

Figure 15:
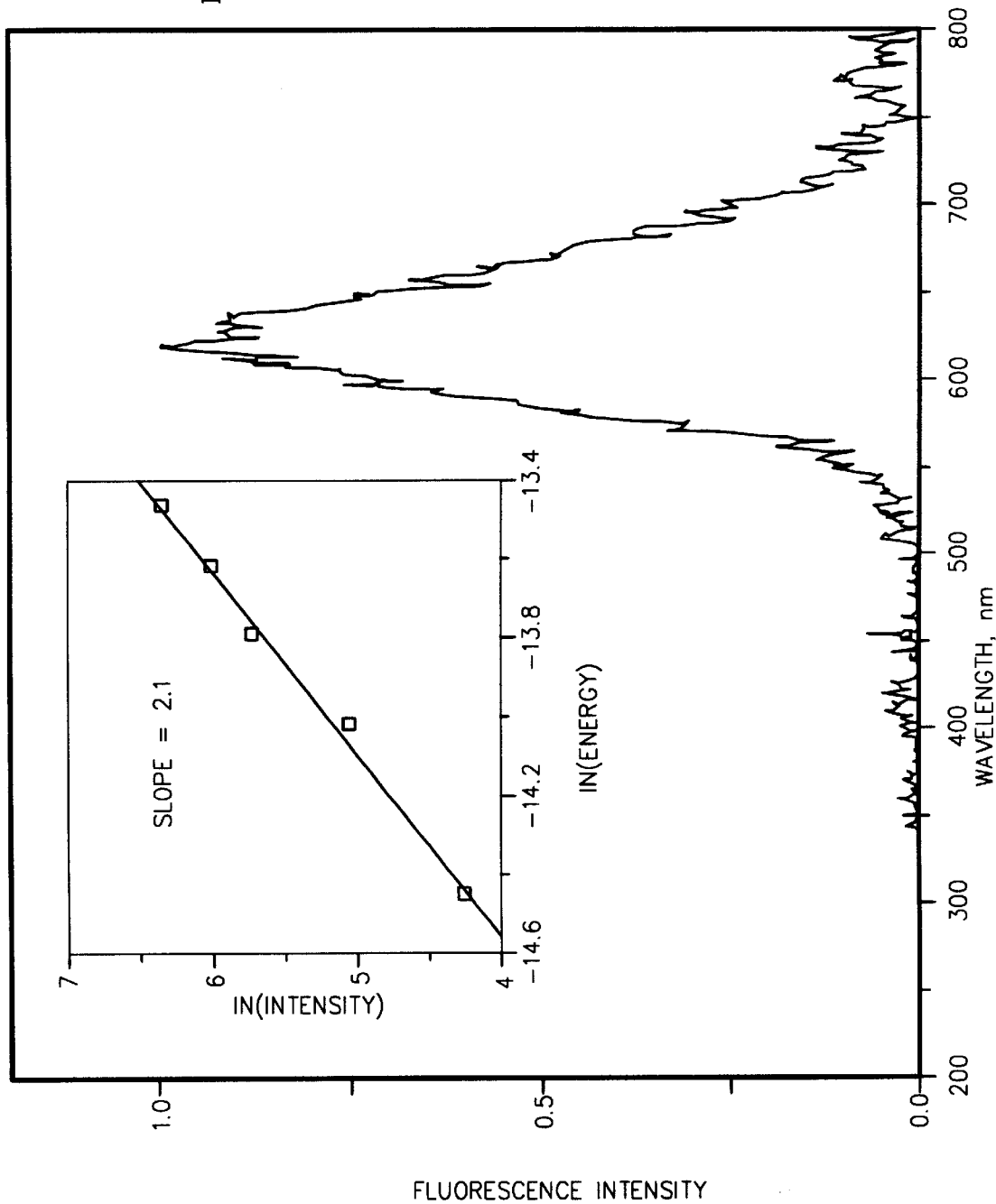
FIG. 15a is a graph showing the two-photon absorption of a Q-11 phosphor.
FIG. 15b is a graph showing laser power versus intensity in log form.
FIG. 15c is a table listing the fluorescent lifetimes of 1SP dispersed in various polymer matrices.

Reading of the information is achieved by irradiating the phosphor with near IR light ($\approx$1 eV), which is of sufficient energy to promote the electron over the hole energy barrier. Subsequently, the electron decays back into the valence band followed by visible light emission. Two disadvantages, at present, are associated with the commercially available phosphors: The information may be read only once and the phosphor is not soluble in any known to us polymer or other known to us matrix and, as mentioned previously, a 3-D block composed of these materials suffers from excessive light scattering. These materials, however, have the advantages of being stable at room temperature and since a very large number of electrons may be excited into the conduction band the storage of very large numbers of bits of information may be possible. To some extent, this diminishes the disadvantage of the read-once limitation. The two-photon fluorescence of a sample of Q-11 Quantex phosphor is shown in FIG. 15. The two wavelengths utilized for reading were either two 1.54 um or two 1.9 um beams. The second case is preferably because the photon energy sum corresponds to the maximum absorption wavelength of the Q-11 phosphor used for reading. At the present time, the inventor favors the use of photochromic materials such as (i) spiropyrans specifically including spirobenzopyran, (ii) rhodamine, (iii) cumarin and (iv) anthracene over other materials for 3-D memory devices because they possess most of the necessary characteristics needed for writing and reading. It is not suggested that these materials are the ultimate, nor that they are even presently ready now for the demands of practical commercial application. They are, however, (i) presently operative in the preferred embodiments of the invention, and (ii) possessed of promise for future improvements. Therefore, they are presented as exemplary enabling embodiments, and so as to present the progress that has been made in the field of radiation/optical memories.

8. Sample Preparation and Spectra
8.1 General Sample Preparation

The molecule 5'-chloro-6-nitro-1',3',3'-trimethyl-spiro-[2H-1-benzopyran-2,2'-indoline], 1SP (Chroma Chemicals), was purified by recrystallization from methanol and benzene. The polymer hosts polystyrene, Pst (Aldrich), polymethylmethacrylate, PMMA (Aldrich), polyethyleneglycol, PEtG (Sigma), as well as the solvents methanol (HPLC grade, Fisher), chloroform (HPLG grade, Fisher), and dichloroethane (HPLC grade, Aldrich) were used without further purification. Thin polymer films (100 um) containing 1% SP by weight were prepared on glass slides by solvent casting from a dichloroethane solution, which contained 30% Pst by weight, or from a chloroform solution containing either 30% PMMA or 30% Petg by weight. The films were placed in a vacuum for several hours to ascertain complete evaporation of the solvent. Solid blocks were also made by dissolving the SP molecule in a monomer such as methylmethacrylate then adding a sufficient quantity of a polymerization initiator. This homogeneous mixture was a sufficient quantity of a polymerization initiator. This homogeneous mixture was allowed to polymerize and then the solid block of PMMA/spyran was polished and stored at room temperature at which SP is stable for indefinite periods of time.

8.2 Absorption Spectra

The absorption spectra were recorded by a double-beam spectrophotometer and fluorescence was also measured by means of a spectrofluorometer after excitation at its maximum absorption wavelength. We also measured the two-photon-induced fluorescence spectra using a 0.25-m monochromator with an intensified diode array coupled to a microcomputer attached to its exit slit. When needed, cw irradiation was achieved by a 150-W xenon lamp. FIG. 4 shows the UV absorption spectrum of spirobenzopyran in PMMA. The salient features of the spectrum are the two absorption bands with two maxima centered at approximately 325 and 260 nm, respectively. The 325-nm band is two to three times less intense than the 260-nm band. Therefore, ISP may be a suitable material for two-photon absorption using a combination of the 1064-fundamental and 532-nm second harmonic of the $Nd^3$/YAG laser.

FIG. 13 shows the room temperature visible absorption spectrum of 1SP in PMMA after irradiation in the UV band with two photons. As is seen in FIG. 13, the absorption of the written form is centered at about 550 nm, which strongly red shifted from the original UV absorption band. This shift satisfies the criterion of band separation between the write and read forms of the molecule. The absorption spectrum of 1SP formed by two-photon excitation is found to be identical, as expected, to the one-photon spectrum. The two-photon photochromism is induced by spatially and temporally overlapping the 532-nm beam with the 1064-nm beam of the $Nd^{3+}$/YAG laser. The sum of the energies of the two photons equals the energy gap between the ground and first excited electronic state, which is located at 355 nm above ground.

When the film is irradiated with either the 532-nm beam or the 1064-nm beam alone, photochromism is not observed. It is obvious that the two-photon method puts a stringent requirement on the simultaneous arrival of the two pulses since the intermediate virtual state has essentially no lifetime (Rentzepis 1968), and because the process is dependent on the square of the laser power. Picosecond pulses are preferably used because of their inherent high peak power. Since the Pst matrix shows a strong absorption at 266 nm, photochromism induced by two 532-nm photons in SP/Pst has not been observed probably because of the quenching by the Pst matrix. The absorption spectra of SP in Petg after illumination by one photon or two photons are identical and are shown in FIG. 13. They appear to have a blue color, which is the consequence of absorption at 550 nm. If the irradiated films were kept at dry ice temperatures the color persisted for months. However, when the film was allowed to warm to room temperature the absorption shoulder at approximately 625 nm persists only for a few minutes. The appearance of different colored forms at different temperatures has been attributed to equilibrium between various isomeric species (Bertelson 1971).

The spectral peak is very similar to the absorption maximum of the merocyanine form of SP1 in Pst. In the less polar Pst matrix, aggregation is expected to be favored. Therefore, this new absorption shoulder can be attributed to aggregate formation. In PMMA, the absorption of the merocyanine written form, is also blue shifted relative to Pst. However, when the PMMA films are placed in dry ice (−78° C.), a color change is not observed as is the case with PSt. It is possible that the more polar PMMA matrix. prevents aggregation from occurring even at dry ice temperatures. Since the host polymer does not absorb at 266 nm, and the absorption cross section of SP at 266 nm is higher than the absorption cross section at 355 nm, 266-nm two-photon absorption readily takes place in this system. A higher absorption cross section obviously allows for the decrease in the required beam intensity, which lowers the possibility of multi-photon photochemical decomposition of the sample and also permits the use of low power lasers. The absorption spectrum of the merocyanine written form of 1SP is blue shifted in the more polar PEtG matrix relative to the absorption spectrum in PSt. This indicates a possible shift in equilibrium and suggests a larger ground-state dipole moment.

8.3 Fluorescence Spectra

The fluorescence of the merocyanine, which corresponds to the written form, of the spirobenzopyrans has received less attention than the fluorescence of the spiropyran form. However, this fluorescence has been observed previously (Becker and Roy 1965; Shabiya, Demidov, and Polyakov 1966; Horie et al 1985). The spontaneous fluorescence spectrum of the merocyanine form of 1SP in PMMA and other matrices is shown in FIG. 10. The fluorescence of 1SP in PMMA follows at least the biexponential decay shown in FIG. 12. The lifetimes of the merocyanine fluorescence of 1SP in solution and in various solid matrices are summarized in Table 1 where the values of the biexponential components of the fluorescence decay are also displayed. The excited merocyanine molecule may decay by either isomerization to the original Spiro form or revert to the ground state by emission of a photon (Shabiya, Demidov, and Polyakov 1966). This mechanism alone for the decay of the excited state will result in a biexponential decay lifetime curve. In addition, the written molecules within the polymer block and in solution may exist in various aggregate forms, each of which will decay from the excited state by a different lifetime. The presence of such aggregates in addition to the monomer is very probable considering the high concentration of SP in the films.

The rate of conversion of the merocyanine form to the original spiropyran form has been shown to be concentration dependent, suggesting the existence of various aggregate forms (Krysanov and Alfimov 1982). The fluorescence lifetime is also shown to be shorter in solution than in the polymer matrices. This may be attributed to viscosity effects in the rigid polymer matrices, in addition to the influence of the free volume that may be found in the solid polymer hosts. We find that the polar properties of the matrices used also influence the degree of aggregation so that analysis of the observed biexponential decays based on a simple model is not feasible. Fluorescence lifetime values of a different spirobenzopyran molecule have been reported previously (Horie et al. 1985) but these authors have reported only a single lifetime. However, the molecules studied and the concentrations are different than those we have investigated, therefore such discrepancies may be expected.

Figure 16:
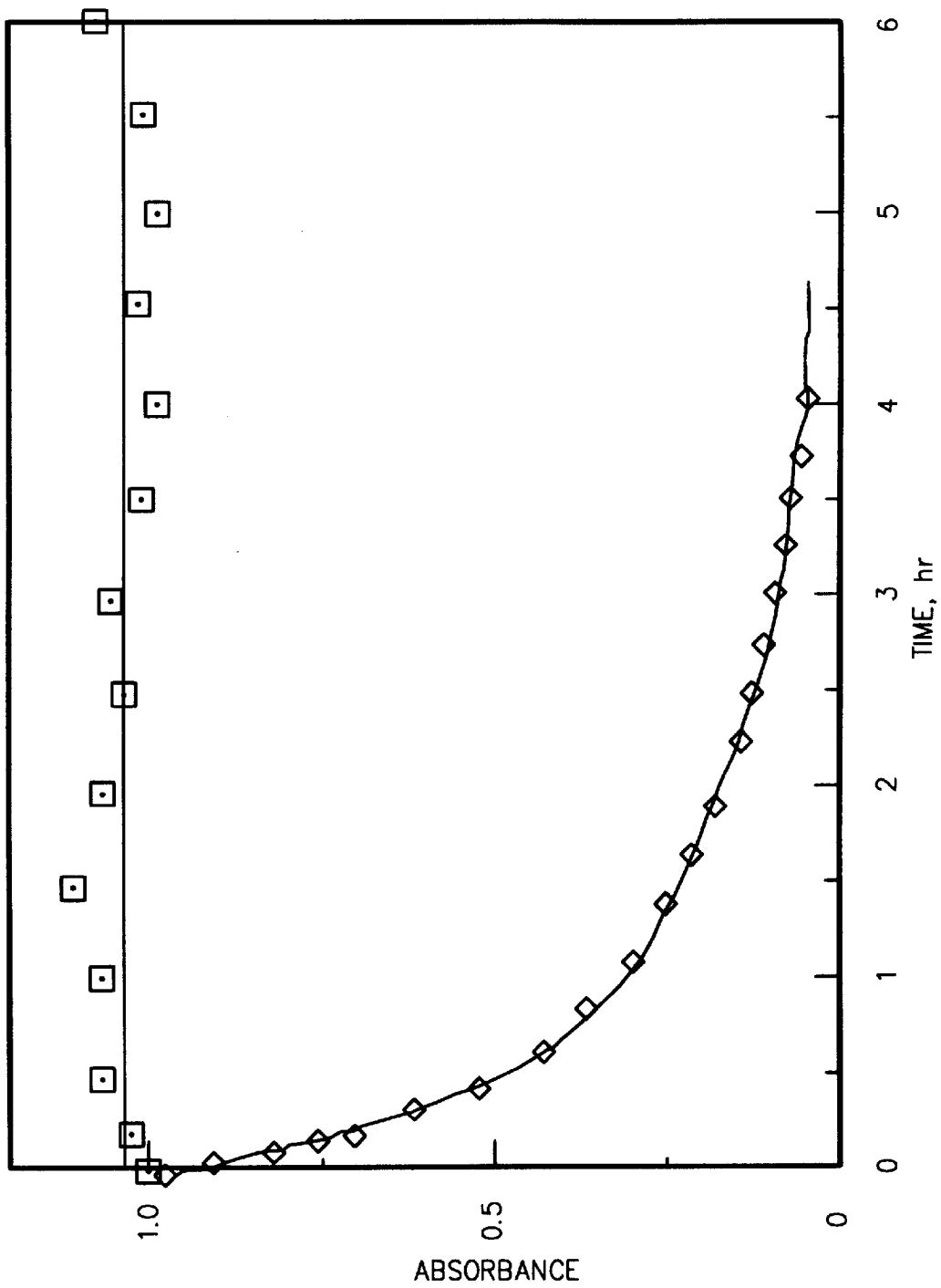
FIG. 16 is a graph showing the decay of the written form of 1SP where the upper graphed curve is for a temperature of 77>K, and the lower curve for 300>K.

The disappearance of the ground-state, colored written form of SP in PNMA at room temperatures in the dark is displayed in FIG. 16, lower curve. The decay of this colored form is found to be biexponential. Two rate constants were measured; $k_1 = 0.00133$ s$^{-1}$ and $k_2 = 0.00027$ s$^{-1}$ with amplitudes of 0.2365 for $k_1$ and 0.489 for $k_2$, respectively. This biexponential decay is in reasonable agreement with the results presented previously (Krysanov and Alfimov 1982). In PEtG and in PST, however, the decay constants are one to two orders of magnitude larger than in PMMA, and the colored form is found to fade with a much larger rate. Several studies on the fading rates of the colored form of spirobenzopyrans indicate that the bleaching rates depend on the distribution of the free volume in the polymer matrices (SMEtx 1983). In addition, the fading rates are strongly concentration dependent, because of the presence of different aggregates (Eckhard, Bose, and Krongauz 1987). Although the concentration of SP in the various matrices was kept the same, differences in the bleaching rates still persist because of the varying polarity of the matrices. Several films of SP in PMMA kept at −78° C. maintained the violet color of the merocyanine written form of SP for several months.

8.4. The Complimentary Photochromic Materials of the 2-P 3-D Color Memory

The 2-P 3-D color memory so functioning to store multiple bits of information in the same addressable volumes, or domains, contains several different, carefully chosen and interrelated, photochromic materials. These several interrelated photochromic materials have—among a great many other specific properties—differing spectral sensitivities, and differing frequencies of fluorescent radiation. Because the several photochromic materials of the 3-D memory are different from one another, each is written and read by correspondingly different frequencies, or "colors", of radiation, it is called a "color" 3-D memory. Accordingly, the memory is further called a "2-P 3-D color memory".

The plural photochromic materials meet the many normal criteria for use a 2-P 3-D memory, and also meet some special criteria which are called "strict" criteria. First, and as is normal for a 2-P 3-D memory, each photochromic material has an energy gap that is greater than the energy of each of two beams that are used to write and to write the material by process of two-photon absorption. In other words, during writing the wavelength of each of the two beams is longer, and each of the two beams individually contains less energy, than the energy gap between the ground state and the first electronic level. However, when two beams are combined during writing then the energy sum of the two photons, one from each beam, is equal to, or larger than, the energy gap of the transition. Likewise, during reading each one of two beams is individually insufficient so as to cause either (i) a transition of the photochromic material to the first electronic level, or (ii) fluorescence from either level.

Accordingly, during writing a transition of the photochromic material is thus obtained where and when, and only where, and when, the two beams are spatially and temporally coincident—normally at a selected location, and in a selected intersection domain size, within the 3-D volume of the memory. Likewise, during reading fluorescence of the photochromic material is thus obtained from only those selected domains (i) where two beams are spatially and temporally coincident, and (ii) from photochromic material within these domains that has already been written to, and that persists in, a selected one of two alternative levels, or states.

In a 2-P 3-D or 4-D color optical memory in accordance with the present invention each of plural photochromic materials must have an energy gap that is different from the energy gap of all other ones of the photochromic material. Each of the photochromic material preferably has a single, unitary, narrow peak energy of absorption, and the energy of the absorption peak of each of the photochromic materials is different from the energies of the absorption peaks of all others of the photochromic materials. During writing a selected energy is applied—by two intersecting energy beams by process of two photon absorption—to selected domains of the memory in a manner so as to substantially cause only a selected one photochromic material, out of a plurality of such within the domain) to undergo a change. Un-selected domain materials—whether of greater or lessor energy than the selected material—are substantially unchanged.

Reading, which is generally at a lower (combined) energy level than writing in a 2-P 3-D memory, functions differently. Although the different read states of the different photochromic materials are each most excitable to fluoresce at a particular associated energy, there will be a considerable "overflow" from higher read-energy materials to lower read-energy materials. The combined read beam energies suitable to read a high read-energy material will also cause a lower read-energy material (in a proper state) to fluoresce. In the case of reading, this lack of discrimination by the interrogating energy beams will not be a problem because, in accordance with the principles of fluorescence, the frequency of light emission from each fluorescing material will be a property of the material, and not of the interrogating radiation beams. The differing frequency "readout" radiation can be discriminated. Indeed, all the several photochromic materials of a selected domain can typically be read simultaneously, if so desired.

Also in a 2-P 3-D or 4-D color memory, the criteria that each photochromic material should be insensitive to reading or writing beams taken individually but sensitive—by the principles of two photon absorption—to the combined energies of both beams taken together is magnified, and multiplied, by the number of separate photochromic materials, and the number of differing energy beams, involved in operation of the memory. Nonetheless to being different materials, with different peak energies of absorption, each of several selected-frequency selected-energy energy beams that is used, in combination with another, second, selected-frequency selected-energy energy beam to write, or to read, any selected one of the photochromic materials must be individually insufficient so as to induce any appreciable change in the non-selected materials of whatsoever state. In general, the strict criteria of non-interference between any of the several photochromic materials and any of the multiple radiation beams is realized by selecting photochromic material with similar, relatively high, energy sensitivities to being written or read while interrogating each, and all, material with energy beams that are individually of such a low energy so as to being consequential. It is, or course, only where selected energy beams interact with a correspondingly selected photochromic material by process of two photon absorption that change transpires.

8.5. Complimentary Photochromic Materials: Stability of Each Material in the Presence of the Same Interrogating, and All Fluorescent Produced, Radiation as is Associated with Each and Every Other Material As with the photochromic material of a 2-P 3-D memory, each of the several photochromic material of a 2-P 3-D color memory preferably undergoes a change during writing that is stable. The preferred changes are in isomeric molecular form. The two states of each photochromic material are indefinitely stable in the absence of radiation (including infrared, heat, radiation), and will typically maintain an assumed state for at least a period of years. However, by "stability" it is mean that each assumed state of each of the photochromic materials should also persist in the face of such radiation fluxes as are constantly being used—and not necessarily in other domains—within the memory. First, both assumed forms of each and all the photochromic materials are stable to each of the individual radiation beams used to write or to read any of the photochromic materials. Second, both assumed forms of each and all the photochromic materials are stable to the combined radiation beams used to read any of the photochromic materials—but it should be recognized that one or more photochromic materials within any selected domain may actually be read, and induced to fluoresce if in the "write" state (only). This fluorescence not change the form of the emitting molecules—going part way to making that the memory is non-destructive read-out. Third, the florescent emission(s) occurring from, and only from, the coincident-radiation-beam-interrogated "written" form of any of the photochromic materials will not suffice to change the form of not only these, but also any other, photochromic materials. In other words, each photochromic material is insensitive to change form due to the fluorescent emission of any other material. This third and last criteria prevents crosstalk, or contamination, of any adjacent or co-located photochromic material during the reading of any other, adjacent or co-located, photochromic material. Each changed form must, and does, have—as well as a different molecular structure—a completely different absorption and emission spectra—providing thereby the two states necessary for 3-D storage of binary information.

The reading and writing radiations excite the molecules of the photochromic chemicals located inside a volume in preference to the surface. This is achieved because the wavelength of each beam is longer and has less energy than the energy gap between the ground state and first allowed electronic level. However, if two beams are used, the energy sum of the two laser photons must be equal to or larger than the energy gap of the transition. It is also important to note that two distinct structures of the particular molecular species used as the storage medium.

Such an example is provided by the changes in molecular structure occurring in photochromic materials such as spirobenzopyrans after the simultaneous absorption of two photons. To write information in a 3-D storage memory device that contains SP molecules as the recording medium requires excitation in the UV region of the spectrum because SP absorbs at that region, i.e., (missing character) 260 and 355 nm. Excitation to this state is provided by the two-photon absorption of either a 1064-nm photon, or two 532-nm photons, corresponding to a 266-nm photon energy, where 266 and 355 nm are the wavelengths of the two absorption maxima of the SP molecule.

8.6 Preparation of an Admixture of Multiple Photochromic Chemicals, and Observation of the Composite Spectra One useful class of appropriately related photochromic chemicals, or dyes, consists essentially of compounds taken from the group consisting of azo compounds, anthraquinone compounds, coumarin compounds, sulfur hodamine compounds and rhodamine compounds. Fluorescent dyestuffs based on coumarin are particularly suitable. Yellow resolin dye with a very sharp single absorbance peak at about 45 nm is a superb representative of a preferred species of dye.

Polystyrene latex such as is suitable for the transparent stable matrix of a color radiation memory may be readily purchased. An elongated molded block (approximately 0.1× 0.1×0.4 centimeters) of the same was put in a closed, non-airtight test-tube. For purification, the polystyrene block was washed twice with 70% ethanol and vacuum dried. The block was then dyed with each one of five different colors: white (Blankophor MAR), yellow (Resolin-Brilliant-Gelb 10GN 200%), violet (Resolin-Rot-Violett FBL 200%) and blue (Resolin-Brilliant-Blau BGLN 200%) obtained from Bayer AG, Leverkusen, FRG, and red (Terasil Rot E-BST) obtained from CIBA-GEIGY AG, Wher, FRG. For purification prior to use, the yellow and blue dyes were recrystallized in dicholoromethane. For dyeing red or violet, 400 mg of the dye, 2 ml aqua bidestillata and 1 ml of a 1% aqueous emulsion of Levegal PTN (Bayer AG, Leverkusen, FRG) were combined in the test-tube containing the cube. For white and blue color, 8 ml of a solvent-mixture of toluene/dimethylformamide (DMF) (85/15% by volume), saturated with the dye at 80° C. (white dye) or 100° C. (blue dye), was added to the cube. For yellow color, 100 mg of the dye and 1 ml 1,2,4-trichlorobenzene were added to the cube. These mixtures were then heated in a boiling water bath for 5 (yellow dye) or 90 minutes (white, red and violet dye) or in a paraffin bath at 125° C. for 90 min (blue dye). Any remaining free dye unabsorbed by the cube was washed out with absolute ethanol. For that purpose, the block was suspended in absolute ethanol, ultrasonicated, centrifuged (3 min, 2500 g) and the supernatant drawn off. The purified block was vacuum dried, re-suspended in the isodense solution (see above), ultrasonicated and divided into appropriate portions, i.e. 4 portions containing approximately .01 $cm^3$ each, for later use. The ratio of dye to cube volume of the matrix produces a defined amount, approximately 30 picograms, of dye in each 100 $um^3$ of the cube's volume.

To test the stability of dye-attachment to the cube, a cube dyed with all colors was suspended in 2 ml saline and stored for two months. When analyzing the dye content in the supernatant after micro-filtration of four cube samples, less than 0.1% of dye was recovered. To test the homogeneity of staining, the difference in dye recovered from 6 aliquots was determined and found to be less than 1.5%.

Figure 18A:
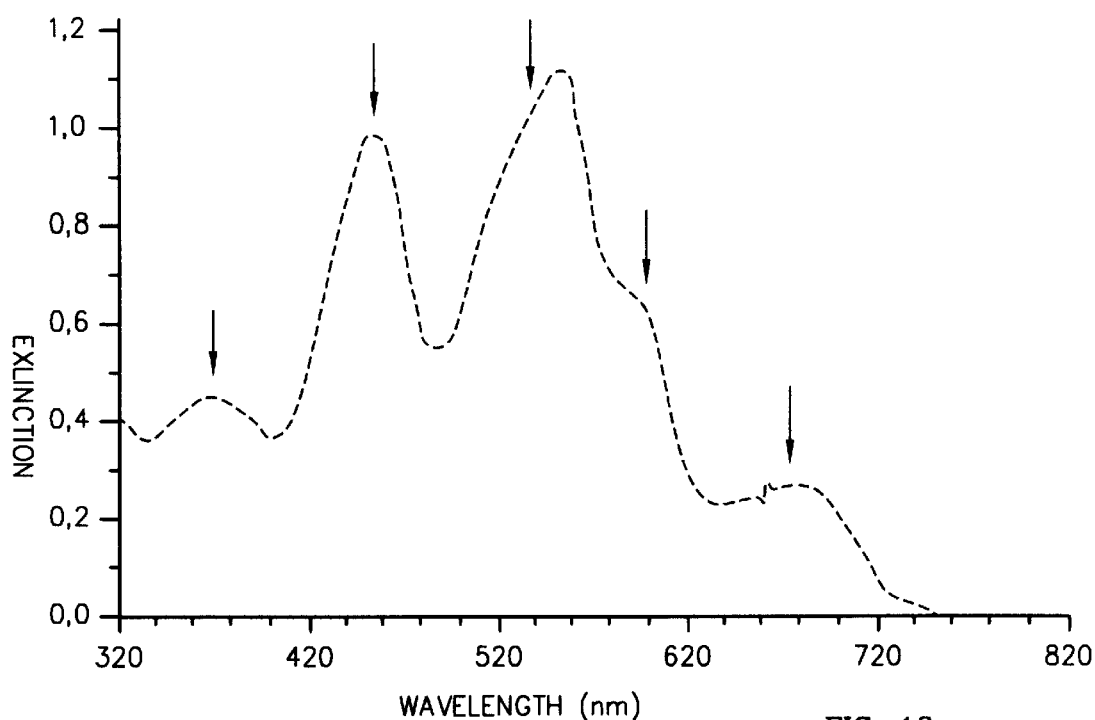
FIG. 18a is a graph of a composite absorbance spectrum of five (5) different colors of photochromic chemicals as may be co-located in an individual domain of a color radiation/optical memory in accordance with the present invention.
Figure 18B:
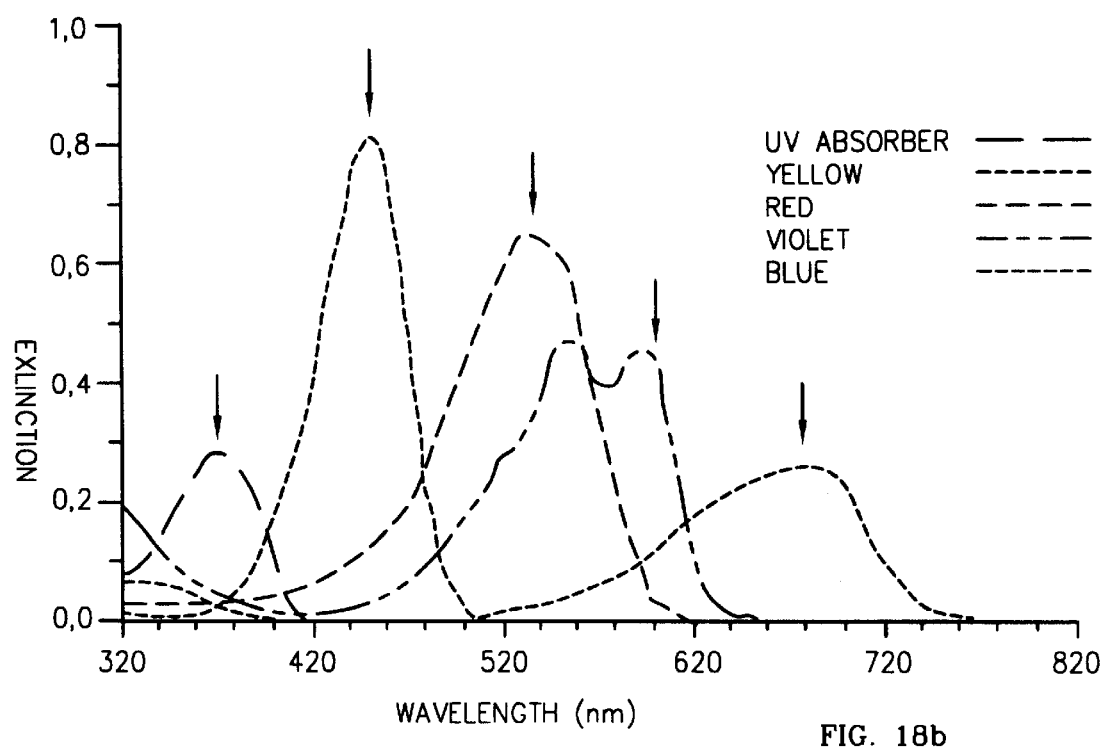
FIG. 18b is a graph showing the contributions of the five (5) different colors to the composite spectrum previously seen in FIG. 18a, such as may be (but such as is not normally during operation of a color radiation/optical memory) mathematically derived.

The photometric absorption of the dye-solution applied to the cube was determined by a Diode-array UV/visible Spectrophotometer (Model 8452A, Hewlett Packard) (wave length range: 190–820 nm, 2 nm optical band width). The composite spectra of the dye-solution is shown in FIG. 18a. It is mathematically resolvable into the spectrum of the single constituents as shown in FIG. 18b by a matrix inversion technique. See Schosser R, Arfors K-E, Messmer K: MIC-II—A program for the determination of cardiac output, arterio-venous shunt and regional blood flow using the radioactive microsphere method. Comput Programs Biomed 1979;9:19–38.

The absorption spectrum of each dye is measurable separately to serve as a reference for the matrix inversion, determining the contribution of each color to the measured composite spectra at five fixed wavelengths: 370, 448, 530, 594 and 672 nm (arrows in FIG. 18a and FIG. 18b). Within 10 seconds 100 single measurements of 0.1 second duration each were performed and averaged, such that the standard deviation of each absorbance value was less than 0.1% of the mean. The amount of dye in a given sample were adjusted to achieve absorbance values of no more than 1.3 AU (absorbance unit, 1 AU=–1 g (10% light transmission/ 100%)) and thus assure the linearity between absorbance and dye concentration according to the Lambert-Beer law. Samples with absorbencies higher than 1.3 AU were diluted and analyzed again. The lower limit of detection which could be reliably distinguished from background noise was 0.05 AU.

To test the error of separation by spectrophotometry and matrix inversion resolution of composite spectra, an overdetermined set of linear equations as previously applied by Baer et al to RM was used. See Baer R W, Payne B D, Verrier E D, Vlahakes G J, Molodowitch D, Uhlig P N, Hoffman J I E: Increased number of myocardial blood flow measurements with radioactively-labeled microspheres. Am J Physiol 1984;246:H418-H434.

Therefore, the absorbance of each color in the dye-solution was determined at three different wavelengths: at the normally used wavelength as described above, as well as at the wavelengths 10 nm above and below this wavelength. A prerequisite for this approach is an equal variance of absorbance or a normalization with respect to the variance. Therefore, the square of the difference between the measured and the calculated absorbance values was weighted with the variance of 100 consecutive measurements.

To test potential interactions of different colors within a composite spectrum, six (6) increasing concentrations of a fifth dye were added to a given four color-set. A linear regression analysis was performed between increasing absorbance of the added fifth color and the absorbance of the remaining four colors, using mean values of six-fold determinations for each added color.

To test the completeness of recovery of each dye by the matrix inversion resolution of a composite spectrum, the same set of data was used. The increase in total absorbance after addition of a fifth dye to a given four color-set was measured. After calibration of total absorbance within the spectral range with the absorbance value at the predetermined wavelength for each color separately, the measured increase in total absorbance after addition of a fifth color could be compared to the absorbance value attributed to this fifth color by matrix inversion resolution of the composite spectrum.

9. Durability of Written Form

Even though we have shown that we can write and read information in a 3-D format using photochromic materials, several critical characteristics must be examined before these materials may be considered as practical candidates for 3-D memory devices. These properties may include the stability of the written form at different temperatures, fatigue as a function of the number of cycles performed, laser power requirements for writing and reading, crosstalk, number of molecules per written bit, absorption cross section, and fluorescence quantum yield. Studies have been and are currently being performed in most of these areas. The Spiro form of spyran materials, which correspond to 0 in the binary code or write form, is stable at room temperature, however, the written form is rather unstable and was found to revert to the original form within a few hours at room temperature. We have measured the decay kinetics and mechanism from 77 to 273 K with an accuracy of ±2 K keeping the sample in a cryostat, which allowed us to measure the stability of the written form as a function of temperature. The sample was kept at a particular temperature and irradiated with 532-nm photons. Then the fluorescence intensity of the written form was recorded as a function of the number of reading cycles.

Figure 17A:
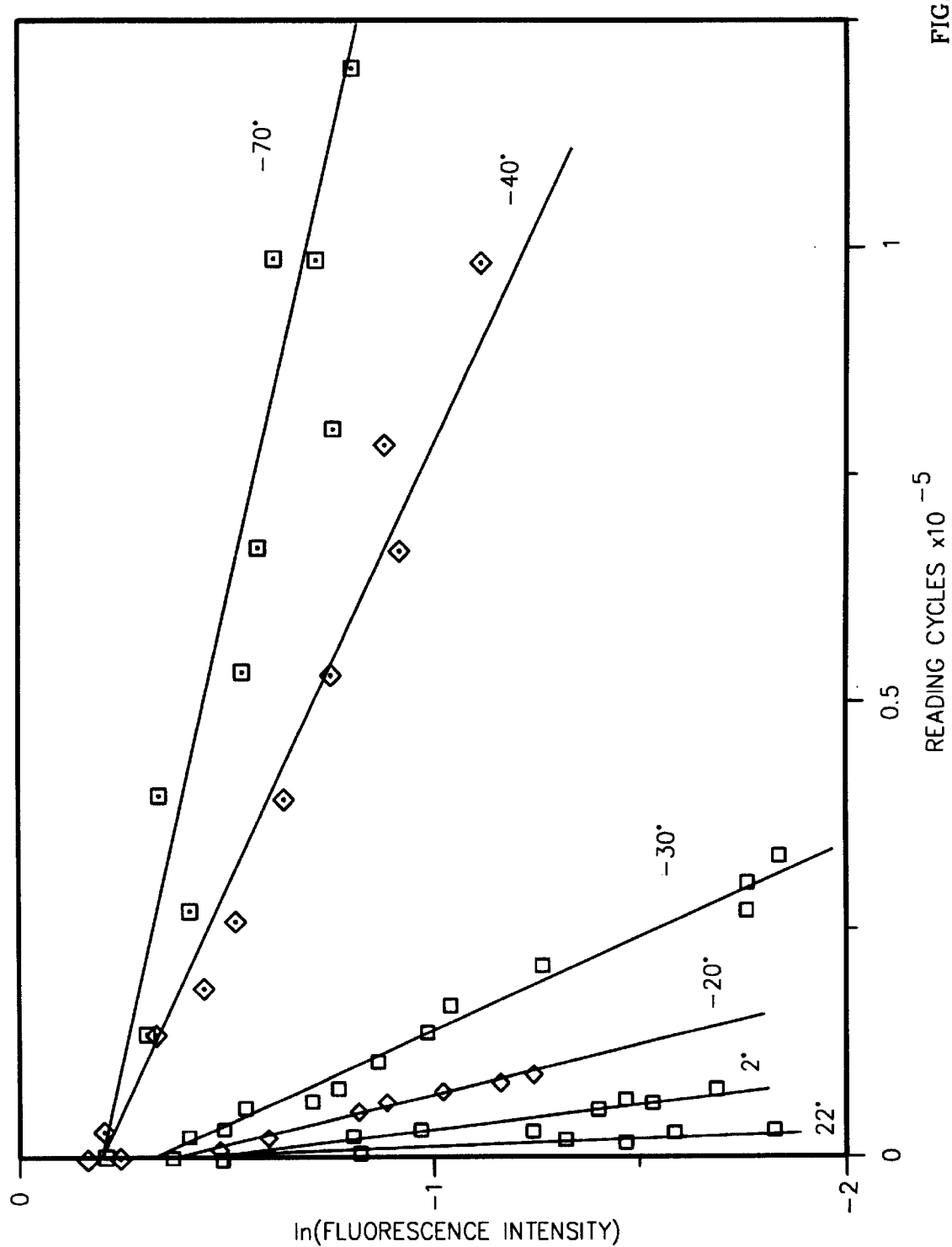
FIG. 17a is a graph plotting the fatigue of 1SP in PMMA as a function of temperature, the graph showing fluorescence intensity versus numbers of cycles at various temperatures and at 0.5 mJ/cm$^2$.

The decay of intensity as function of laser irradiation, at 0.5 Mj, at various temperatures is shown in FIG. 17a. When 1SP was dispersed in a PMMA solid block, the lifetime of the written form was found to increase as the temperature decreased. Similar behavior was observed in other polymer host. These data are presented in Table 2 of FIG. 17b. A brief examination of the data displayed in this table makes it rather obvious that the rate of decay decreases as a function of temperature. Also, we have shown before, when sufficiently low temperatures have been reached, i.e., −80° C., the written form becomes stable indefinitely. Activation energy parameters are, we believe, mostly responsible for the decay because to some extent they may prevent the isomerization process from occurring even though rapture of the C—O bond may still be possible at these low temperatures. In addition, spiropyran behave differently depending on their structure. For example spiropyrans, which have the structures shown in FIG. 5 when dispersed in a solid polymer matrix (PMMA or PS), exist in a thermoequilibrium of two forms: a clear spiropyran form A and a colored merocyanine form B. The equilibrium concentration of either the colored or clear form depends on the specific molecular components of SP. Thus, SP 1–3 at room temperature exists almost exclusively in the spirocyclic form A; therefore, a solid polymer cube containing these molecules is colorless. SP 4 embedded in a polymer matrix exists in both thermoequilibrium forms A and B. The samples that contain SP 5 are intensively colored due to considerably higher equilibrium concentration of the colored form B compared to form A. The absorption spectrum of the merocyanine form of 1SP and 2SP is blue shifted when the PS matrix ($\epsilon$=2.5) is substituted by the more polar PMMA ($\epsilon$=3.7). See TABLE 3 in FIG. 17c. UV excitation of the closed form A results in the heterolytic cleavage of the C—O bond followed by isomerization to merocyanine from B, which leads to very strong coloration of samples. After irradiation, the samples encounter reversible rearrangement to the initial equilibrium form, which occurs at room temperature. The rate of thermal discoloration of merocyanine forms also depends on both the composition of SP and the polymer matrix.

Multiexponential thermal decay was observed in the photo-induced forms of SP molecules dispersed in the polymer matrices we studied. Such multiple exponential behavior is expected because of the many types of merocyanine isomers and the abundant nonequivalent sites present in a polymer matrix. These conditions lead to the difference in cyclization rates of SP molecules located in different sites of the polymer matrix. However, to the first approximation, thermal decay kinetics may be described as a sum of two exponentials. The decay constants calculated under this approximation are shown in Table 3 of FIG. 17c. Replacement of one polymer by another polymer with higher polarity may cause the decrease in the rate of dark decay of the merocyanine forms. Apparently, this effect can be attributed to the relative stabilization of the polar structure of the merocyanine form by the polar environment of the matrix. The effect of the thermal decay processes on the stored information is obviously very detrimental to any device because it causes the information stored to be deleted. To alleviate this effect, the material is kept at low temperatures, i.e., −40° or lower, where the decay of the written form is negligible. It is extremely important of course to find molecules that have both forms stable at room temperature. To achieve this, we are studying other types of photochromic molecules and also investigating means for the stabilization of the written form of 1SP and other spiropyrans.

In accordance with the preceding explanation, variations and adaptations of a color radiation/optical memory in accordance with the present invention will suggest themselves to a practitioner of the optoelectronic and/or photochemical arts. In accordance with the many possible variations and adaptations of the present invention, the scope of the invention should be determined in accordance with the following claims, only, and not solely in accordance with those particular embodiments within which the invention has been taught.

What is claimed is:

1. A radiation memory comprising:
   a radiation-transparent matrix;
   a plurality of photochromic chemicals contained within the matrix,
      each of which chemicals has uniquely associated spectrum of absorption showing a maxima that is substantially non-overlapping with the maxima of the absorption spectra of all other ones of the plurality of chemicals,
      each of which chemicals is susceptible to radiation near its absorption maxima to individually change from a stable first to a stable second condition, and
      each of which chemicals has and exhibits a differential sensitivity to radiation depending upon whether it is within its first or its second condition; and
   radiation means for radiating the chemicals with at least two separate-frequency radiations having a collective combined energy that is near the absorption maxima of a selected one only of the chemicals so as to change this one only chemical from its first to its second stable condition by process of plural-photon absorption while unsubstantially changing any other, un-selected, chemicals.

2. The radiation memory according to claim 1 wherein the photochromic chemicals comprise:
   fluorescent chemicals each of which has a uniquely associated spectrum of fluorescent emission as well as absorption, both the absorption and emission spectrums of each chemical showing maxima that are substantially non-overlapping with the maxima of the absorption and emission spectra of all other chemicals,
   wherein the differential sensitivity to radiation that is exhibited by each chemical depending upon whether it is within its first or its second condition is a differential sensitivity to fluoresce.

3. The radiation memory according to claim 2 wherein at least one of the fluorescent chemicals is from the group consisting of
   spirobenzopyran, rhodamine, cumarin and anthracene.

4. A radiation memory comprising:
   a stable radiation-transparent matrix;
   a plurality of fluorescent photochromic chemicals contained within the matrix,
      each of which plurality of fluorescent photochromic chemicals has uniquely associated spectrums of absorption and of fluorescent emission each of which spectrums shows maxima that are substantially non-overlapping with the maxima of the spectra of absorption and of fluorescent emission of all other ones of the plurality of fluorescent photochromic chemicals,
      each of which plurality of fluorescent photochromic chemicals is susceptible to radiation near its absorption maxima to change from a stable first to a stable second isomeric molecular form, and
      each of which plurality of fluorescent photochromic chemicals selectively fluoresces, depending upon whether it is within its first or its second condition, in response to stimulating radiation of a lower energy than is the energy of its absorption maxima; and
   write radiation means for radiating the plurality of fluorescent photochromic chemicals contained within the matrix with two write radiation fluxes having a collective combined energy that is near the absorption
maxima of a selected one only of the plurality of
fluorescent photochromic chemicals
so as to change this selected one only chemical from its
first to its second isomeric molecular form by process of two-photon absorption at, and only at, a write
intersection region where the two write radiation
fluxes are temporally and spatially coincident,
while unsubstantially changing any of the plurality of
fluorescent photochromic chemicals located anywhere outside the write intersection region, and
where the two write radiation fluxes are not temporally and spatially coincident,
while unsubstantially changing any of other,
un-selected, ones of the plurality of fluorescent photochromic chemicals even within the write intersection region where the two write radiation fluxes are
temporally and spatially coincident,
wherein one only of the plurality of fluorescent photochromic chemicals, located within the write intersection region, is changed; and
read radiation means for radiating the plurality of fluorescent photochromic chemicals contained within the
matrix with two read radiation fluxes having a collective combined energy that is less than the absorption
maxima of any of the plurality of fluorescent photochromic chemicals
so as to induce fluorescence by process of two-photon
absorption in all of the plurality of fluorescent photochromic chemicals that are in the second isomeric
form, only, and which are located at, and only at, a
read intersection region where the two read radiation
fluxes are temporally and spatially coincident,
while unsubstantially inducing the fluorescence any of
the plurality of fluorescent photochromic chemicals,
regardless of their isomeric molecular form, located
anywhere outside the read intersection region, and
where the two read radiation fluxes are not temporally and spatially coincident, and
while unsubstantially changing any of the plurality of
fluorescent photochromic chemicals that are located
anywhere, and even within the read intersection
region where the read two radiation fluxes are temporally and spatially coincident,
wherein all of the plurality of fluorescent photochromic
chemicals that are both within their second isomeric
molecular form, and that are also within the read
intersection region are induce to fluoresce, each at its
own uniquely associated spectrum of fluorescent
emission.

5. The radiation memory according to claim 4 further
comprising:
a monochromotor intersecting the fluorescent emissions
of all the plurality of fluorescent photochromic
chemicals, and separately spatially directing each such
emission in accordance with its unique spectrum so as
to produce a plurality of colored illuminations, one for
the emission of each of the plurality of fluorescent
photochromic chemicals; and
a plurality of detectors, intercepting the plurality of colored illuminations, for detecting these illuminations as
an indication that a corresponding one of the plurality
of fluorescent photochromic chemicals located within
the read intersection region either was, or was not, in its
second isomeric molecular form.

6. The radiation memory according to claim 5 wherein the
monochromotor comprises:
a prism.

7. A method of radiatively writing and reading a binary-encoded radiation memory store comprising:
co-locating plurality of photochromic chemicals as a
continuum within a radiation-transparent stable matrix,
each chemical having uniquely associated spectrum of
absorption showing a maxima that is substantially
non-overlapping with the maxima of the absorption
spectra of all others of the plurality of photochromic
chemicals;
first-radiating at each of a plurality of write times the
plurality of chemicals, each first-radiating as occurs
upon each write time being with at least two separate-frequency radiations having a collective combined
energy that is near the absorption maxima of a selected
one only of the plurality of chemicals so as to change
this one only chemical from its first to its second
condition by process of plural-photon absorption while
unsubstantially changing any other, un-selected, one of
the plurality of chemicals;
second-radiating at a read time the plurality of chemicals
with at least two separate-frequency radiations having
a collective combined energy that is less than the
absorption maxima of any of the plurality of chemicals
so as to cause by process of two-photon absorption
each and all of the plurality of chemicals in common to
each and all exhibit a radiatively-detectable event that
is selectively dependent upon whether each one of the
plurality of chemicals has previously been changed by
the first-radiating to its second condition;
detecting in response to the second-radiating the
radiatively-detectable events selectively exhibited by
each separate one of all the plurality of chemicals
nonetheless that each and all do selectively exhibit
these events in common during the second-radiating.

8. The method of radiatively writing and reading a binary-encoded radiation memory store according to claim 7
wherein the radiatively-detectable event selectively exhibited in response to the second-radiating comprises:
fluorescing each chemical at an uniquely associated color
dependent upon whether each chemical has previously
been changed by the first-radiation to its second condition;
and wherein the detecting comprises:
spectrally separating the color fluorescence of each of
the chemicals; and
detecting the fluorescence of each color as an indication
of whether a corresponding chemical is in its second
condition.

9. A radiation memory apparatus for storing binary information by radiation, the apparatus comprising:
a matrix of a radiation-transparent stable material;
a plurality of photoactive media contained and distributed
all together within the matrix, each individual medium
of the plurality of media individually changing from a
first to a second stable form in response to radiation
falling within a transition energy spectrum that unsubstantially overlaps the corresponding transition energy
spectrum of any other ones of the plurality of photoactive media;
first write radiation means for first-radiating with a first
beam of first-selected-energy radiation at least a
selected portion of the matrix, and all the plurality of photoactive media contained within this portion, in order to excite some one or ones, including a selected one, of the plurality of photoactive media that are contained within this portion each from a first state to a new virtual state; and second write radiation means for second-radiating with at least one second beam of second-selected-energy radiation at least a selected part of the selected portion of the matrix, and of the plurality of photoactive media contained within this selected part, simultaneously with the first-radiating in order to change the selected one, only, of the plurality of photoactive media that are within this selected part of this selected portion from its virtual state to its second stable state by process of plural-photon absorption;

wherein the combined energies of the first-selected-energy radiation and the second-selected-energy radiation jointly fall within the transition energy spectrum of the selected one of the plurality of photoactive media;

wherein the combined energies of the first-selected-energy radiation and the second-selected-energy radiation jointly cause the selected part of the selected portion of the selected one of the plurality of photoactive media to change from its first to its second stable form by process of plural-photon absorption;

but wherein the combined energies of the first-selected-energy radiation and of the second-selected-energy radiation, although sometimes jointly exceeding a transition energy of one or more of un-selected ones of the plurality of photoactive media, are substantially ineffectual to jointly cause any change in these un-selected ones because there is an insubstantial overlap of the transition energy spectra of these un-selected ones of the plurality of photoactive media with the transition energy spectrum of the selected one of the plurality of photoactive media;

wherein but one single photoactive medium, out of all the plurality of photoactive media that are all contained and distributed together in the matrix, is changed.

10. The radiation memory apparatus according to claim 9 for storing binary information in three-dimensional volume by radiation wherein the matrix comprises;

a three-dimensional matrix of a radiation-transparent stable material; and wherein the plurality of photoactive media are contained and distributed all together in a continuum within the three-dimensional matrix;

wherein the first radiation means is first-radiating with a first beam of first-selected-energy radiation at least a selected portion of the three-dimensional matrix;

wherein the second radiation means is second-radiating with at least one second beam of second-selected-energy radiation at least a selected part of the selected portion of the three-dimensional matrix; and wherein but one single photoactive medium, out of all the plurality of photoactive media that are contained and distributed in a three dimensional matrix as a continuum, is changed.

11. The apparatus according to claim 9 further comprising:

read means for radiatively reading the changed state of the selected part of the selected portion of the selected one of the plurality of photosensitive media as stored binary-stated information.

12. The apparatus according to claim 11 wherein the read means comprises:

first read radiation means for third-radiating with a third beam of third-selected-energy radiation at least a selected portion of the matrix, and all the plurality of photoactive media contained within this portion, in order to excite some one or ones, including a selected one, of the plurality of photoactive media that are contained within this portion each from a first state to a new virtual state;

second read radiation means for fourth-radiating with at least one fourth beam of fourth-selected-energy radiation at least a selected part of the selected portion of the matrix, and of the plurality of photoactive media contained within this selected part, simultaneously with the third-radiating in order to all the plurality of photoactive media that are within this selected part of this selected portion to fluoresce, each in an associated color, by process of plural-photon absorption; and monochromator means for spatially separating the fluorescence colors as arise at all the plurality of photoactive media that are within the selected part of the selected portion in response to, jointly, the third-radiating and the fourth-radiating into a plurality of colored light readout beams; and a plurality of detector means intercepting the plurality of colored light readout beams for detecting as binary-stated information the changed state of the selected one of the plurality of photosensitive media that is within the selected part of the selected portion as stored binary-stated information;

wherein all the binary-stated information that is within all the changed states of all the plurality of photosensitive media that are within the selected part of the selected portion is radiatively read at the same time, but the binary-stated information as is uniquely associated with the changed state of any individual one of the plurality of photosensitive media is uniquely and unambiguously detected.

13. The apparatus according to claim 11 wherein the monochromator means comprises:

a prism.

14. The apparatus according to claim 11 wherein each of the plurality of photoactive medium that is in its second stable form, but not in its first stable form, fluoresces in response to radiation having an energy that is at least equal to a threshold energy which is less than the transition energy of any of the plurality of photoactive media;

and wherein the reading means comprises:

means for third-radiating with a third beam of third-selected-energy radiation a selected portion of the matrix, and all of the plurality of photoactive media contained within this portion; and means for fourth-radiating with at least one fourth beam of fourth-selected-energy radiation at least a selected part of the selected portion of the matrix, and of the plurality of photoactive media contained within this portion, simultaneously with the third-radiating in order to cause all ones of the plurality of photoactive media that are both (i) within this selected part of this selected portion, and (ii) in a second stable for, to fluoresce by process of plural-photon absorption;

wherein the combined energies of the third-selected-energy radiation and the fourth-selected-energy radiation are equal to the threshold energy so as to jointly cause all ones of the plurality of photoactive media that are within the selected portion to collectively fluoresce.

15. The apparatus according to claim 14 further comprising:
monochromator means for splitting apart the collective fluorescent emissions of all the all ones of the plurality of photoactive media that are within the selected portion; and
at least one detector means for detecting the fluorescence from a one of the plurality of fluorescing photoactive media that is within the selected portion.

16. A writable binary radiation memory comprising:
an admixture of a plurality of photochromic chemicals
each of which of which chemicals individually exhibits a first and a second substantially stable form,
each of which chemicals absorbs in its first form radiation of an associated first threshold energy to change to its second stable form and thereafter tends to remain in this second stable form, and
each of which chemicals absorbs in its second isomeric form radiation of an associated second threshold energy, less than any of the first threshold energies, to fluoresce while still remaining in its second form;
means for selectively providing and directing onto the admixture of photochromic chemicals at a first time a selected-first-energy radiation, lower in energy than any and all of the first and the second threshold energies, the first-energy radiation being unable individually to cause either any change in form or any fluorescence of any of the photochromic chemicals within the admixture;
means for selectively providing and directing onto the admixture of photochromic chemicals at the first time a selected-second-energy radiation, again lower in energy any and all of the first and the second threshold energies, the second-energy radiation being unable individually to cause either any change in form or any fluorescence of any of the photochromic chemicals within the admixture;
wherein, however, the selected-first-energy and the selected-second-frequency radiation together jointly cause, by process of two-photon absorption, that essentially a selected one, only, of the photochromic chemicals within the admixture will change from its first to its second stable form.

17. The memory according to claim 16 that is further readable, the writable and readable memory comprising:
means for providing and directing onto the admixture of photochromic chemicals at a second time a selected-third-energy radiation, lower in energy than either of the first and the second threshold energies, the third-energy radiation being unable individually to cause either any change in form or any fluorescence of any of the photochromic chemicals within the admixture;
means for selectively providing and directing onto the admixture photochromic chemicals at the second time a selected- fourth-energy radiation, again lower in energy than either of the first and the second threshold energies, the selected-fourth-energy radiation being unable individually to cause either any change in form or any fluorescence of any of the photochromic chemicals that are within the admixture;
wherein, however, the selected-third-energy and the selected-fourth-energy radiation together cause, by process of two-photon absorption, fluorescence of any and all such of any and all the photochromic chemicals that are within the admixture as are already in their second stable form, only, with neither any change occurring to, nor any fluorescence resulting from, and all of the photochromic chemicals within the admixture as are in their first form.

18. A radiation memory system comprising:
a three-dimensional volume containing a plurality of active medium within each which medium a stable change can be locally radiatively induced by localized radiation having a transition energy that is individually associated with the medium, the particular transition energy spectrum of each medium being sufficiently distinct and spectrally non-overlapping with any of the transition energy spectra of any other of the plurality of mediums so that each medium is changed in form substantially by only radiation of an energy that is within its own associated transition energy spectrum, and no medium is significantly changed in form by radiation of an energy that is within the transition energy spectrum associated with any other medium;
a radiation source of a first radiation beam having a selected first-energy, and also of second radiation beam having a selected second-energy, where the combined energies of the first and second radiation beams jointly total an energy that is within the transition energy spectrum of a selected one medium, and are thus adequate and sufficient so as to be capable of jointly radiatively causing a stable change in this selected one medium, only, out of all the plurality of active mediums that are within the volume, but where each of the first and the second beams is individually insufficiently energetic so as to be capable of radiatively causing any change within any of the plurality of active medium that are within the volume;
first beam-directing means for directing the first beam of radiation to illuminate a first portion, less than the entirety, of the volume containing the plurality of active mediums;
spatial encoding means for spatially amplitude-encoding a single wavefront of the second beam of radiation so that at least some regions of the wavefront are devoid of significant energy flux;
second beam-directing means for directing the spatially-encoded second beam of radiation to illuminate the volume containing the plurality of active mediums in order to intersect therein the first beam of radiation in, and at, an intersection volume, the intersection volume occupying at least a second portion of the first portion of the entire volume containing the plurality of active mediums;
wherein certain parts of the intersection volume that correspond to those regions of the second beam of radiation which are devoid of significant energy flux remain unchanged;
wherein, meanwhile, other parts of the intersection volume that receive illumination from both the first beam and the second beam are changed responsively to such joint illumination by a process of two-photon absorption.

19. A volume radiation memory comprising:
a radiation-transparent three-dimensional stable matrix;
a plurality of photoactive chemicals contained in a three-dimensional continuum within the stable matrix, each of which photoactive chemicals being sensitive in its absorption band to an individually associated transition radiation energy so as to undergo an anomalous, stable, change in a physical property that affects the passage of radiation through the photoactive chemical, where the transition radiation energies that are individually associated with each of the photoactive chemicals is sufficiently distinct and spectrally non-overlapping with any of the transition radiation energies that are associated with any others of the photoactive chemicals so that each photoactive chemical is radiatively changed in its physical property only by radiation energy of its own associated transition radiation energy, and no photoactive chemical is appreciably changed in form by a transition radiation energy that is associated with any other photoactive chemical, means for producing two radiation pulses,
each of which radiation pulses has an individual energy that is non-interactive with any of the photoactive chemicals so as to cause the anomalous, stable, change in the physical property of any of the photoactive chemicals,
each of which radiation pulses is substantially unaffected in a passage along a path through the volume, and through the continuum of photoactive chemicals that are within the volume, regardless of what physical property is exhibited by any one or ones of the photoactive chemicals anywhere along the path or portions thereof,
the two radiation pulses jointly possessing a selected total energy that is equal to the transition radiation energy of a selected one of the photoactive chemicals;

means for guiding the two radiation pulses to a locus of a temporal and a spatial intersection within the volume, this locus of temporal and spatial intersection defining a selected portion of the volume,
within which selected portion the quantum mechanical equations of two-photon interaction are satisfied for a selected one only of the photoactive chemicals, therein to cause this selected one photoactive chemical, only, that is located at this selected portion, only, to change in physical property,
meanwhile that photoactive chemicals in all other portions of the volume outside this intersection locus are unaffected by, and unreactive with, either and both radiation pulses, and
meanwhile that even such un-selected photochromic chemicals as are within the selected portion are unaffected by, and unreactive with, either and both radiation pulses;

wherein each radiation pulse is by itself un-reacted with, and unaffected by, all the photoactive chemicals in all the volume, passing substantially straight through these photoactive chemicals regardless of the prevailing physical properties of any and all of these photoactive chemicals;

wherein a locus of spatial and temporal intersection of both radiation pulses defines a selected portion of the volume, and at this selected portion, only, a selected one photoactive chemical, only, is reacted with both radiation pulses by process of two-photon interaction so as to change in its physical property.

20. In a volume radiation memory containing a plurality of photoactive chemicals in a three-dimensional continuum, a method of reacting radiation with and only with a selected one of a plurality of photoactive chemicals at and only at a selected portion of a volume so as to radiatively change a selected photoactive chemical, only, at this selected portion of the volume, only, while both un-selected photoactive chemicals located anywhere in the volume, and all photoactive chemicals located at un-selected portions of the volume, are unchanged, the method comprising:

illuminating a three-dimensional volume containing a plurality of photoactive chemicals in a three-dimensional continuum,
each of which photoactive chemicals is sensitive in its absorption band to an individually associated radiation energy so as to undergo an anomalous, stable, change in a physical property, which physical property affects the passage of radiation through the photoactive chemical,
the radiation energies that are individually associated with each of the photoactive chemicals being sufficiently distinct and spectrally non-overlapping with any of the radiation energies that are associated with any others of the photoactive chemicals so that each photoactive chemical is radiatively changed in its physical property by only its own associated radiation energy, and no photoactive chemical is changed in form by a transition energy that is associated with any other photoactive chemical, with two radiation pulses,
each of which has an individual energy that is both non-interactive with any of the photoactive chemicals so as to cause the anomalous, stable, change in the physical property of any of the photochromic chemicals, and that is substantially unaffected in passage along a path through the volume, and through the continuum of photoactive chemicals within the volume, regardless of what physical property any one or ones of the photoactive chemicals exhibits anywhere along the path or portions thereof,
so that a locus of a temporal and a spatial intersection of the two radiation pulses defines a selected portion of the volume within which selected portion the quantum mechanical equations of two-photon interaction are satisfied for a selected one only of the photoactive chemicals within this selected portion, therein to cause this selected one photoactive chemical, only, that is located at this selected portion, only, to change in physical property
while photoactive chemical in all other portions of the volume outside this intersection locus are unaffected by, and unreactive with, either and both radiation pulses, and
while even such un-selected photochromic chemicals as are within the intersection locus are also unaffected by, and unreactive with, either and both radiation pulses;

wherein each radiation pulse is by itself un-reacted with, and unaffected by, all photoactive chemicals in all the volume, passing substantially straight through these photoactive chemicals regardless of the prevailing physical properties of any and all of these photoactive chemicals;

wherein a locus of spatial and temporal intersection of both radiation pulses defines a selected portion of the volume, and at this selected portion, only, a selected one photoactive chemical, only, is reacted with both radiation pulses by process of two-photon interaction so as to change in its physical property.

21. A radiation memory comprising:
a stable matrix containing a plurality of photochromic chemicals each of which is responsive to a different first energy to transition from a first to a second stable state, and each of which is responsive to same second energy, higher than any of the first energies, to fluoresce at an individually-associated frequency that is substantially non-overlapping with any frequency at which any other ones of the plurality of photochromic chemicals fluoresces; and means for selectively radiating portions of the stable matrix so that, at first times and upon radiation with two radiation beams each of a selected energy that jointly sum to a one, selected, first energy, only an associated one of the plurality of photochromic chemicals contained within the radiated portion changes from its first to its second stable state by process of two photon absorption, meanwhile that all other ones of the plurality of photochromic chemicals within this radiated portion, as well as all photochromic chemicals outside this radiated portion, remain substantially unchanged, and at other, second, times and upon radiation with two radiation beams each of a selected energy that jointly sums to the second energy, all of the plurality of photochromic chemicals contained within the radiated portion that are pre-existing in the second stable state become excited by process of two photon absorption and then substantially immediately relax from this excited state by fluorescence, meanwhile that all photochromic chemicals outside this radiated portion remain substantially both unchanged and unexcited to fluorescence by either the two radiation beams or by any fluorescence of other portion;

wherein each of the plurality of photochromic chemicals is selectively individually changed in state by process of two-photon absorption responsively to two radiation beams each of a selected energy jointly totalling an individually associated first energy;

wherein the plurality of photochromic chemicals are collectively caused to fluoresce by process of two-photon absorption responsively to two radiation beams each of a selected energy jointly totalling the second energy which is greater than any first energy.

\* \* \* \* \*

UNITED STATES PATENT AND TRADEMARK OFFICE
CERTIFICATE OF CORRECTION

PATENT NO.     : 6,483,735 B1
DATED          : November 19, 2002
INVENTOR(S)    : Peter M. Rentzepis It is certified that error appears in the above-identified patent and that said Letters Patent is hereby corrected as shown below:

Column 1,
Line 39, RIGHTS IN THE U.S. GOVERNMENT, replace:
"The present invention was developed under contract No. DOD F30602-90-C-0014 between the United States Air Force (USAF), acting through its Rome Air Development Center (RADC), through Call/Recall Corporation, and through The Regents of the University of California. The U.S. Government has a paid-up license in this invention and the right in limited circumstances to require the patent owner to license others on reasonable terms as provided for by the terms of the above-stated contract awarded by USAF, RADC."
with
-- The present invention was developed under grant No. F30602-97-C-0014 between the United States Air Force (USAF) acting through its Office of Special Research (AFOSR) and The Regents of the University of California. The U.S. Government has a paid-up license in this invention and the right in limited circumstances to require the patent owner to license others on reasonable terms as provided for by the terms of the above-stated contract awarded by AFOSR. --.

Signed and Sealed this

Eleventh Day of March, 2003

JAMES E. ROGAN
*Director of the United States Patent and Trademark Office*